United States Patent
Nakano et al.

(10) Patent No.: US 6,806,438 B2
(45) Date of Patent: Oct. 19, 2004

(54) PLASMA PROCESSING APPARATUS INCLUDING A PLURALITY OF PLASMA PROCESSING UNITS HAVING REDUCED VARIATION

(75) Inventors: Akihiro Nakano, Miyagi-ken (JP); Tadahiro Ohmi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 372 days.

(21) Appl. No.: 09/992,399

(22) Filed: Nov. 6, 2001

(65) Prior Publication Data

US 2002/0088400 A1 Jul. 11, 2002

(30) Foreign Application Priority Data

Nov. 8, 2000 (JP) .................................... 2000-341076

(51) Int. Cl.[7] .............................................. B23K 9/00
(52) U.S. Cl. ............................................ 219/121.54
(58) Field of Search .................. 219/121.54; 118/723; 156/345.28; 356/316

(56) References Cited

U.S. PATENT DOCUMENTS

| | | | |
|---|---|---|---|
| 5,383,019 A | * | 1/1995 | Farrell et al. ............... 356/316 |
| 5,474,648 A | | 12/1995 | Patrick et al. |
| 5,688,357 A | * | 11/1997 | Hanawa .................. 156/345.28 |
| 6,065,425 A | * | 5/2000 | Takaki et al. ............ 118/723 E |
| 6,740,842 B2 | * | 5/2004 | Johnson et al. ........ 219/121.54 |

* cited by examiner

Primary Examiner—John F. Niebling
Assistant Examiner—Andre'C. Stevenson
(74) Attorney, Agent, or Firm—Brinks Hofer Gilson & Lione

(57) ABSTRACT

A plasma processing apparatus comprising a plurality of plasma processing units is provided. Each of the plasma processing units has a matching circuit connected between a radiofrequency generator and a plasma excitation electrode. Among these plasma processing units, a variation $<RA>$ between the maximum and minimum values of input-terminal-side AC resistances RA of the matching circuits defined by $<RA>=(RA_{max}-RA_{min})/(RA_{max}+RA_{min})$ is adjusted to be less than 0.5. A variation between the maximum and minimum values of output-terminal-side AC resistances RB of the matching circuits defined by $<RB>=(RB_{max}-RB_{min})/(RB_{max}+RB_{min})$ is also adjusted to be less than 0.5. The plasma processing units can be adjusted to achieve substantially uniform plasma results in a shorter period of time.

18 Claims, 32 Drawing Sheets

DETAILED MAINTENANCE PAGE

K10

| $f_o$ ... | $f_e$ ... | Z ... | RA ... | RB ... | $C_e$ ... | $C_x$ ... |
|---|---|---|---|---|---|---|

ELECTRICAL PERFORMANCE

UNIT 1  ×××× ← K13

| $f_o$ | $f_e$ | Z | RA | RB | $C_e$ | $C_x$ |
|---|---|---|---|---|---|---|
| MHz | MHz | Ω | Ω | Ω | pF | pF |
| 45.3 | 40.68 | 8 | 0.53 | 3.1 | 37 | 1800 |
| --- | --- | --- | --- | --- | --- | --- |

UNIT 2  ×××× ← K13

| $f_o$ | $f_e$ | Z | RA | RB | $C_e$ | $C_x$ |
|---|---|---|---|---|---|---|
| MHz | MHz | Ω | Ω | Ω | pF | pF |
| 45.3 | 40.68 | 8 | 0.53 | 3.1 | 37 | 1800 |
| --- | --- | --- | --- | --- | --- | --- |

VARIATIONS  ×××× ← K13

| $f_o$ | $f_e$ | Z | RA | RB | $C_e$ | $C_x$ |
|---|---|---|---|---|---|---|
| 0.04 | 0.05 | 0.4 | 0.02 | 0.3 | 0.09 | 0.02 |
| --- | --- | --- | --- | --- | --- | --- |

MAINTENANCE HISTORY ← K17

| DATE | | | | | | | |
|---|---|---|---|---|---|---|---|
| 10/6 | | | | | | | |

PLASMA PROCESSING APPARATUS INCLUDING A PLURALITY OF PLASMA PROCESSING UNITS HAVING REDUCED VARIATION

BACKGROUND OF THE INVENTION

1. Field of the Invention

The present invention relates to a plasma processing apparatus, a plasma processing system, a performance validation system, and an inspection method therefor. The present invention can be suitably applied to a plasma processing apparatus having a plurality of plasma processing units so as to minimize the variation among the plurality of the plasma processing chambers and to improve the deposition characteristics using a power of higher frequencies.

2. Description of the Related Art

FIG. 33 illustrates a typical conventional dual-frequency excitation plasma processing unit which constitutes a plasma processing apparatus and performs a plasma process such as a chemical vapor deposition (CVD) process, a sputtering process, a dry etching process, or an ashing process.

In the plasma processing unit shown in FIG. 33, a matching circuit 2A is connected between a radiofrequency generator 1 and a plasma excitation electrode 4. The matching circuit 2A matches the impedances of the radiofrequency generator 1 and the excitation electrode 4.

Radiofrequency power generated from the radiofrequency generator 1 is supplied to the plasma excitation electrode 4 through the matching circuit 2A and a feed plate 3. The matching circuit 2A is accommodated in a matching box 2 which is a housing composed of a conductive material. The plasma excitation electrode 4 and the feed plate 3 are covered by a chassis 21 made of a conductor.

An annular projection 4a is provided on the bottom face of the plasma excitation electrode (cathode) 4, and a shower plate 5 having many holes 7 comes into contact with the projection 4a below the plasma excitation electrode 4. The plasma excitation electrode 4 and the shower plate 5 define a space 6. A gas feeding tube 17 comprising a conductor is connected to the space 6 and is provided with an insulator 17a at the middle thereof so as to insulate the plasma excitation electrode 4 and the gas source.

Gas from the gas feeding tube 17 is introduced inside a plasma processing chamber 60 composed of a chamber wall 10, via the holes 7 in the shower plate 5. An insulator 9 is disposed between the chamber wall 10 and the plasma excitation electrode (cathode) 4 to provide insulation therebetween. The exhaust system is omitted from the drawing.

A wafer susceptor (susceptor electrode) 8 which holds a substrate 16 and also functions as another plasma excitation electrode is installed inside the plasma processing chamber 60. A susceptor shield 12 is disposed under the wafer susceptor 8.

The susceptor shield 12 comprises a shield supporting plate 12A for supporting the susceptor electrode 8 and a supporting cylinder 12B extending downward from the center of the shield supporting plate 12A. The supporting cylinder 12B extends through a chamber bottom 10A, and the lower portion of the supporting cylinder 12B and the chamber bottom 10A are hermetically sealed with bellows 11.

The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also serve to maintain high vacuum in the plasma processing chamber 60. The susceptor electrode 8 and the susceptor shield 12 can be moved vertically by the bellows 11 so as to control the distance between plasma excitation electrodes 4 and the susceptor electrode 8.

The susceptor electrode 8 is connected to a second radiofrequency generator 15 via the shaft 13 and a matching circuit accommodated in a matching box 14. The chamber wall 10 and the susceptor shield 12 have the same DC potential.

FIG. 34 illustrates another conventional plasma processing unit. Unlike the plasma processing unit shown in FIG. 33, the plasma processing unit shown in FIG. 34 is of a single-frequency excitation type. In other words, radiofrequency power is supplied only to the cathode electrode 4 and the susceptor electrode 8 is grounded. Moreover, the matching box 14 and the radiofrequency generator 15 shown in FIG. 33 are not provided. The susceptor electrode 8 and the chamber wall 10 have the same DC potential.

In these plasma processing units, power with a frequency of approximately 13.56 MHz is generally supplied in order to generate a plasma between the electrodes 4 and 8. A plasma process such as a plasma-enhanced CVD process, a sputtering process, a dry etching process, or an ashing process is then performed using the plasma.

The operation validation and performance evaluation of the above-described plasma processing units have been conducted by actually performing the process such as deposition and then evaluating the deposition characteristics thereof according to following Procedures:

Procedure (1) Deposition Rate and Planar Uniformity

Step 1: Depositing a desired layer on a 6-inch substrate by a plasma-enhanced CVD process.

Step 2: Patterning a resist layer.

Step 3: Dry-etching the layer.

Step 4: Removing the resist layer by ashing.

Step 5: Measuring the surface roughness using a contact displacement meter to determine the layer thickness.

Step 6: Calculating the deposition rate from the deposition time and the layer thickness.

Step 7: Measuring the planar uniformity at 16 points on the substrate surface.

Procedure (2) BHF Etching Rate

A resist mask is patterned as in Steps 1 and 2 in (1) above.

Step 3: Immersing the substrate in a buffered hydrofluoric acid (BHF) solution for one minute to etch the layer.

Step 4: Rinsing the substrate with deionized water, drying the substrate, and separating the resist mask using a mixture of sulfuric acid and hydrogen peroxide ($H_2SO_4+H_2O_2$).

Step 5: Measuring the surface roughness as in Step 5 in Procedure (1) to determine the layer thickness after the etching.

Step 6: Calculating the etching rate from the immersion time and the reduced layer thickness.

Procedure (3) Isolation Voltage

Step 1: Depositing a conductive layer on a glass substrate by a sputtering method and patterning the conductive layer to form a lower electrode.

Step 2: Depositing an insulating layer by a plasma-enhanced CVD method.

Step 3: Forming an upper electrode as in Step 1.

Step 4: Forming a contact hole for the lower electrode.

Step 5: Measuring the current-voltage characteristics (I–V characteristics) of the upper and lower electrodes by using probes while applying a voltage up to approximately 200 V.

Step 6: Defining the isolation voltage as the voltage V at 100 pA corresponding 1 $\mu A/cm^2$ in a 100 $\mu m$ square electrode.

The plasma processing apparatus has been required to achieve a higher plasma processing rate (the deposition rate or the processing speed), increased productivity, and improved planar uniformity of the plasma processing (uniformity in the distribution of the layer thickness in a planar direction and uniformity in the distribution of the process variation in the planar direction). As the size of substrates has been increasing in recent years, the requirement of planar uniformity has become tighter. Moreover, as the size of the substrate is increased, the power required is also increased to the order of kilowatts, thus increasing the power consumption. Accordingly, as the capacity of the power supply increases, both the cost for developing the power supply and the power consumption during the operation of the apparatus are increased. In this respect, it is desirable to reduce the operation costs.

Furthermore, an increase in power consumption leads to an increase in emission of carbon dioxide which places a burden on the environment. Since the power consumption is increased by the combination of increase in the size of substrates and a low power consumption efficiency, reduction of the carbon dioxide emission is desired.

The density of the plasma generated can be improved by increasing the plasma excitation frequency. For example, a frequency in the VHF band of 30 MHz or more can be used instead of the conventional 13.56 MHz. Thus, one possible way to improve the deposition rate of a deposition apparatus such as a plasma-enhanced CVD apparatus is to employ a higher plasma excitation frequency.

In a plasma processing apparatus having a plurality of the above-described plasma processing units, variation in plasma processing among the plasma processing units and their matching circuits is required to be reduced, so that the plasma processing rate (deposition rate when applied to a deposition process), productivity, and uniformity in the plasma process in the planar direction of a workpiece (planar distribution in the layer thickness) can be made substantially the same among the workpieces plasma-treated in different plasma processing units.

The plasma processing apparatus is also required to yield substantially the same process results by applying the same process recipe specifying external parameters for respective plasma processing units such as gas flow, gas pressure, power supply, and process time.

It is desired to both reduce the time required for adjusting the plasma processing apparatus newly installed or subjected to maintenance to achieve substantially the same process results by applying the same recipe and eliminate the variation among the plurality of plasma processing units, as well as the cost required for such adjustment.

Furthermore, reduction in the variation among the plasma processing units has also been required for a plasma processing system comprising a plurality of such plasma processing apparatuses.

The above-described plasma processing unit is designed to use power with a frequency of approximately 13.56 MHz and is not suited for power of higher frequencies. Specifically, radiofrequency characteristics such as impedance and resonant frequency characteristics of the plasma processing unit as a whole, and more specifically, the radiofrequency characteristics of the plasma processing chamber and the matching circuit have been neglected; consequently, no improvement in the electrical consumption efficiency has been achieved when power of a frequency higher than approximately 13.56 MHz is employed, resulting in decrease in the deposition rate rather than improvement. Moreover, although the density of a generated plasma increases as the frequency increases, the density starts to decrease once its peak value is reached, eventually reaching a level at which glow-discharge is no longer possible, thus rendering further increases in frequency undesirable.

In a plasma processing apparatus and a plasma processing system comprising a plurality of plasma processing apparatuses, the radiofrequency characteristics of the plasma processing units including the matching circuits are defined by their mechanical dimensions such as shape. However, the components constituting the plasma processing unit inevitably have differences in size, etc., due to the mechanical tolerance during manufacture. When these components are assembled to make a plasma processing unit, the tolerance due to the assembly is added to the tolerance in the mechanical dimensions. Furthermore, some portions of the plasma processing chamber may not be measurable after assembly of the components; consequently, whether the plasma chamber as a whole has designed radiofrequency characteristics may not be quantitatively validated. Thus, means for examining the variation in the radiofrequency characteristics of the plasma processing chambers has not been available.

Thus, conventional plasma processing apparatuses suffer from the following disadvantages.

Conventional plasma processing apparatuses and systems are not designed to eliminate the differences in electrical radiofrequency characteristics such as impedance and resonant frequency characteristics among the plasma processing units constituting the plasma processing apparatus or system. Thus, the effective power consumed in the plasma generating spaces of the plasma processing units and the density of the generated plasma vary between different plasma processing units.

As a consequence, uniformity in plasma process results may not be achieved when the same process recipe is applied to these plasma processing units.

In order to obtain uniform plasma process results, external parameters such as gas flow, gas pressure, power supply, process time, and the like must be compared with the process results according to Procedures (1) to (3) described above for each of the plasma processing units so as to determine the correlation between them. However, the amount of data is enormous and it is impossible to completely carry out the comparison.

In order to validate and evaluate the operation of the plasma processing apparatus using Procedures (1) to (3) above, the plasma processing apparatus needs to be operated and deposited substrates need to be examined by an ex-situ inspecting method requiring many steps.

Since such an inspection requires several days to several weeks to yield evaluation results, the characteristics of the plasma-treated substrates processed during that period, supposing that the production line is not stopped, remain unknown during that period. If the performance of the plasma processing apparatus is poor, products not satisfying a required level may be manufactured. In this respect, a method for easily maintaining the operation of the plasma processing apparatus at the required level has been desired.

Moreover, when Procedures (1) to (3) described above are employed to inspect the plasma processing units constituting the plasma processing apparatus or system, the time required for adjusting the plasma processing units so as to eliminate the difference in performance and variation in processing among the plasma processing units to achieve the same process results using the same process recipe may be months. The time required for such adjustment needs to be reduced. Also, the cost of substrates for inspection, the cost of processing the substrates for inspection, the labor cost for workers involved with the adjustment, and so forth are significantly high.

SUMMARY OF THE INVENTION

In view of the above, the present invention aims to achieve the following objects.

1. To achieve uniformity in AC resistances as the radiofrequency characteristics in the matching circuits of a plurality of plasma processing units.

2. To achieve uniformity in the plasma process results among the plurality of plasma processing units by applying the same process recipe.

3. To simplify the evaluation of the plurality of the plasma processing units by making it unnecessary to determine process conditions based on the relationships between an enormous amount of data on the plasma processing units and the evaluation results obtained by Procedures (1) to (3) above.

4. To reduce the time required for adjusting the plasma processing units to achieve substantially the same process results using the same process recipe.

5. To improve the planar uniformity of the plasma processing (the planar distribution of the layer thickness or the planar distribution of the process variation) and to improve the layer characteristics of the deposited layers such as isolation voltage when applied to a plasma-enhanced CVD and a sputtering process.

6. To improve the power efficiency and to reduce the power loss so that the same processing rate and layer characteristics are obtained with less power.

7. To reduce the adjustment cost and the operation cost and to increase the productivity.

8. To provide a plasma processing apparatus and system which can be easily maintained at a suitable operation state.

In order to achieve the above-described goals, an aspect of the present invention provides a plasma processing apparatus comprising a plurality of plasma processing units, each of the plurality of plasma processing units comprising: a plasma processing chamber including an electrode for exciting a plasma; a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point. Among the plurality of plasma processing units, a variation <RA> defined by equation (14A) below is set at a value within a predetermined range:

$$<RA> = (RA_{max} - RA_{min})/(RA_{max} + RA_{min}) \quad (14A)$$

wherein $RA_{max}$ and $RA_{min}$ are the maximum and minimum values, respectively, of AC resistances RA in the matching circuits of the plurality of plasma processing units measured from the input-terminal-side of the matching circuits. Also, a variation <RB> among the plurality of plasma processing units defined by equation (14B) below is set at a value within a predetermined range:

$$<RB> = (RB_{max} - RB_{min})/(RB_{max} + RB_{min}) \quad (14B)$$

wherein $RB_{max}$ and $RB_{min}$ are the maximum and minimum values, respectively, of AC resistances RB in the matching circuits of the plurality of plasma processing units measured from the output-terminal-side of the matching circuits.

Thus, the difference in the radiofrequency characteristics, i.e., the AC resistances, affecting the impedance of the matching circuits of the plasma processing units can be minimized and the plasma processing units can be maintained within a predetermined range indicated by the impedance characteristics. Consequently, uniformity in the effective power consumed in the plasma generating spaces of the plasma processing units can be achieved.

When the same process recipe is applied to the plurality of the plasma processing units, substantially the same plasma process results can be obtained. For example, when applied to a deposition apparatus, the deposited layer will exhibit substantially the same layer characteristics such as layer thickness, isolation voltage, and etching rate.

The AC resistances are the radiofrequency characteristics mainly determined by the mechanical structure of the device and are considered to differ among the matching circuits of the plasma processing units. By setting the AC resistances within a predetermined range, the overall radiofrequency characteristics of the plasma processing units which have not been concerned before are optimized, and stable plasma generation can be achieved. Thus, the plasma processing units constituting the plasma processing apparatus or the system incorporating a plurality of plasma processing apparatus stably operate and generate plasmas.

Moreover, examination of the correlation between the external parameters and the inspection results obtained through a conventional inspection method requiring a step of inspecting the actually treated substrates using an enormous amount of data in order to evaluate the process conditions is no longer necessary. Compared to a conventional inspection method requiring the inspection of deposited substrates, the time required for adjusting the plasma processing units to minimize process variations and to constantly achieve the same process results by using the same process recipe can be significantly reduced. The cost of substrates for inspection, the cost of processing the substrates for inspection, and the labor cost for workers involved with the adjustment can also be reduced.

Preferably, the matching circuit is disconnected from the plasma processing unit at the output terminal and at the input terminal, and the AC resistance RA (input-terminal-side AC resistance RA) is measured at a first measuring point corresponding to the input terminal. In this manner, the resistance in the circuit extending from the first measuring point (input terminal) to the connection point on the ground potential portion can be measured.

Thus, the difference in the radiofrequency characteristics of the matching circuits of the plasma processing units can be further minimized, and effective power consumed in the plasma generating spaces of the plasma processing units can be made substantially the same. Compared to the case excluding the matching circuit from the measured region, improved uniformity in the plasma process results using the same process recipe can be achieved.

Preferably, the plasma processing unit further comprises a radiofrequency supplier disposed between the radiofrequency generator and the input terminal of the matching circuit. Preferably, the matching circuit is disconnected from the plasma processing unit at the output terminal and at an input end of the radiofrequency supplier, and the AC resistance RA is measured at a second measuring point corresponding to the input end of the radiofrequency supplier. The difference in the radiofrequency characteristics of both the matching circuits and the radiofrequency suppliers among the plasma processing units can be further minimized compared to the case where the radiofrequency supplier is excluded from the measured region. The uniformity in the effective power consumed in the plasma generating spaces of the plasma processing units can be further enhanced, and highly uniform plasma process results using the same process recipe can be achieved compared to the case in which the radiofrequency supplier is excluded from the measured region.

Preferably, the matching circuit is disconnected from the plasma processing unit at the input terminal and at the output terminal of the matching circuit, and the AC resistance RB is measured at a third measuring point corresponding to the output terminal. The difference in the radiofrequency characteristics of the matching circuits of the plasma processing units can be minimized, and the uniformity in the effective power consumed in the plasma generating spaces of the plasma processing units can be improved. When the same process recipe is applied to these plasma processing units, uniformity in the plasma process results is improved compared to the case in which the matching circuit is not included in the measured region.

Preferably, the plasma processing unit further comprises a radiofrequency feeder disposed between the output terminal of the matching circuit and the electrode. Preferably, the matching circuit is disconnected from the plasma processing unit at the input terminal of the matching circuit and at an output end of the radiofrequency feeder, and the AC resistance RB is measured at a fourth measuring point corresponding to the output end of the radiofrequency feeder. The radiofrequency characteristics in both the radiofrequency feeders (feed plates) and the matching circuits of the plurality of the plasma processing units can be made uniform among these units, and the uniformity in the effective power consumed in the plasma generating spaces of the plasma processing units can be further improved. When the same process recipe is applied to these units, uniformity in the process results is further improved compared to the case excluding the radiofrequency feeder (feed plate) from the measured region.

Preferably, the variations <RA> and <RB> are less than 0.5 to maintain the uniformity in the plasma process results. When applied to a deposition apparatus, the variation in the layer thickness deposited using the same process recipe among these plasma processing units can be maintained within ±7%.

More preferably, the variations <RA> and <RB> are less than 0.4. The difference in the radiofrequency characteristics, i.e., the impedance, the AC resistance which is the real part of the impedance, the resonant frequency characteristics, the capacitance, etc., of the plasma processing units can be further minimized among these units. Thus, the plasma processing units can be maintained to a predetermined range indicated by the impedance characteristics, and the uniformity in the effective power consumed in the plasma generating spaces of these plasma processing units can be achieved.

As a result, substantially the same plasma process results can be obtained from these plasma processing units when the same process recipe is applied. When applied to a deposition apparatus, the deposited layer will exhibit uniformity in the layer characteristics such as layer thickness, isolation voltage, etching rate, etc. More specifically, when the variations <RA> and <RB> are less than 0.4, the variation in the thickness of the layers deposited in the different plasma processing units under the same process conditions can be kept within the range of ±3%.

Preferably, the AC resistances RA and RB are values measured at a power frequency of the radiofrequency generator. The difference in the radiofrequency characteristics of the plasma processing units during plasma generation can be minimized, and the plasma processing units during plasma generation can be kept within a predetermined range indicated by the impedance. Moreover, the effective power consumed in the plasma generating spaces of these units can be made substantially uniform.

Since resistance R is employed as the indicator, the radiofrequency characteristics at a power frequency can be further directly examined compared to the case in which the impedance Z which is a vector quantity determined by the resistance R and the reactance X is employed.

In this plasma processing apparatus, a radiofrequency characteristic A between the radiofrequency meter and the plasma processing units is set to be the same among these plasma processing units. Thus, the observed values of the AC resistance, impedance, etc., can be deemed equal to the value observed at the measuring point for each of the plasma processing units without correction or conversion.

In order to adjust the radiofrequency characteristics between the radiofrequency meter and each of the plasma processing units to be equal to one another, coaxial cables of the same length connecting the measuring points of the plasma processing units and the radiofrequency meter may be used, for example.

The number of the plasma processing units in a plasma processing apparatus and the number of the plasma processing apparatuses in a plasma processing system can be set as desired.

Moreover, the settings of the radiofrequency characteristics, for example, the AC resistances RA and RB, may differ among the plasma processing units constituting the plasma processing apparatus if the plasma processing units are to perform different plasma processes using different process recipes.

Moreover, the present invention can be applied to a dual frequency excitation plasma-enhanced CVD unit having a first radiofrequency generator, a radiofrequency electrode connected to the first radiofrequency generator, a first matching circuit for matching the impedances of the first radiofrequency generator and the radiofrequency electrode, a radiofrequency-electrode-side matching box for accommodating the first matching circuit, a second radiofrequency generator, a susceptor electrode disposed to oppose the radiofrequency electrode to support a substrate to be treated and connected to the second radiofrequency generator, a second matching circuit for matching impedances of the susceptor electrode and the second radiofrequency generator, and a susceptor-electrode-side matching box for accommodating the second matching circuit. In this unit, the radiofrequency characteristics, such as AC resistances RA and RB, of the second matching circuit can be adjusted in a manner similar to the matching circuit at the plasma excitation electrode side described above.

Preferably, the matching circuit further comprises at least one connection point for connecting the matching circuit to the ground potential portion and the AC resistances RA and RB are measured for each of the connection points by sequentially switching the connection points so that only one of the connection points is connected to the ground potential portion. The variations <RA> and <RB> among the plurality of the plasma processing units are then defined by equations (14A) and (14B) and adjusted to be within the predetermined range for each of the connection points. Thus, the effective power consumed in these plasma processing units can be made substantially uniform.

Herein, since variations <RA> and <RB> are calculated for each of the connection points, the largest <RA> and <RB> are adjusted to be within the predetermined range described above.

Another aspect of the present invention provides a performance validation system for a plasma processing apparatus or system. The performance validation system comprises: a customer terminal; an engineer terminal; and an information provider. The customer terminal requests the information provider via a public line to view performance information indicating the state of operation of the plasma processing apparatus or system described above which a customer purchased from an engineer. The engineer uploads the performance information through the engineer terminal. The information provider provides the performance information uploaded through the engineer terminal to the customer terminal upon the request from the customer terminal. The performance information is provided to a customer considering of purchasing the plasma processing apparatus or system as a basis for making the purchasing decisions. During use of the plasma processing apparatus or system, the performance information is provided to inform the customer of the operation performance and maintenance status.

Preferably, the performance information contains information on the variations <RA> and <RB> in the AC resistances RA and RB to provide a user with a basis for judging the performance of the plasma processing apparatus or system and to provide a customer considering purchasing the apparatus or system with a basis for making purchasing decisions.

The performance information may be output as a catalog or a specification document.

Another aspect of the preset invention provides an inspection method for a plasma processing apparatus or system described above. The inspection method comprises the steps of: inspecting whether a variation <RA> among the matching circuits of the plurality of plasma processing units defined by equation (14A) described above is within a predetermined range; and inspecting whether a variation <RB> among the matching circuits of the plurality of plasma processing units defined by equation (14B) above is within a predetermined range. According to this inspection method, whether the uniformity in the radiofrequency characteristics such as impedance, resonant frequency characteristics, and AC resistance is achieved among the plasma processing units can be inspected. Thus, the plasma processing units can be adjusted to be within a predetermined range indicated by the impedance characteristics, and the effective power consumed in the plasma generating spaces of these plasma processing units and the density of the plasma generated in these plasma processing units can be made substantially uniform.

As a result, substantially uniform plasma process results can be achieved in these plasma processing units when the same process recipe is applied. That is, when a deposition process is performed using these plasma processing units, the deposited layers will exhibit substantially the same layer characteristics such as layer thickness, isolation voltage, and etching rate.

The electrical radiofrequency characteristics of each of the plasma processing units and the matching circuits therein are defined by the shape, that is, by the mechanical dimensions. However, the dimensions of each of the components constituting the plasma processing unit vary due to the mechanical tolerance during the manufacturing process. The plasma processing units made by assembling such components inevitably have variations due to both the mechanical tolerance and the assembly tolerance. No method for determining whether the overall plasma chamber has the designed electrical radiofrequency characteristics has been available since some portions are not measurable after assembly of the components. By employing the inspection method of the present invention, the performance of the plasma processing units can be inspected quantitatively and the variation in the radiofrequency characteristics can be examined without measuring the mechanical dimensions. The inspection method is applicable to a plasma processing unit of which the mechanical dimensions are not measurable.

In this inspection method, the input-terminal-side AC resistance RA of the matching circuit may be measured at a first measuring point corresponding to the input terminal of the matching circuit while disconnecting the matching circuit from the plasma processing unit at the output terminal and at the input terminal. Thus, the difference in the radiofrequency characteristics among the plurality of the plasma processing units including the matching circuits can be minimized, the effective power consumed in the plasma generating spaces of these plasma processing units can be made substantially uniform, and higher uniformity in the plasma process results is achieved compared to the case where the radiofrequency characteristics of the matching circuit are not measured.

Instead of the first measuring point described above, a second measuring point may be used to measure the input-terminal-side AC resistance RA of the matching circuit. The second measuring point corresponds to an input end of a radiofrequency supplier disposed between the radiofrequency generator and the input terminal of the matching circuit. The input-terminal-side AC resistance RA is measured at the second measuring point while disconnecting the matching circuit from the plasma processing unit at the output terminal and at the input end of the radiofrequency supplier. Thus, the radiofrequency characteristics of the plasma processing units including the radiofrequency suppliers can be made substantially uniform among these plasma processing units, the effective power consumed in the plasma generating spaces of the plasma processing units can be made substantially uniform, and the higher uniformity in the plasma process results can be achieved compared to the case where the radiofrequency supplier is not included in the measure region.

In this inspection method, the matching circuit may be disconnected from the plasma processing unit at the input terminal and at the output terminal of the matching circuit, and the AC resistance RB may be measured at a third measuring point corresponding to the output terminal. Thus, the radiofrequency characteristics of the plasma processing units can be made substantially uniform among these plasma processing units, the effective power consumed in the plasma generating spaces of the plasma processing units can be made substantially uniform, and higher uniformity in the plasma process results can be achieved compared to the case where the matching circuit is not included in the measure region.

Instead of the third measuring point described above, a fourth measuring point may be used to measure the output-terminal-side AC resistance RB of the matching circuit. The fourth measuring point corresponds to an output end of a radiofrequency supplier disposed between the output terminal of the matching circuit and the electrode. The output-terminal-side AC resistance RB is measured while disconnecting the matching circuit from the plasma processing unit at the input terminal of the matching circuit and at the output end of the radiofrequency feeder. Thus, the difference in the radiofrequency characteristics among these plasma processing units including the radiofrequency feeders (feed plates) can be minimized, the effective power consumed in the plasma generating spaces of these plasma processing units can be made substantially uniform, and higher uniformity in the plasma process results can be achieved using the same process recipe compared to the case where the radiofrequency feeder is not included in the measured region.

In this inspection method, both the predetermined ranges are preferably less than 0.5. In this manner, the uniformity in the plasma process, i.e., whether the variation among these plasma processing units in the thickness of the layers deposited under the same process conditions is maintained within the range of ±7%, can be inspected.

In this inspection method, the AC resistances RA and RB are values measured at a power frequency of the radiofrequency generator. Thus, inspection of whether the variation in the radiofrequency characteristics of the plasma processing units in the plasma generating state is eliminated can be conducted. The inspection of whether the plasma processing units in the plasma generating state are maintained in a predetermine range indicated by impedance characteristics, for example, can also be conducted. As a result, the effective power consumed in the plasma generating spaces of the plasma processing units can be made substantially uniform among these plasma processing units.

Since resistance R is employed as the indicator of the radiofrequency characteristics, the radiofrequency characteristics at a power frequency can be further directly examined compared to the case in which the impedance Z which is a vector quantity determined by the resistance R and the reactance X is employed.

In this inspection method, a radiofrequency characteristic between the radiofrequency meter and the plasma processing units is set to be the same among these plasma processing units. Thus, the observed values of the AC resistance, impedance, etc., can be deemed equal to the value observed at the measuring point for each of the plasma processing units without correction or conversion. Thus, the inspection can be performed further efficiently.

BRIEF DESCRIPTION OF THE DRAWINGS

FIG. 31 is a plan view showing a structure of a subpage CP4 related to the performance validation system for the plasma processing apparatus;

DESCRIPTION OF THE PREFERRED EMBODIMENTS

First Embodiment

Now, a first embodiment of a plasma processing apparatus and a performance validation system therefor according to the present invention is described with reference to the drawings.

Figure 1:
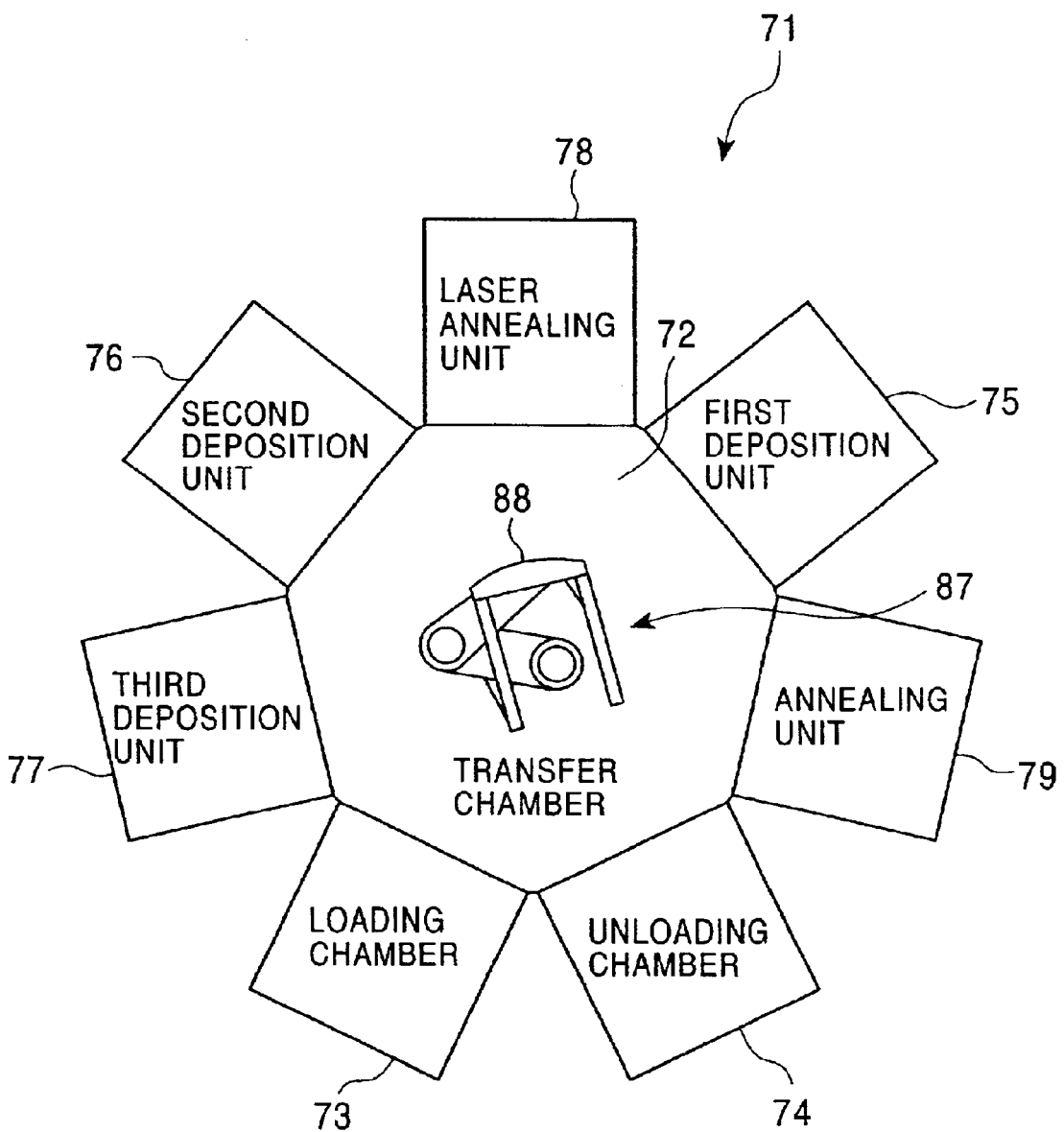
FIG. 1 is a schematic diagram showing an overall structure of a plasma processing apparatus according to a first embodiment of the present invention.

FIG. 1 is an illustration showing the overall structure of a plasma processing apparatus 71 according to the first embodiment. The plasma processing apparatus 71 comprises a plurality of processing units suitable for consecutive processing, for example, from depositing a polysilicon film as a semiconductor active film to depositing a gate insulating film of top-gate TFTs.

In this plasma processing apparatus 71, five processing units, one loading chamber 73, and one unloading chamber 74 are continuously arranged around a substantially heptagonal transfer chamber 72. The five processing units are a first deposition unit 75 for depositing an amorphous silicon film, a second deposition unit 76 for depositing a silicon oxide film, and a third deposition unit 77 for depositing a silicon nitride film, a laser annealing unit 78 for annealing a processed substrate after deposition, and an annealing unit 79 for performing a heat treatment of the processed substrate.

The first, second, and third deposition units 75, 76, and 77 having substantially the same structure may be used either for depositing different types of films or for performing the same treatment using the same process recipe. As is described in detail below, an AC resistance RA measured from the input terminal side of a matching circuit 2A (FIG. 2) of each of the first, second, and third deposition units 75, 76, and 77, is set so that a variation <RA> in AC resistance RA among these units defined by relationship (14A) below wherein $RA_{max}$ is the maximum value and $RA_{min}$ is the minimum value is within a predetermined range.

$$<RA> = (RA_{max} - RA_{min})/(RA_{max} + RA_{min}) \quad (14A)$$

Moreover, an AC resistance RB measured from the output terminal side of the matching circuit 2A of each of the first, second, and third deposition units 75, 76, and 77 is set so that a variation <RB> in AC resistance RB among these units defined by relationship (14B) below wherein $RB_{max}$ is the maximum value and $RB_{min}$ is the minimum value is within a predetermined range.

$$<RB> = (RB_{max} - RB_{min})/(RB_{max} + RB_{min}) \quad (14B)$$

Now, the structure of the plasma processing unit will be described using the first deposition unit 75 as an example.

Figure 2:
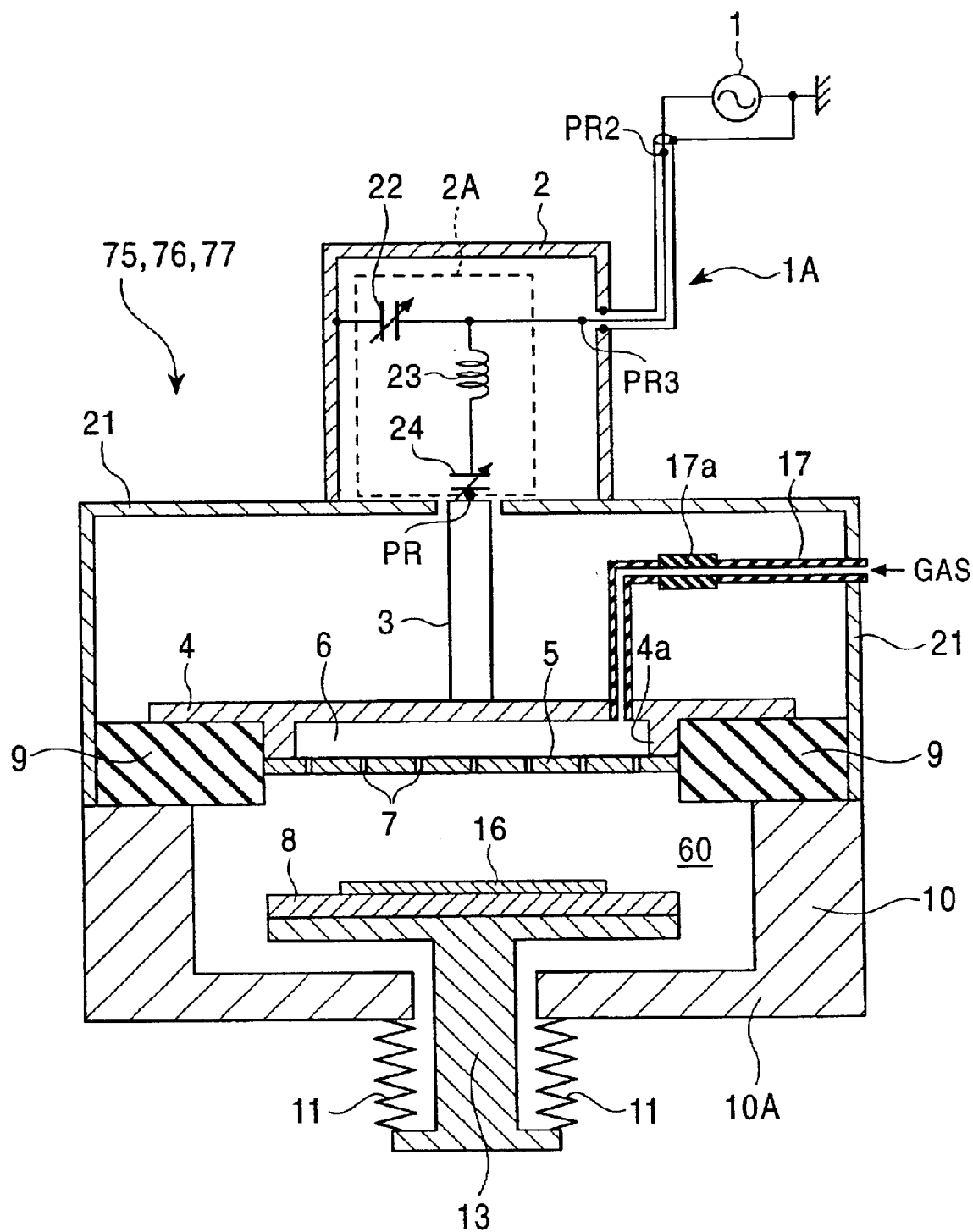
FIG. 2 is a cross-sectional view showing an overall structure of a plasma processing unit shown in FIG. 1.
Figure 3:
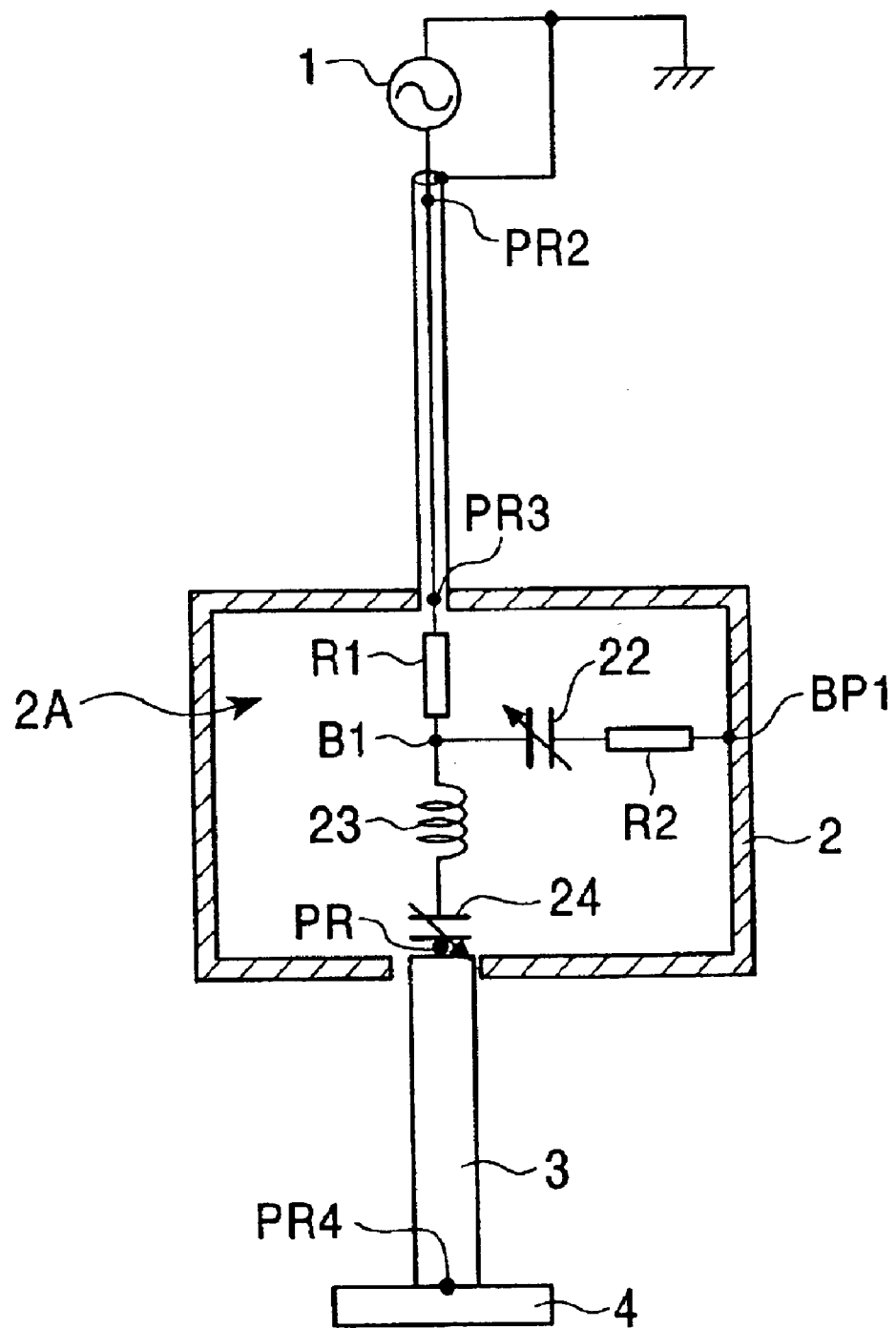
FIG. 3 is a schematic diagram of a matching circuit of the plasma processing unit shown in FIG. 2.

FIG. 2 is a cross-sectional view showing an overall structure of the plasma processing unit. FIG. 3 illustrates a matching circuit of the plasma processing unit shown in FIG. 2.

The plasma processing unit (first deposition unit) 75 is of a single-frequency excitation type and performs a plasma process such as a CVD process, a sputtering process, a dry etching process, and an ashing process. Referring to FIG. 2, the first deposition unit 75 comprises a plasma processing chamber 60 having parallel plate electrodes 4 and 8 for exciting a plasma, a radiofrequency generator 1 connected to the electrode 4, and the matching circuit 2A for matching the impedances of the plasma processing chamber and the radiofrequency generator 1.

To describe in greater detail, in the first deposition unit 75, the plasma excitation electrode 4 coupled to the radiofrequency generator 1 and a shower plate 5 are provided above the plasma processing chamber 60, and the susceptor electrode 8 for receiving a substrate 16 is disposed in the lower portion of the plasma processing chamber 60 so as to oppose the shower plate 5, as shown in FIGS. 2 and 3. The plasma excitation electrode 4 is connected to the radiofrequency generator 1 through a feed plate 3 and the matching circuit 2A. The plasma excitation electrode 4 and the feed plate 3 are covered by a chassis 21, and the matching circuit 2A is accommodated inside a matching box 2.

A silver-plated copper plate 50 to 100 mm in width, 0.5 mm in thickness, and 100 to 300 mm in length is used as the feed plate 3. The feed plate 3 is detachably attached to an output terminal of a tuning capacitor 24 in the matching circuit 2A and to the plasma excitation electrode 4 by fixing means such as screws.

An annular projection 4a is provided on the bottom face of the plasma excitation electrode 4. The projection 4a comes into contact with the shower plate 5 having many holes 7 under the plasma excitation electrode 4. The plasma excitation electrode 4 and the second ferromagnetic layer 5 define a space 6 to which a gas feeding tube 17 extending through the side wall of the chassis 21 and through the plasma excitation electrode 4 is connected.

The gas feeding tube 17 is composed of a conductor, and an insulator 17a is provided midway inside the chassis 21 to insulate between the plasma excitation electrode 4 and the gas source.

The gas introduced from the gas feeding tube 17 is fed into the plasma processing chamber 60 surrounded by a chamber wall 10 through the many holes 7 in the shower plate 5. The chamber wall 10 and the plasma excitation electrode 4 are isolated from each other by an insulator 9. Note that in FIG. 2, the exhaust system connected to the plasma processing chamber 60 is omitted from the drawing.

The susceptor electrode 8 for receiving the substrate 16 disposed in the plasma processing chamber 60 is of a disk shape and functions as another plasma excitation electrode.

A shaft 13 is joined to the bottom center of the susceptor electrode 8 and extends through a chamber bottom 10A. The lower end of the shaft 13 and the center portion of the chamber bottom 10A are hermetically connected by a bellows 11. The susceptor electrode 8 and the shaft 13 are vertically movable by the bellows 11 to control the distance between the plasma excitation electrode 4 and the susceptor electrode 8.

Since the susceptor electrode 8 and the shaft 13 are connected to each other as in FIG. 2, the susceptor electrode 8, the shaft 13, the bellows 11, the chamber bottom 10A, and the chamber wall 10 have the same DC potential. Moreover, because the chamber wall 10 and the chassis 21 are connected to each other, the chamber wall 10, the chassis 21, and the matching box 2 have the same DC potential.

The matching circuit 2A in most cases includes a plurality of passive elements in order to adjust impedance in response to the change in the plasma state inside the plasma processing chamber 60.

As shown in FIGS. 2 and 3, the matching circuit 2A is disposed between the radiofrequency generator 1 and the feed plate 3 and comprises as the passive elements an inductance coil 23, a tuning capacitor 24 comprising an air-variable capacitor, and a load capacitor 22 comprising a vacuum-variable capacitor. The matching circuit 2A also includes conductors R1 and R2 made of copper plates for connecting these passive elements.

The conductor R1, the inductance coil 23, and the tuning capacitor 24 are connected in series in that order from the input terminal side of the matching circuit 2A to the output terminal side of the matching circuit 2A. The load capacitor 22 is connected to these elements in parallel from a branching point B1 provided between the conductor R1 and the inductance coil 23. The inductance coil 23 and the tuning capacitor 24 are directly connected to each other without a conductor, and one end of the load capacitor 22 is connected to the matching box 2 (ground potential portion) through the conductor R2 at a connection point BP1.

Herein, the tuning capacitor 24 is the last stage among the passive elements constituting the matching circuit 2A, and the output terminal of the tuning capacitor 24 is the output terminal of the matching circuit 2A. The tuning capacitor 24 is connected to the plasma excitation electrode 4 through the feed plate 3.

The matching box 2 is connected to a shielding line of a feed line (radiofrequency supplier) 1A which is a coaxial cable. Because the shielding line is DC grounded, the susceptor electrode 8, the shaft 13, the bellows 11, the chamber bottom 10A, the chassis 21, and the matching box 2 are all set to the ground voltage. The above-described one end of the load capacitor 22 is thereby also DC grounded.

In the first deposition unit 75, radiofrequency power of 13.56 MHz or more, for example, 13.56 MHz, 27.12 MHz, and 40.68 MHz, may be used to generate a plasma between the plasma excitation electrode 4 and the susceptor electrode 8 to perform a plasma process such as a CVD process, a dry etching process, and an ashing process on the substrate 16 placed on the susceptor electrode 8.

During processing, radiofrequency power from the radiofrequency generator 1 is supplied to the feed line 1A which is a coaxial cable, the matching circuit 2A, the feed plate 3, and the plasma excitation electrode 4. As for the path of the radiofrequency current, the current after going through these elements flows into the plasma processing chamber 60 and to the susceptor electrode 8, the shaft 13, the susceptor shield 12, the bellows 11, the chamber bottom 10A, and the chamber wall 10. Subsequently, the current returns to the ground position of the radiofrequency generator 1 via chassis 21, the matching box 2, and the shielding line of the feed line 1A.

AC resistances RA and RB of the matching circuit 2A as the radiofrequency characteristics of the first deposition unit 75 of this embodiment will now be described.

The AC resistance of the matching circuit 2A measured from the input terminal side of the matching circuit 2A is the AC resistance RA and the AC resistance of the matching circuit 2A measured from the output terminal side of the matching circuit 2A is the AC resistance RB. The frequency for measuring the AC resistance is selected from the range of about 1 to 100 MHz including the power frequency of the radiofrequency generator 1. Preferably, a frequency corresponding to a power frequency $f_e$, i.e., 13.56 MHz, 27.12 MHz, or 40.68 MHz, is used as the frequency for measurement.

Figure 4:
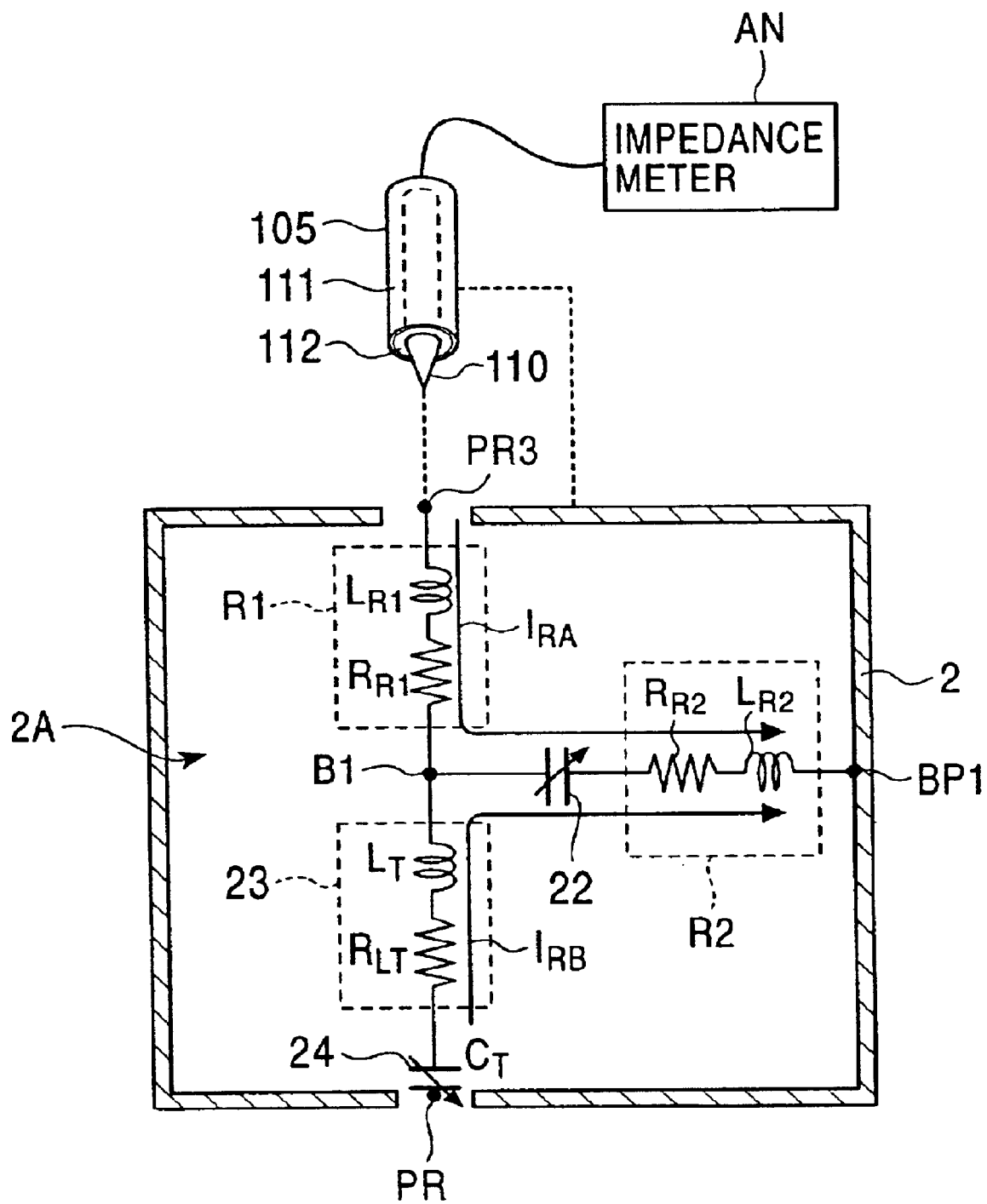
FIG. 4 is a schematic circuit diagram for describing parasitic resistances in the matching circuit shown in FIG. 3.
Figure 5:
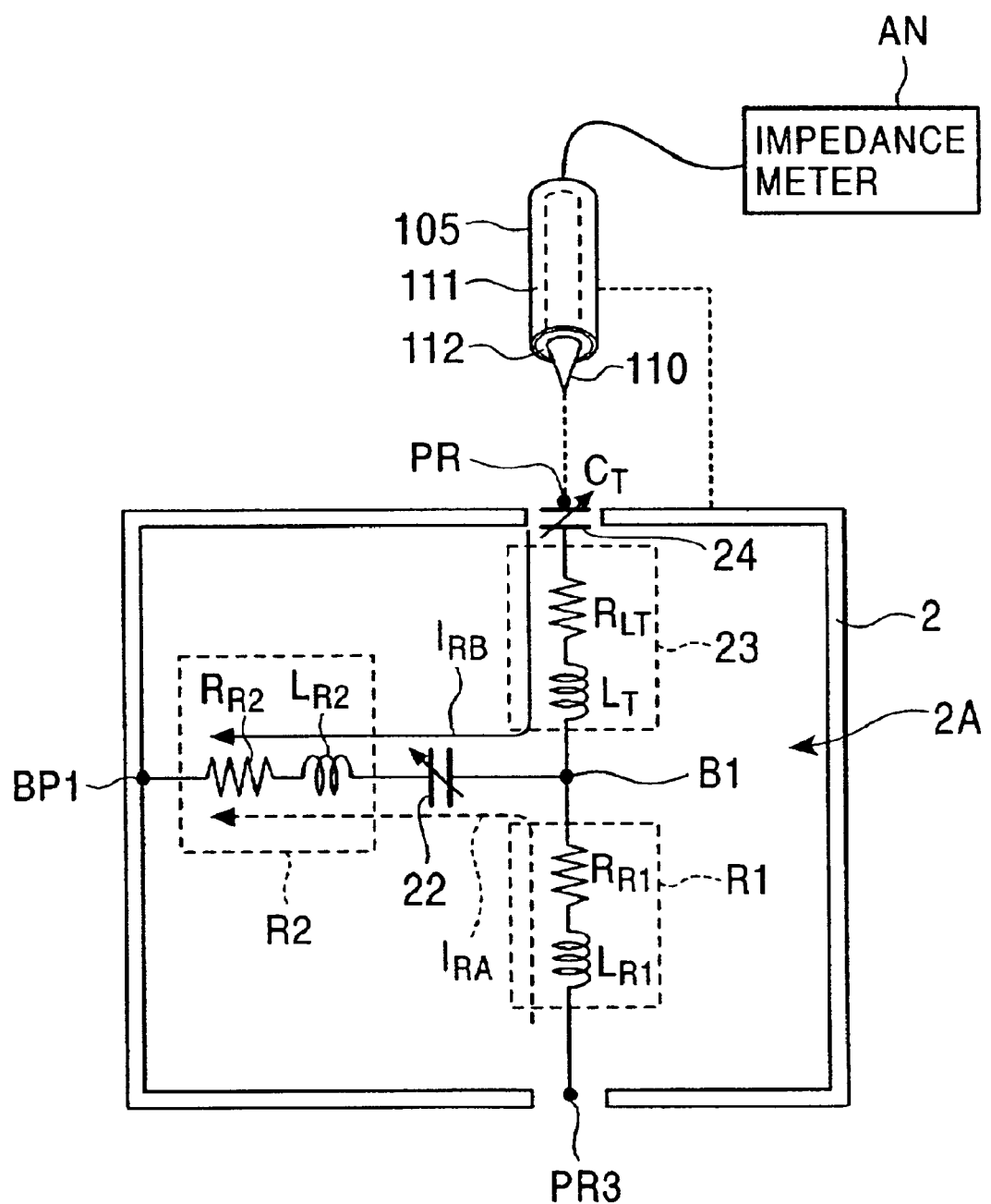
FIG. 5 is a schematic circuit diagram for describing parasitic resistances in the matching circuit shown in FIG. 3.

The AC resistances RA and RB are radiofrequency characteristics mainly determined by the structure of the matching circuit 2A and are measured as in FIGS. 4 and 5.

FIGS. 4 and 5 are schematic circuit diagrams showing parasitic resistance in the matching circuit 2A.

The measured region in the matching circuit 2A according to this embodiment is from a point PR3 corresponding to the position of the input terminal of the passive element located at the first stage of the matching circuit 2A to a point PR which corresponds to the position of the output terminal of the passive element located at the last stage of the matching circuit 2A. As shown in FIG. 4, during the measurement, the feed line 1A is detached from the matching circuit 2A, and the feed plate 3 is detached from the matching circuit 2A at the point PR corresponding to the position of the output terminal of the tuning capacitor 24 by removing screws connecting the matching circuit 2A to the feed plate 3.

As shown by broken lines in FIG. 4, a probe 105 of an impedance meter (radiofrequency characteristics measuring instrument) AN is connected to a ground position on the matching box 2 (ground potential portion) and to the point PR3. The frequency oscillated by the impedance meter AN is then set to a frequency in the range of 1 to 100 MHz, for example, a frequency equal to the power frequency $f_e$ such as about 40.68 MHz, in order to determine the vector quantity (Z, θ) of the impedance in the above-described measured region of the matching circuit 2A. The real part in the complex expression of the impedance is calculated therefrom to define the AC resistance RA.

As shown in FIG. 4, the probe 105 comprises a conductive line 110, an insulation coating 112 coating the conductive line 110, and a peripheral conductor 111 covering the insulation coating 112. The probe 105 is connected to the impedance meter AN via a coaxial cable. The conductive line 110 is connected to the point PR3, and the peripheral conductor 111 is connected to the ground position which is the center of the upper face of the matching box 2.

Each of the inductance coil 23, the tuning capacitor 24, the load capacitor 22, and the conductors R1 and R2 constituting the matching circuit 2A has AC resistance and inductance. The AC resistance is defined by these resistances and inductances, and the parasitic resistance that exists in the circuit when the AC current is introduced.

As shown in FIG. 4, the radiofrequency elements contributing to the input-terminal-side AC resistance RA of the matching circuit 2A lying in the circuit indicated by an arrow $I_{RA}$ extending from the point PR3 to the connection point BP1 via the branching point B1 are as follows:

Parasitic resistance $R_{R1}$ in the conductor R1

Inductance $L_{R1}$ in the conductor R1

Capacitance $C_L$ of the load capacitor 22

Parasitic resistance $R_{R2}$ in the conductor R2

Inductance $L_{R2}$ in the conductor R2

As shown in FIG. 4, the parasitic resistance $R_{R1}$ in the conductor R1 and the parasitic resistance $R_{R2}$ in the conductor R2 are measured as the input-terminal-side AC resistance RA of the matching circuit 2A in this embodiment.

Here, the parasitic resistance $R_{R1}$ includes parasitic resistances existing in the circuit $I_{RA}$ during measurement of the input-terminal-side AC resistance RA but not being illustrated in the drawing, such as a resistance from the branching point B1 to the load capacitor 22.

The output-terminal-side AC resistance RB of the matching circuit 2A is measured in a manner similar to the above description. As shown in FIG. 5, the probe 105 of the impedance meter AN is attached to a ground position of the matching box 2 (ground potential portion) and to the point PR. The frequency oscillated by the impedance meter AN is then set to a frequency in the range of 1 MHz to 100 MHz, for example, in order to determine the vector quantity (Z, θ) of the impedance in the above-described measured region of the matching circuit 2A. The real part in the complex expression of the impedance is calculated therefrom to define the AC resistance RB.

As shown in FIG. 5, the conductive line 110 of the probe 105 is connected to the point PR, and the peripheral conductor 111 of the probe 105 is connected to a ground position of the matching box 2.

As shown in FIG. 5, the radiofrequency elements contributing to the output-terminal-side AC resistance RB of the matching circuit 2A lying on the path indicated by an arrow $I_{RB}$ extending from the point PR to the ground potential portion via the branching point B1 are as follows:

Capacitance $C_T$ of the tuning capacitor 24

Parasitic resistance $R_{LT}$ in the inductance coil 23

Inductance $L_T$ in the inductance coil 23

Capacitance $C_L$ of the load capacitor 22

Parasitic resistance $R_{R2}$ in the conductor R2

Inductance $L_{R2}$ in the conductor R2

Among these elements, as shown in FIG. 5, the parasitic resistance $R_{LT}$ in the inductance coil 23 and the parasitic resistance $R_{R2}$ in the conductor R2 are measured as the output-terminal-side AC resistance RB of the matching circuit 2A.

Note that the parasitic resistance $R_{LT}$ includes parasitic resistances existing in the circuit $I_{RB}$ during measurement of the output-terminal-side AC resistance RB but not being illustrated in the drawing, such as a resistance from the branching point B1 to the load capacitor 22.

In the matching circuit 2A of the first deposition unit 75, the input-terminal-side AC resistance RA and the output-terminal side AC resistance RB are adjusted to fall within a predetermined range suitable for operation of the first deposition unit 75.

Examples of a method for optimizing the AC resistances RA and RB are:

(1) Adjusting the shape, i.e., the length and the width, of the copper plates constituting the conductors R1 and R2.

(2) Adjusting the state of assembly of the copper plates constituting the conductors R1 and R2.

(3) Plating the copper plates constituting the conductors R1 and R2 with silver.

In the plasma processing apparatus 71 of this embodiment, the second deposition unit 76 and the third deposition unit 77 have substantially the same structure as that of the first deposition unit 75. The AC resistances RA and RB as the radiofrequency characteristics of the second deposition unit 76 and the third deposition unit 77 are also set as in the above description.

More specifically, in the first, second, and third deposition units 75, 76, and 77, the AC resistances RA and RB are measured while setting the power frequency $f_e$ at 40.68 MHz.

The AC resistances RA and RB are the radiofrequency characteristics mainly determined by the mechanical structure of the circuit and are different among different plasma processing units.

By setting the AC resistances RA and RB in the matching circuit 2A of the first deposition unit 75, a power loss due to resistance which affects the effective power consumption in the plasma generation space between the plasma excitation electrode 4 and the susceptor electrode 8 can be optimized. Here, an impedance Z (Ω) and an inductance X are given by equations (11A) below:

$$Z=R+jX$$

$$X=f(\omega, L, C) \tag{11A}$$

wherein j which stands for $j^2=-1$ is the imaginary unit and ω which stands for $\omega=2\pi f_e$ wherein $f_e$ is a power frequency is an angular frequency. The impedance X is expressed by a function of ω, L, and C.

$$R=Re(Z) \tag{11B}$$

As shown in equation (11B) above, because the real part of the impedance Z is an AC resistance R, the power loss at the matching circuit 2A located at a position closer to the radiofrequency generator 1 than are the electrodes 4 and 8 can be optimized by adjusting the AC resistance RA and RB in the matching circuit 2A. As a result, the resistance R which significantly affects the voltage drop and yields a decrease in plasma generating energy can be optimized, thereby preventing an increase in effective power loss.

Figure 32:
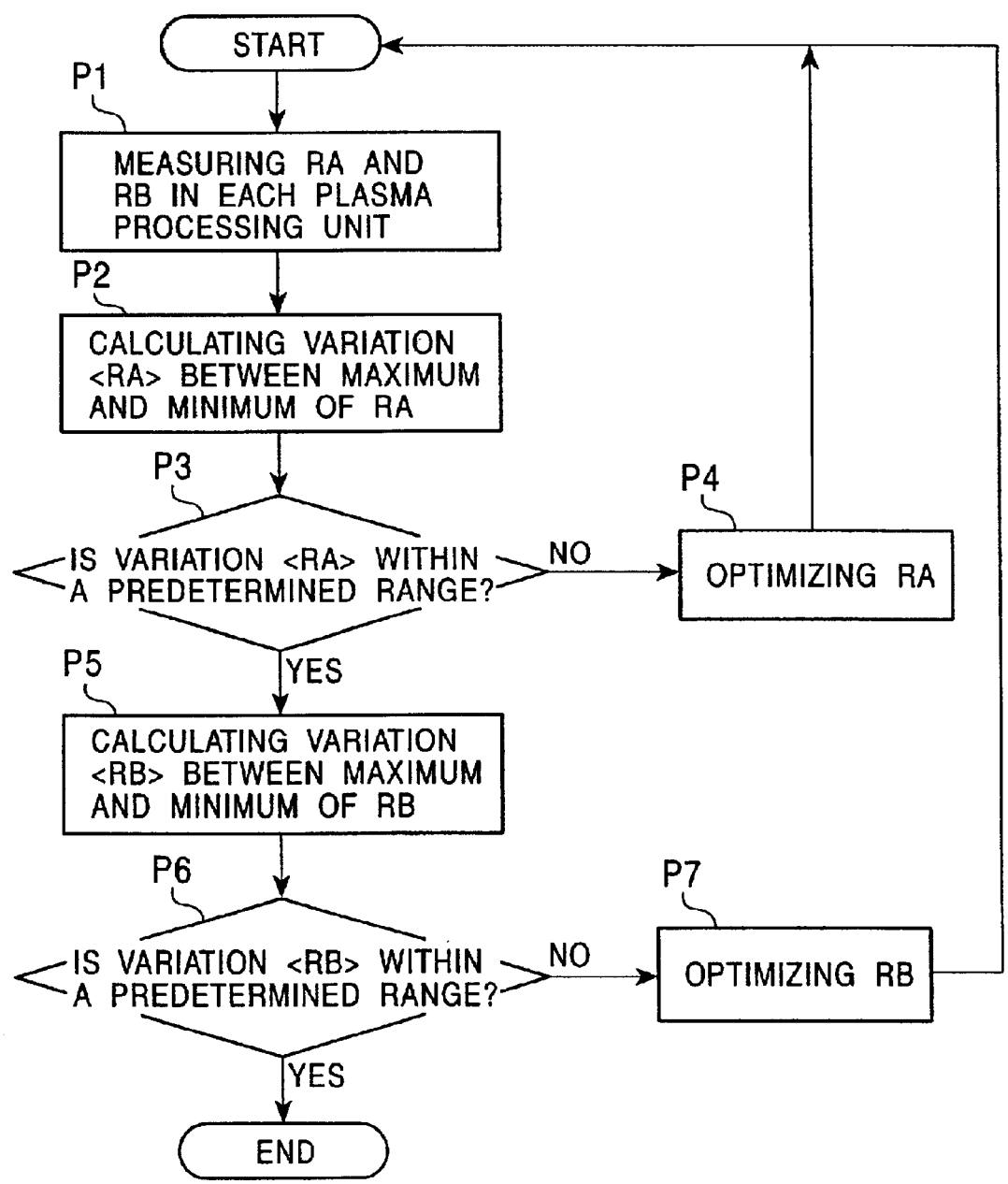
FIG. 32 is a flowchart showing an inspection method for a plasma processing apparatus according to the present invention.
Figure 33:
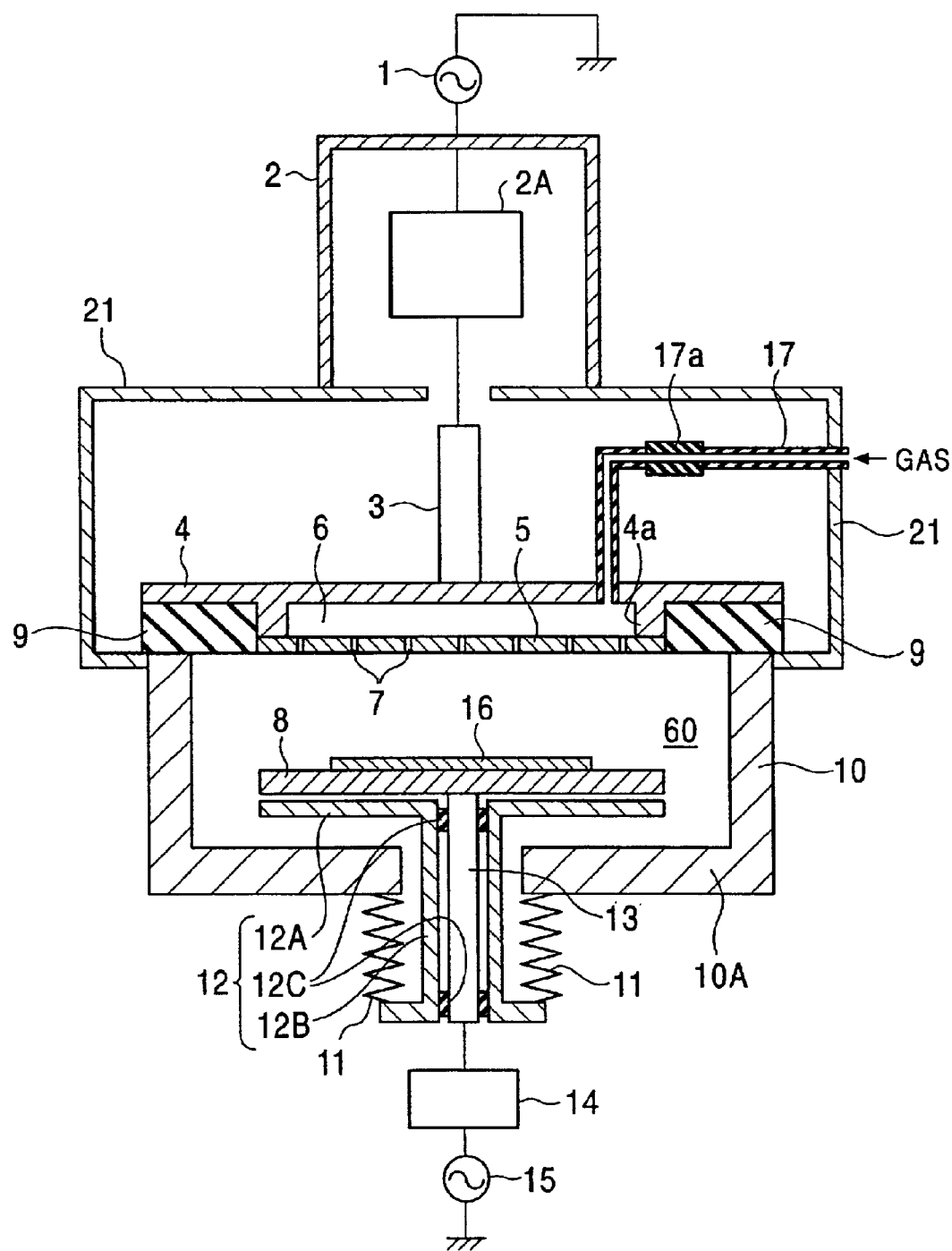
FIG. 33 is a schematic diagram showing a conventional plasma processing unit.
Figure 34:
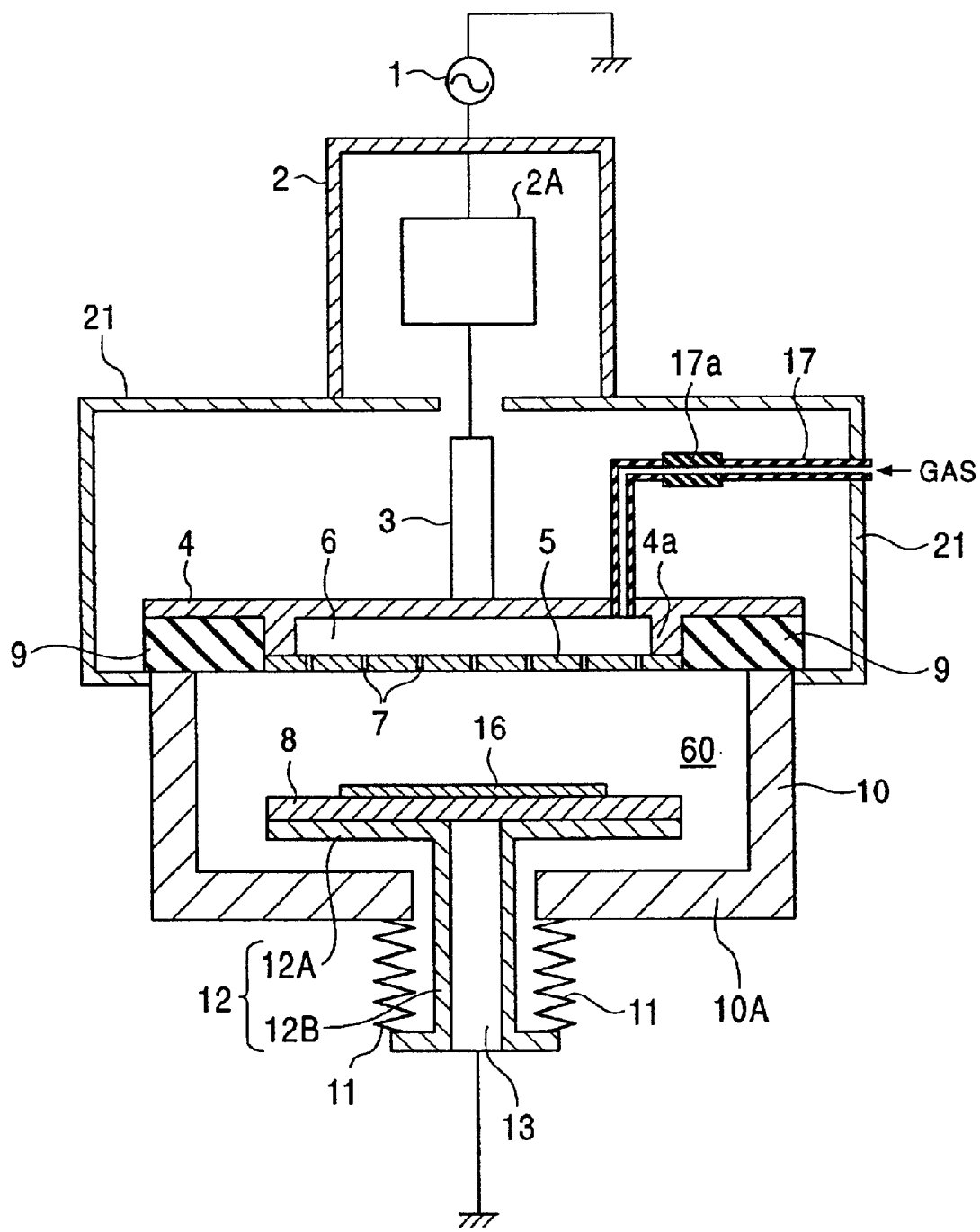
FIG. 34 is a schematic diagram showing another conventional plasma processing unit.

Now, the process for setting the variation in the input-terminal-side AC resistance RA and the output-terminal-side AC resistance RB within a predetermined range will be described with reference to FIG. 32.

First, RA and RB of the matching circuit are measured for each of the plasma processing units (Step P1). Herein, $RA_{75}$, $RA_{76}$, and $RA_{77}$ represent the input-terminal-side AC resistances RA of the first deposition unit 75, the second deposition unit 76, and the third deposition unit 77, respectively, and $RB_{75}$, $RB_{76}$, and $RB_{77}$ represent the output-terminal-side AC resistances RB of the first deposition unit 75, the second deposition unit 76, and the third deposition unit 77, respectively.

Next, a variation <RA> in the input-terminal-side AC resistance RA among a plurality of plasma processing units 75, 76 and 77 is defined by equation (14A) below relative to the maximum value $RA_{max}$ and the minimum value $RA_{min}$ selected from among $RA_{75}$, $RA_{76}$, and $RA_{77}$ (Step P2):

$$<RA>=(RA_{max}-RA_{min})/(RA_{max}+RA_{min}) \tag{14A}$$

The value <RA> defined by equation (14A) is then adjusted to be smaller than 0.5 (Steps P3 and P4). In adjusting the input-terminal-side AC resistance RA, the above-described methods (1) to (3) for optimizing the AC resistance can be applied.

Next, a variation <RB> in the output-terminal-side AC resistance RB among a plurality of plasma processing units 75, 76 and 77 is defined as equation (14B) below relative to the maximum value $RB_{max}$ and the minimum value $RB_{min}$ selected from among $RB_{75}$, $RB_{76}$, and $RB_{77}$ (Step P5):

$$<RB>=(RB_{max}-RB_{min})/(RB_{max}+RB_{min}) \tag{14B}$$

The value <RB> defined by equation (14B) is then adjusted to be smaller than 0.5 (Steps P6 and P7). In adjusting the output-terminal-side AC resistance RB, the above-described methods (1) to (3) for optimizing the AC resistance can be applied.

In these processing units 75, 76, and 77, the substrate 16 is placed on the susceptor electrode 8, and the radiofrequency generator 1 supplies a radiofrequency power to both the plasma excitation electrode 4 and the susceptor electrode 8 while a reactive gas is fed into the plasma processing chamber 60 from the gas feeding tube 17 via the holes 7 to generate a plasma for forming an amorphous silicon layer, a silicon oxide layer, or a silicon nitride layer on the substrate 16.

Figure 6:
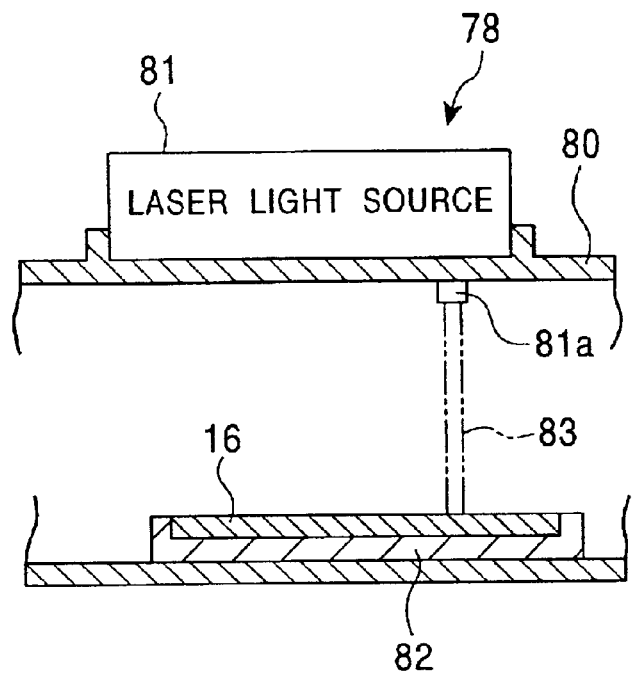
FIG. 6 is a vertical sectional view of a laser annealing unit shown in FIG. 1.

Referring to FIG. 6, the laser annealing unit 78 is provided with a laser light source 81 on the upper wall 80 and a stage 82 for receiving the substrate 16 to be treated on the bottom wall of the chamber. The stage 82 is horizontally movable in the orthogonal X and Y directions. Spot laser light 83 (shown by chain lines) is emitted from an aperture 81a of a laser light source 81, while the stage 82 supporting the substrate 16 horizontally moves in the X and Y directions so that the laser light 83 scans the entire surface of the substrate 16. Examples of the laser light sources 81 are gas lasers using halogen gases, such as XeCl, ArF, ArCl, and XeF.

The laser annealing unit 78 may be of any configuration as long as the spot laser beam from the laser light source can scan the entire surface of the substrate to be treated. Also, in this case, gas lasers using halogen gases, such as XeCl, ArF, ArCl, and XeF can be used as laser light sources. Alternatively, other laser light sources such as a YAG laser may be used depending on the type of the layer to be annealed. Laser annealing may be pulsed laser annealing or continuously oscillating laser annealing. The annealing chamber may be of, for example, a multistage electrical furnace type.

Figure 7:
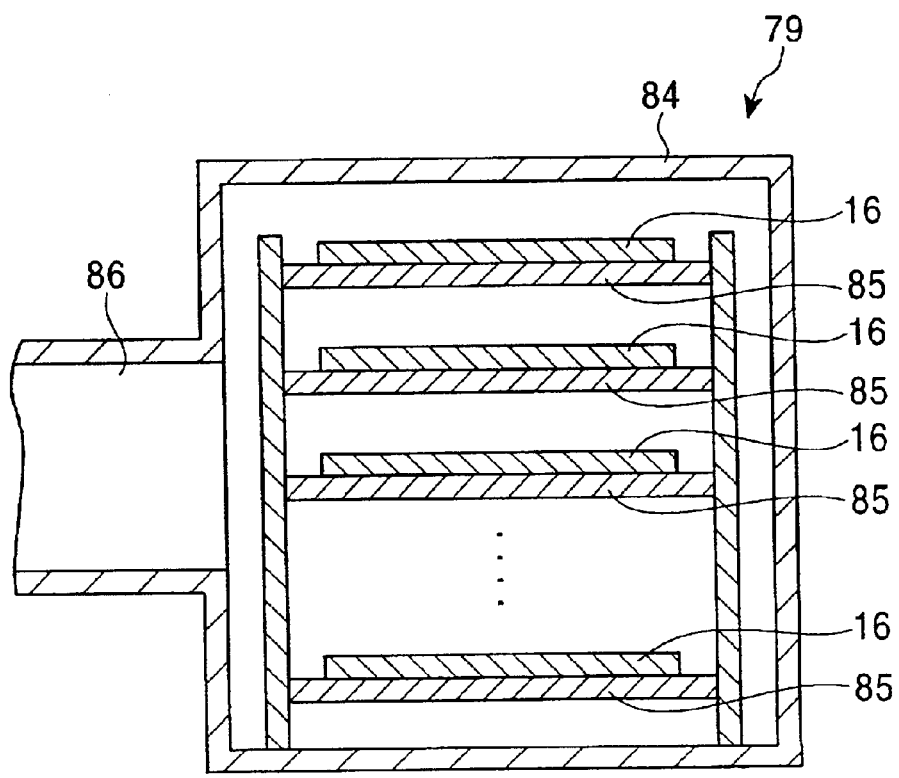
FIG. 7 is a vertical sectional view of an annealing unit shown in FIG. 1.

As shown in FIG. 7, the annealing unit 79 is of a multistage electrical furnace type. In the annealing unit 79, a plurality of substrates 16 is placed on heaters 85 which are vertically arranged in the chamber. These heaters 85 are energized to heat the substrates 16. A gate valve 86 is provided between the annealing unit 79 and the transfer chamber 72.

With reference to FIG. 1, the loading chamber 73 and the unloading chamber 74 are provided with a loading cassette and an unloading cassette, respectively, which are detachable from these chambers. The loading cassette can accommodate a plurality of unprocessed substrates 16 whereas the unloading cassette can accommodate a plurality of processed substrates 16. A transfer robot 87 as means for transferring the substrates 16 is placed in the transfer chamber 72 which is surrounded by the processing units, the loading chamber 73, and the unloading chamber 74. The transfer robot 87 is provided with an arm 88 thereon. The arm 88 has an extendable and retractable link mechanism and can rotate and vertically move. The substrate 16 is supported and transferred with the end of the arm 88.

In this plasma processing apparatus 71, the operations of the components are automatically controlled by a control section, whereas various processing conditions, such as layer deposition conditions, annealing conditions, and heating conditions, and process sequences are set by an operator. In operating the plasma processing apparatus 71, untreated substrates 16 are loaded into the loading cassette, and are transferred from the loading cassette to each processing chamber by the transfer robot 87 based on the starting operation by the operator. After the substrates 16 are automatically and sequentially processed in each chamber, the substrates 16 are placed in the unloading cassette by the transfer robot 87.

In this plasma processing apparatus 71 and the inspection method therefor, a variation defined by equation (10A) between the maximum value and minimum value among the values of the input-terminal-side AC resistances RA measured at the point PR3 of the matching circuit 2A of each of the plasma processing units 75, 76, and 77 and a variation defined by equation (10B) between the maximum value and minimum value among the values of the output-terminal-side AC resistances RB measured at the point PR of the matching circuit 2A of each of the plasma processing units 75, 76, and 77 are set at a value smaller than 0.5. Thus, differences in radiofrequency characteristics among the first, second, and third deposition units 75, 76, and 77 can be minimized, and the state of the first, second, and third deposition units 75, 76, and 77 can be maintained within a predetermined range indicated by the impedance characteristics. As a result, the effective power consumed in the plasma space can be adjusted to be substantially the same among the first, second, and third deposition units 75, 76, and 77.

Moreover, substantially the same plasma process results can be obtained by applying the same process recipe to the first, second, and third deposition units 75, 76, and 77 and the layers formed in these units have substantially the same layer characteristics such as layer thickness, isolation voltage, and etching rate. More particularly, an <RA> and <RB> less than 0.5 among these units will give a variation in the layer thickness in the range of ±7%.

Accordingly, the variation in the planar uniformity of the plasma processing due to the mechanical difference in the plasma processing units can be minimized. When the present embodiment is applied to a deposition process as above, the variation in planar uniformity of the layer thickness distribution due to the mechanical difference among different deposition units can be minimized.

In a deposition process such as a plasma enhanced CVD process or a sputtering process, the variation among the first, second, and third deposition units 75 to 77 in improvements in the conditions of the deposited layers, i.e., the layer characteristics such as the isolation voltage, resistance against etchants, and the density (hardness) of the deposited layers can be minimized.

The density of the deposited layer can be expressed in terms of resistance against a BHF solution as an etchant, for example.

Thus, the overall radiofrequency characteristics of the plasma processing apparatus 71 which has not been considered before can be adjusted, and stable plasma generation can be achieved. The plasma processing units 75 to 77 thereby achieve stable and uniform operation.

Also, examination of the correlation between the external parameters and the inspection results obtained through a conventional inspection method requiring a step of inspecting the actually treated substrates using an enormous amount of data in order to evaluate the process conditions is no longer necessary.

Compared to the conventional inspection method requiring the inspection of deposited substrates, the time required for adjusting the plasma processing units 75 to 77 to minimize process variation and to constantly achieve the same process results by using the same process recipe can be significantly reduced by measuring AC resistances RA and RB in the matching circuit 2A which directly supplies electric power to the plasma processing units 75 to 77. Moreover, the plasma processing apparatus 71 can be directly evaluated in situ within a shorter period of time, instead of by a two-step process of first evaluating the treated substrate and then evaluating the operation of the plasma processing apparatus. When the conventional inspection method requiring layer deposition on substrates is performed to determine the process recipe upon the installation of the plasma processing apparatus of this embodiment, such an inspection may be performed in only one of the plasma processing units since the plasma processing units 75 to 77 have the same radiofrequency characteristics. In the maintenance of the plasma processing apparatus, actual layer deposition is not required because the radiofrequency characteristics of the plasma processing units are controlled within the predetermined range. Thus, the plasma processing units, which have been inspected independently according to the conventional art, can be inspected simultaneously Thus, the inspection method of this embodiment does not require the production line to be stopped for days or weeks to validate and evaluate the operation of the plasma processing apparatus, and the productivity of the manufacturing line can be increased thereby. Moreover, the cost of substrates for inspection, the cost of processing the substrates for inspection, and the labor cost for workers involved with the adjustment can be reduced.

The overall radiofrequency characteristics of the plasma processing units 75 to 77, which have not been considered before, can be optimized by adjusting the AC resistances RA and RB in the matching circuit 2A, the plasma processing units 75 to 77 thus achieving stable operations. Power with a frequency higher than a frequency conventionally employed, i.e., about 13.56 MHz, can be effectively introduced from the radiofrequency generator 1 to the plasma generating space between the plasma excitation electrode 4 and the susceptor electrode 8. When power with the same frequency conventionally used is supplied, the effective power consumed in the plasma generating space can be increased compared to conventional plasma processing apparatuses.

As a result, the processing rate can be improved by increasing the plasma excitation frequency. When applied to a plasma-enhanced CVD process, the deposition rate can be improved.

Figure 8:
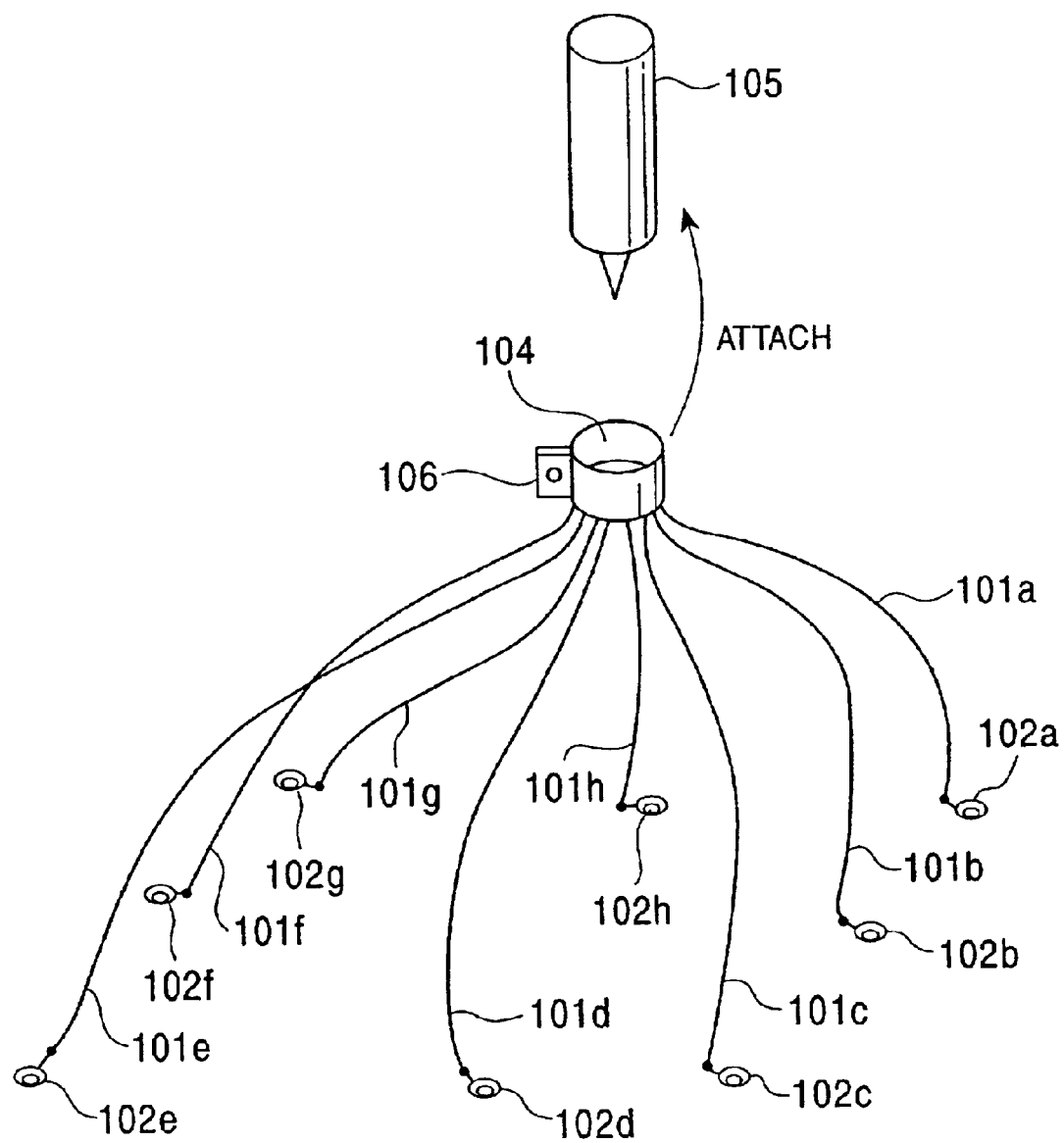
FIG. 8 is a perspective view of a probe of an impedance meter.

The impedance characteristic of the plasma processing units 75 to 77 can also be measured by using a fixture shown in FIG. 8 comprising a plurality of conductive wires 101a to 101h, each having the same impedance, and a probe attachment 104, to which one end of each of the plurality of conductive wires 101a to 101h is attached.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of the probe 105. One end of each of the conductive wires 101a to 101h is soldered to the probe attachment 104 to be electrically connected thereto.

Terminals (attachments) 102a to 102h which are attachable to and detachable from an object to be measured are installed at the other ends of the conductive wires 101a to 101h.

Figure 9:
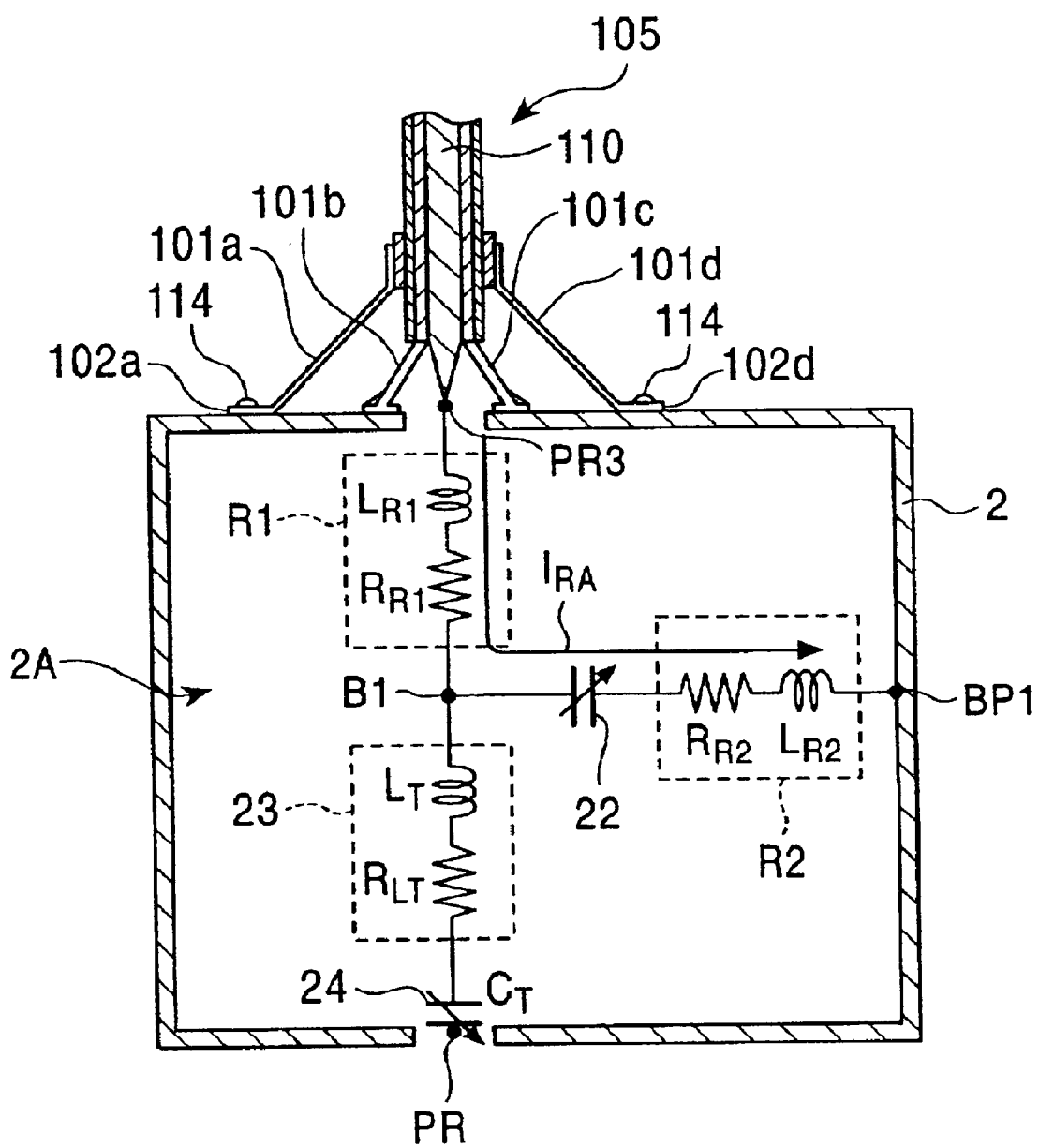
FIG. 9 is a schematic diagram showing the connections of the probe of the impedance meter shown in FIG. 8.

In using this fixture, the probe 105 is inserted into the ring portion of the probe attachment 104, and the probe 105 and the probe attachment 104 are clamped by the clamping portion 106. The conductive wires 101a to 101h are detachably screwed to the measured object in a substantially symmetrical manner about a point through the terminals 102a to 102h, as shown in FIG. 9.

The conductive wires 101a to 101h may be made of, for example, aluminum, copper, silver, or gold, or may be plated by silver or gold having a thickness of 50 µm or more.

The method for measuring impedance using this fixture is now explained with reference to FIG. 9.

First, in measuring the input-terminal-side AC resistance RA, the radiofrequency generator 1 and the feed plate 3 are detached from the matching box 2. The conductive line 110 of the probe 105 of the fixture is then connected to the point PR3. The terminals 102a to 102h connected to the conductive wires 101a to 101h of the fixture are screwed to the matching box 2 in a substantially symmetrical manner about the point PR3 using screws 114. After the fixture is set as above, a measuring signal is supplied to the conductive line 110 to measure the impedance of the paths in the matching circuit 2A of each of the plasma processing units 75 to 77.

In this manner, a uniform current flows to the measuring object regardless of the size of the measuring object or the distance between two points to be measured. Also, by setting a residual impedance which does not affect the measurement of the impedance of the measuring object, the impedance measurement can be performed with precision.

In measuring the output-terminal-side AC resistance RB of the matching circuit 2A, the conductive line 110 of the fixture is connected to the point PR, and the terminals 102a to 102h connected to the conductive wires 101a to 101h of the fixture are screwed to the matching box 2 in a substantially symmetrical manner about the point PR using screws 114, as in the above.

In the plasma processing units 75 to 77 in this embodiment, the input- and output-terminal-side AC resistances RA and RB in the matching circuit 2A for plasma excitation electrode 4 are adjusted while placing the substrate 16 on the susceptor electrode 8. Alternatively, the substrate 16 may be placed on the plasma excitation electrode (cathode) 4 in order to perform reactive ion etching (RIE).

Second Embodiment

A second embodiment of a plasma processing apparatus and an inspection method therefor will now be explained with reference to the drawings.

Figure 10:
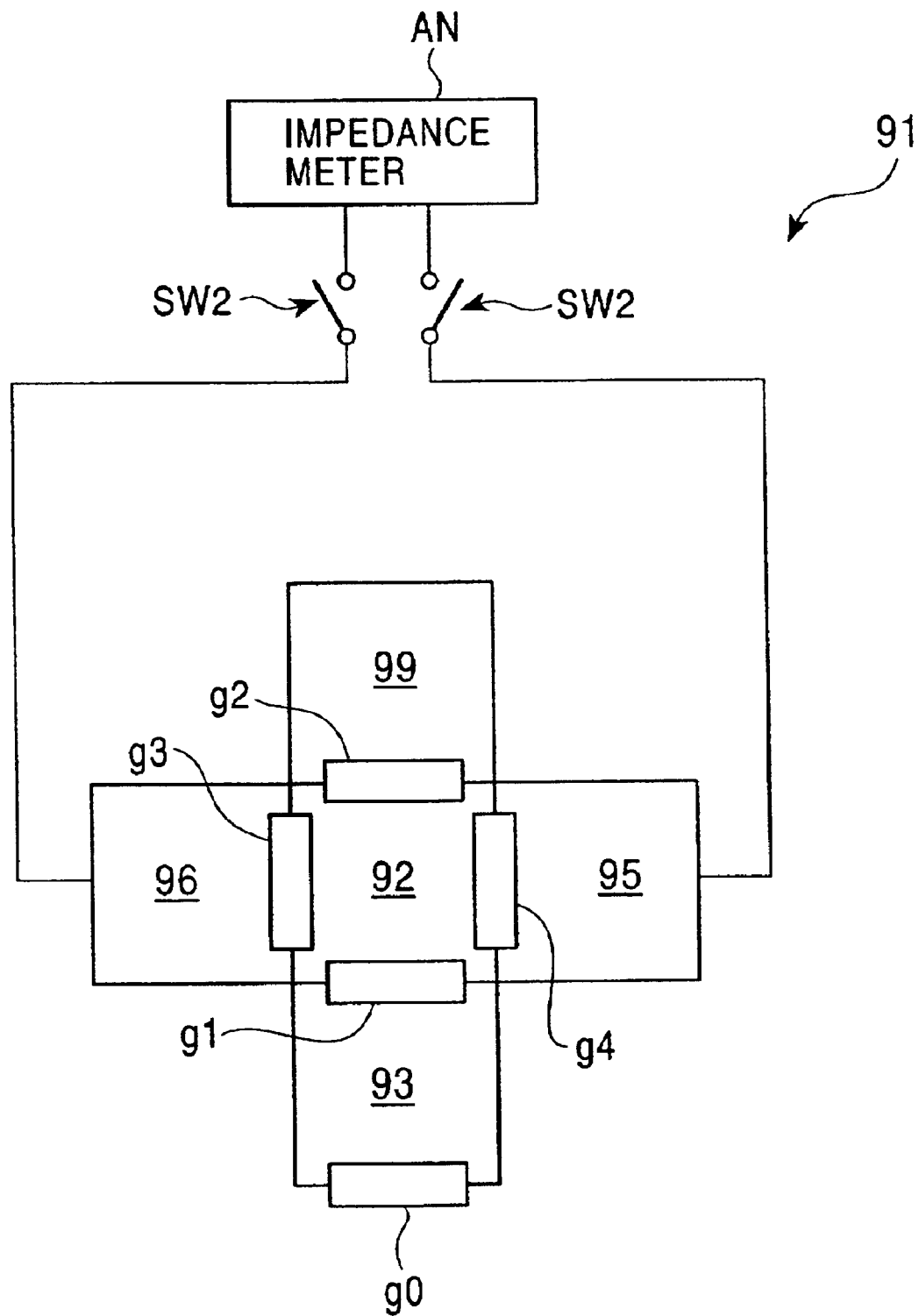
FIG. 10 is a schematic diagram showing an overall structure of a plasma processing apparatus according to a second embodiment of the present invention.

FIG. 10 is a cross-sectional view showing an overall structure of a plasma processing apparatus 91 of the second embodiment. As shown in FIG. 10, the plasma processing apparatus 91 has a load-lock chamber 93, a heating unit 99, and plasma processing units 95 and 96 which are provided around a substantially square transfer chamber (waiting chamber) 92. The transfer chamber 92 contains a transfer robot for transferring substrates and has gates g1, g2, g3, and g4 at the interfaces with the units. The transfer chamber 92, the heating unit 99, and the plasma processing units 95 and 96 are evacuated to a high vacuum by individual high-vacuum pumps. The load-lock chamber 93 is evacuated to a low vacuum by a low-vacuum pump.

The components of the plasma processing apparatus 91 of this embodiment correspond to those of the plasma processing apparatus 71 of the first embodiment shown in FIGS. 1 to 7. That is, the transfer chamber 92 corresponds to the transfer chamber 72, the heating unit 99 corresponds to the annealing unit 79, and the load-lock chamber 93 corresponds to the loading chamber 73 and the unloading chamber 74. The components having the same configurations are not described.

The plasma processing units 95 and 96 correspond to the plasma processing units 75 and 76 in the first embodiment shown in FIGS. 1 to 5. The plasma processing units 95 and 96 have substantially the same structure and may perform either different types of processes to deposit different types of layers or the same processes using the same process recipe.

As shown in FIG. 10, the plasma processing units 95 and 96 are connected to the impedance meter AN via switches SW2, etc., described below. In each of the plasma processing units 95 and 96, an input-terminal-side AC resistance RA of the matching circuit 2A is measured at the input-terminal-side of the matching circuit 2A to calculate a variation <RA> defined by equation (14A) below:

$$<RA>=(RA_{max}-R_{min})/(RA_{max}+RA_{min}) \quad (14A)$$

wherein $RA_{max}$ and $RA_{min}$ are the maximum and minimum values of AC resistance RA between these units.

Also, in each of the plasma processing units 95 and 96, an output-terminal-side AC resistance RB of the matching circuit 2A is measured at the output-terminal-side of the matching circuit 2A to calculate a variation <RB> defined by equation (14B) below:

$$<RB>=(RB_{max}-RB_{min})/(RB_{max}+RB_{min}) \quad (14B)$$

wherein $RB_{max}$ and $RB_{min}$ are the maximum and minimum values of AC resistance RB between the plasma processing units 95 and 96. Each of the variations <RA> and <RB> is set at a value within a predetermined range.

Now, the structure of the plasma processing unit will be described using the plasma processing unit 95 as an example.

Figure 11:
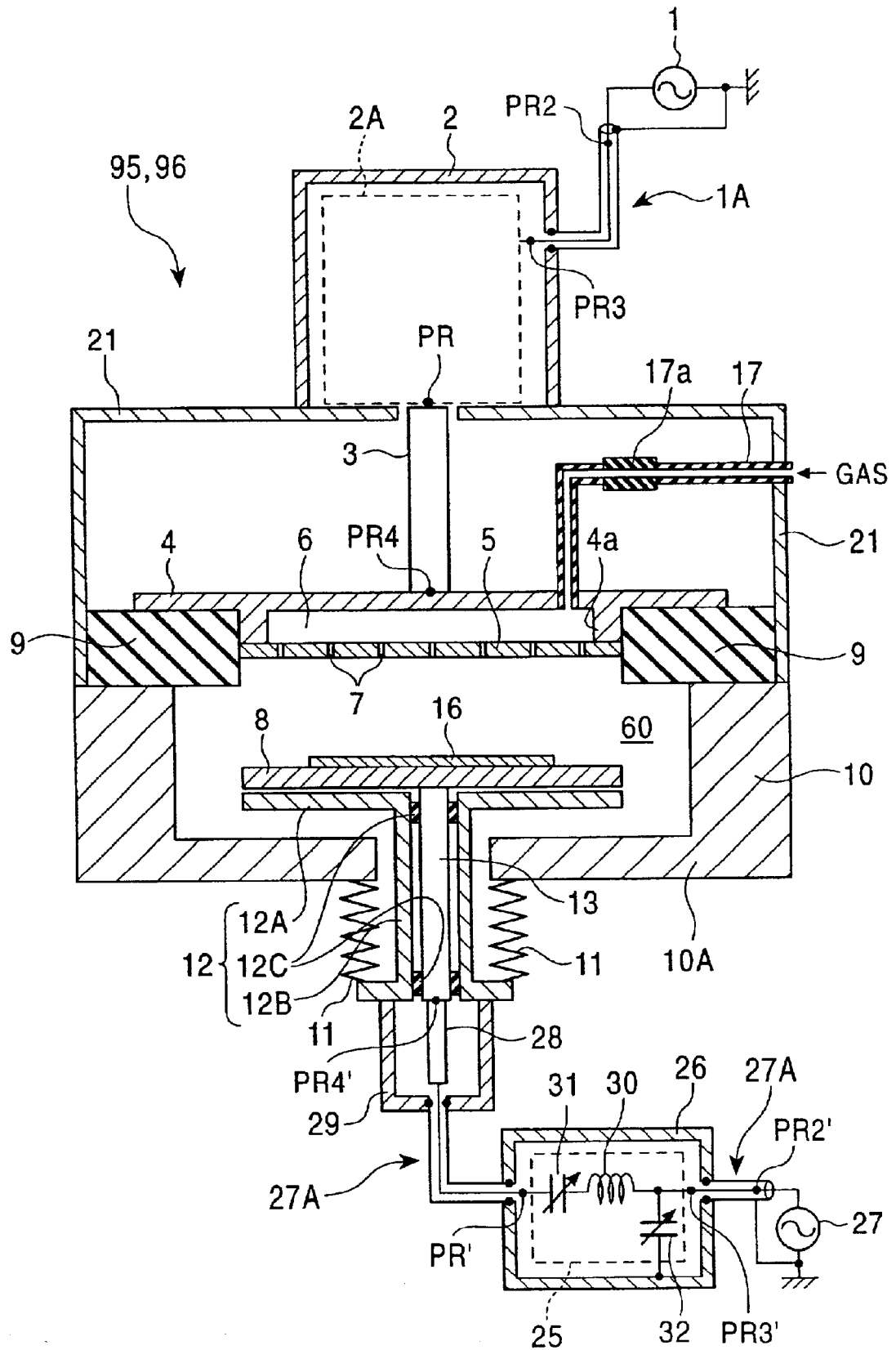
FIG. 11 is a cross sectional view of a plasma processing unit shown in FIG. 10.
Figure 12:
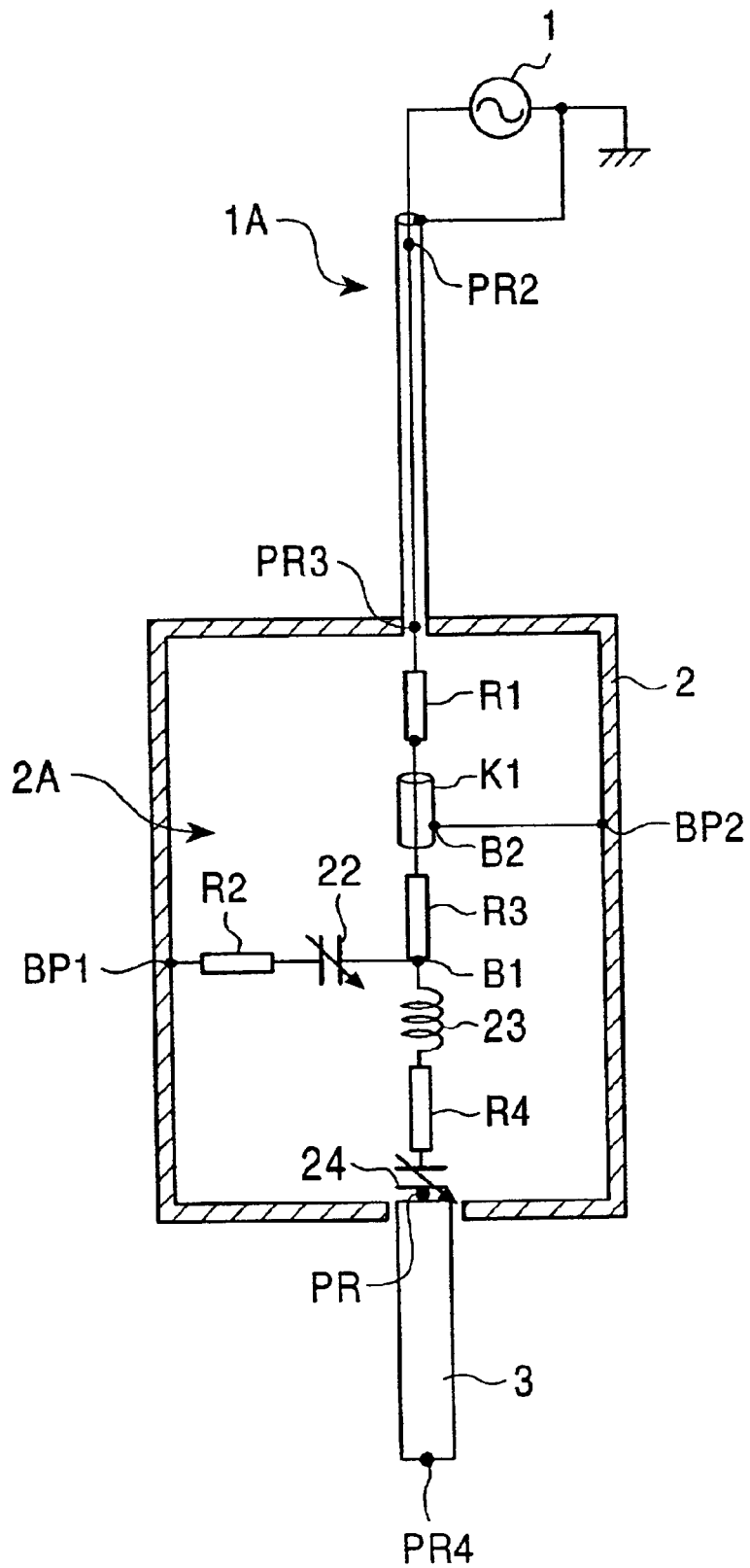
FIG. 12 is a schematic diagram showing a matching circuit of the plasma processing unit shown in FIG. 11.
Figure 13:
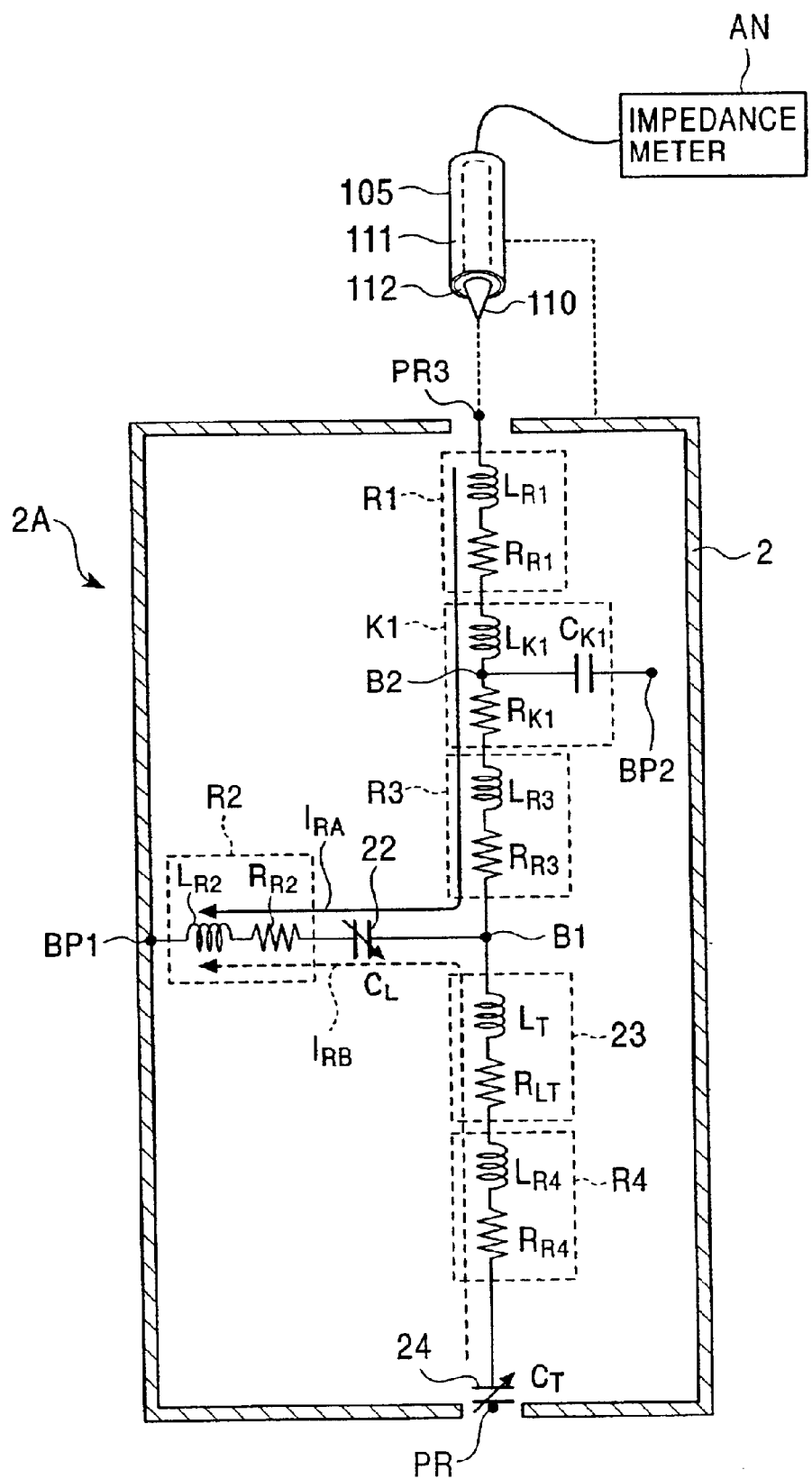
FIG. 13 is a perspective circuit diagram for describing parasitic resistances in the matching circuit shown in FIG. 12.

FIG. 11 is a cross-sectional view showing an overall structure of the plasma processing unit 95 of this embodiment. FIG. 12 is a cross-sectional view showing the matching circuit 2A of FIG. 11, and FIG. 13 is a schematic circuit diagram for describing parasitic resistances in the matching circuit 2A of FIG. 12.

The plasma processing unit 95 is of a dual-frequency-excitation type and differs from the plasma processing unit 75 of the first embodiment shown in FIGS. 2 to 5 in that power is supplied to the susceptor electrode 8 side. The configuration of the passive elements constituting the matching circuit 2A and the settings of the AC resistances RA and RB are also different. Other corresponding components are represented by the same reference numerals and the descriptions thereof are omitted.

In the plasma processing units 95 and 96, a variation <RA> defined by equation (14A):

$$<RA> = (RA_{max} - RA_{min})/(RA_{max} + RA_{min}) \tag{14A}$$

wherein $RA_{max}$ and $RA_{min}$ are the maximum and minimum values, respectively, of AC resistance RA measured from the input-terminal-side of the matching circuit 2A of each of plasma processing units 95 and 96 is set at a value within a predetermined range.

A variation <RB> defined by equation (14B):

$$<RB> = (RB_{max} - RB_{min})/(RB_{max} + RB_{min}) \tag{14B}$$

wherein $RB_{max}$ and $RB_{min}$ are the maximum and minimum values, respectively, of AC resistance RB measured at the output-terminal-side of the matching circuit 2A of each of the plasma processing units 95 and 96, is set at a value within the predetermined range.

As shown in FIGS. 11 and 12, the plasma processing unit 95 has a susceptor shield 12 provided under the susceptor electrode 8. Insulators 12C composed of an electrically insulative material are provided around a shaft 13 and between the susceptor electrode 8 and the susceptor shield 12 to electrically isolate the susceptor electrode 8 from the susceptor shield 12. The insulators 12C also serve to maintain a high vacuum in the plasma processing chamber 60. The susceptor electrode 8 and the susceptor shield 12 can be moved vertically by the bellows 11 to adjust the distance between the plasma excitation electrodes 4 and the susceptor electrode 8. The susceptor electrode 8 is connected to a second radiofrequency generator 27 via a feed plate 28 connected to the bottom end of the shaft 13 and a matching circuit 25 housed in a susceptor-electrode-side matching box 26.

The feed plate 28 is covered by a chassis 29 connected to the bottom end of a cylindrical support 12B of the susceptor shield 12. The chassis 29 is connected to the matching box 26 by a shielding line of a feed line 27A as a coaxial cable and is grounded along with the matching box 26. Thus, the susceptor shield 12, the chassis 29, and the matching box 26 have the same DC potential.

The matching circuit 25 matches the impedances of the second radiofrequency generator 27 and the susceptor electrode 8. Referring to FIGS. 11 and 12, the matching circuit 25 has, as passive elements, a tuning coil 30 and a tuning capacitor 31 which are connected in series between the second radiofrequency generator 27 and the feed plate 28, and a load capacitor 32 connected in parallel with the tuning coil 30 and the tuning capacitor 31. One end of the load capacitor 32 is connected to the matching box 26. In short, the matching circuit 25 has substantially the same structure as that of the matching circuit 2A. The matching box 26 and the end of the load capacitor 32 are set to a ground potential through the shielding line of the feed line 27A. Alternatively, another tuning coil may be connected in series to the tuning coil 30, and another load capacitor may be connected in parallel to the load capacitor 32.

The feed plate 28 is identical to the feed plate 3. The input end of the feed plate 28 is screwed to the matching circuit 25, and the output end is screwed to the shaft 13.

As shown in FIGS. 11 to 13, the matching circuit 2A is provided between the radiofrequency generator 1 and the feed plate 3 and has, as passive elements, an inductance coil 23, a tuning capacitor 24 comprising an air-variable capacitor, and a load capacitor 22 comprising a vacuum-variable capacitor. The matching circuit 2A also includes a coaxial cable K1 and conductors R1 to R4 made of copper plates for connecting these passive elements.

The conductor R1, the coaxial cable K1, the conductor R3, the inductance coil 23, the conductor R4, and the tuning capacitor 24 are connected in series from the input-terminal-side toward the output-terminal side while the load capacitor 22 is connected to these elements in parallel at a branching point B1 located between the conductor R3 and the inductance coil 23. One end of the load capacitor 22 is connected to the matching box 2 (ground potential portion) at a connection point BP1 through the conductor R2. The shielding line of the coaxial cable K1 is connected to the matching box 2 (ground potential portion) via a branching point B2 at a connection point BP2.

Among passive elements constituting the matching circuit 2A, the tuning capacitor 24 is located at the last stage, and the output terminal of the tuning capacitor 24 functions as the output terminal of the matching circuit 2A. The tuning capacitor 24 is connected to the plasma excitation electrode 4 through the feed plate 3.

In the plasma processing unit 95 of this embodiment, the substrate 16 to be treated is placed on the susceptor electrode 8, radiofrequency voltage is applied to the plasma excitation electrode 4 from the first radiofrequency generator 1 and to the susceptor electrode 8 from the second radiofrequency generator 27, while a reactive gas is fed into the plasma processing chamber 60 through the gas feeding tube 17 and the shower holes 7 to generate a plasma, and plasma processing such as deposition or the like is performed on the substrate 16. During the process, radiofrequency power of approximately 13.56 MHz or more, for example, a radiofrequency power of 13.56 MHz, 27.12 MHz, 40.68 MHz, or the like, is supplied from the first radiofrequency generator 1. The second radiofrequency generator 27 may supply either the same radiofrequency power as does the first radiofrequency generator 1 or a radiofrequency power of a different frequency, e.g., 1.6 MHz.

The AC resistances RA and RB in the matching circuit 2A of the plasma processing unit 95 of this embodiment are measured and defined as in the first embodiment. More specifically, the AC resistances RA and RB of this embodiment are measured and defined as shown in FIGS. 11 to 14.

Figure 14:
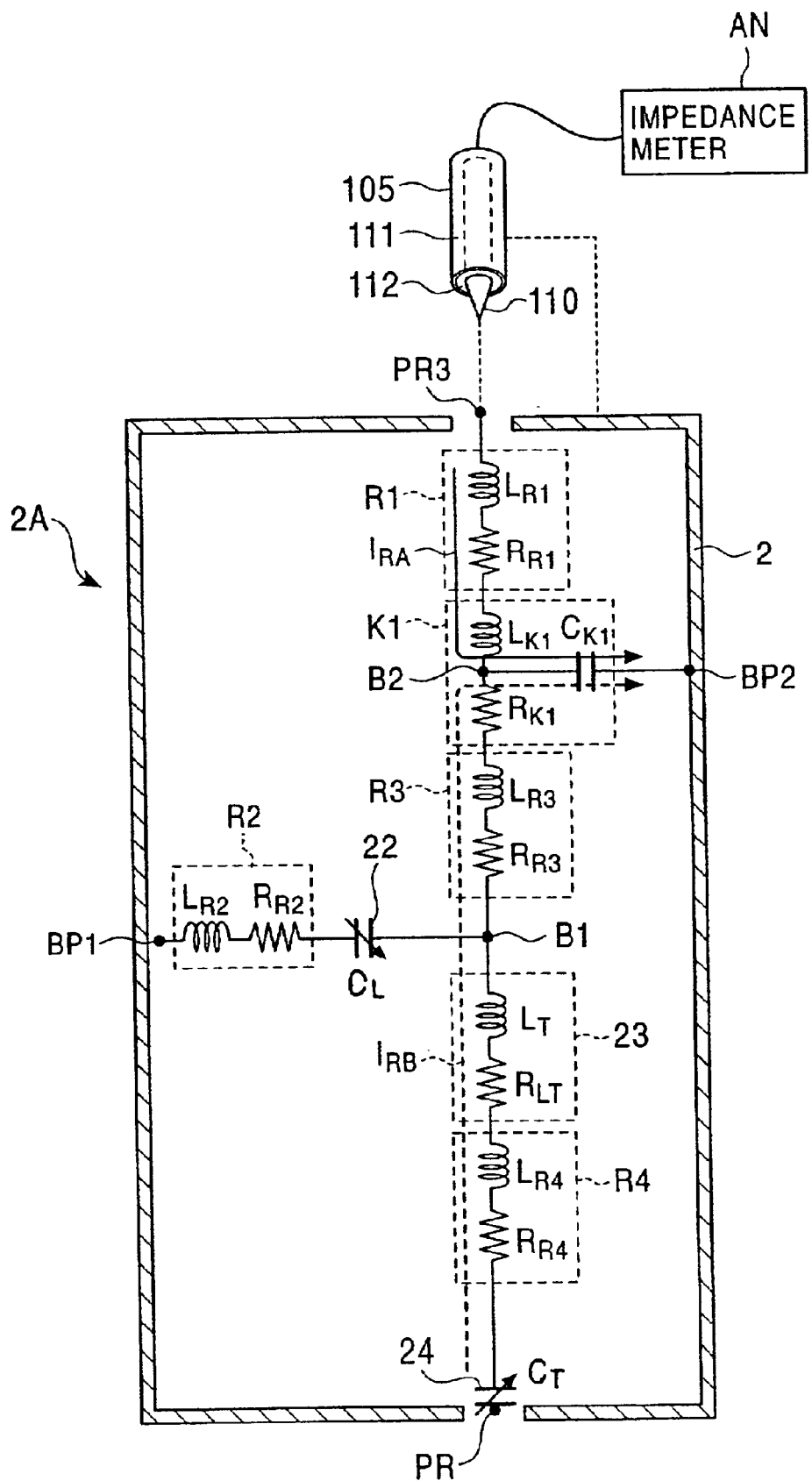
FIG. 14 is a perspective circuit diagram for describing parasitic resistances in the matching circuit shown in FIG. 12.

The measured region of the matching circuit 2A in this embodiment is the same as in the first embodiment. That is, the matching circuit 2A is disconnected from the plasma processing unit at a point PR3 corresponding to the input terminal of the passive element located at the first stage of the matching circuit 2A and at a point PR corresponding to the output terminal of the passive element located at the last stage of the matching circuit 2A when the radiofrequency characteristics of the matching circuit 2A are measured. More particularly, as shown in FIGS. 12 to 14, the feed line 1A connected to the matching circuit 2A is disconnected from the matching circuit 2A while the feed plate 3 is disconnected from the matching circuit 2A at the point PR by removing the screws connecting the output terminal of the matching circuit 2A to the feed plate 3.

As shown in FIG. 13, in measuring the input-terminal-side AC resistance RA in the above measured region, the connection point BP2 is first detached from the matching box 2, and the probe 105 of the impedance meter (radiofrequency measuring instrument) AN is connected to the point PR3 and to a ground position (ground potential portion) of the matching box 2 as shown by broken lines in FIG. 13, as in the first embodiment. The frequency oscillated by the impedance meter AN is set at the same frequency as a power frequency $f_e$, i.e., about 40.68 MHz, to measure the vector quantity (Z, θ) of the impedance in the above measured region of the matching circuit 2A. The real part in the complex expression of the impedance is calculated therefrom and defined as an input-terminal-side AC resistance $RA_{BP1}$.

The radiofrequency elements contributing to the input-terminal-side AC resistance RA of the matching circuit 2A lying in the circuit indicated by an arrow $I_{RA}$ in FIG. 13 from the point PR3 to the connection point BP1 via the branching point B1 are as follows:

Parasitic resistance $R_{R1}$ in the conductor R1
Inductance $L_{R1}$ in the conductor R1
Parasitic resistance $R_{K1}$ in the coaxial cable K1
Inductance $L_{K1}$ in the coaxial cable K1
Parasitic resistance $R_{R3}$ in the conductor R3
Inductance $L_{R3}$ in the conductor R3
Capacitance $C_L$ of the load capacitor 22
Parasitic resistance $R_{R2}$ in the conductor R2
Inductance $L_{R2}$ in the conductor R2

Referring to FIG. 13, among the above-described radiofrequency elements, the parasitic resistance $R_{R1}$ in the conductor R1, the parasitic resistance $R_{K1}$ in the coaxial cable K1, the parasitic resistance $R_{R3}$ in the conductor R3, and the parasitic resistance $R_{R2}$ in the conductor R2 are measured as the input-terminal-side AC resistance $RA_{BP1}$ of the matching circuit 2A.

In measuring the input-terminal-side AC resistance $RA_{BP1}$, the parasitic resistance $R_{R1}$ includes resistance of the coaxial cable K1 up to the branching point B2, the parasitic resistance $R_{R3}$ includes the resistance from the branching point B1 to the load capacitor 22. The parasitic resistances not illustrated in the circuit indicated by the arrow $I_{RA}$ are also included in these resistances.

Next, as shown in FIG. 14, the connection point BP1 is disconnected from the matching box 2 and the connection point BP2 is connected to the matching box 2 to measure an input-terminal-side AC resistance $RA_{BP2}$. As in the above, the probe 105 of the impedance meter is connected to the point PR and to the ground position (ground potential portion) of the matching box 2, and the frequency oscillated by the impedance meter AN is set at the same frequency as a power frequency $f_e$, i.e., about 40.68 MHz, to measure the vector quantity (Z, θ) of the impedance in the above measured region of the matching circuit 2A. The real part in the complex expression of the impedance is calculated therefrom and defined as the input-terminal-side AC resistance $RA_{BP2}$.

The radiofrequency elements contributing to the input-terminal-side AC resistance $RA_{BP2}$ of the matching circuit 2A lying in the circuit indicated by an arrow $I_{RA}$ in FIG. 14 from the point PR3 to the connection point BP2 via the branching point B1 are as follows:

Parasitic resistance $R_{R1}$ in the conductor R1
Inductance $L_{R1}$ in the conductor R1
Parasitic resistance $R_{K1}$ in the coaxial cable K1
Inductance $L_{K1}$ in the coaxial cable K1
Capacitance $C_{K1}$ in the coaxial cable K1
wherein the capacitance $C_{K1}$ is the capacitance generated with the shielding line.

Referring to FIG. 14, among the above radiofrequency elements, the parasitic resistance $R_{R1}$ in the conductor R1 and the parasitic resistance $R_{K1}$ in the coaxial cable K1 are measured as the input-terminal-side AC resistance $RA_{BP2}$ of the matching circuit 2A.

In FIG. 14, the parasitic resistance $R_{K1}$ in the coaxial cable K1 is illustrated in FIG. 14 as if it is positioned at the side closer to the point PR than is the branching point B2. In the actual measurement of the input-terminal-side AC resistance $RA_{BP2}$, however, the parasitic resistance $R_{K1}$ includes resistance of the coaxial cable K1, resistance existing at the connection point BP2 side, and parasitic resistance not illustrated in the circuit shown by the arrow $I_{RA}$.

The output-terminal-side AC resistance RB of the matching circuit 2A is measured in a manner similar to the above description. As shown in FIG. 13, while the connection point BP2 is detached from the matching box 2, the probe 105 of the impedance meter AN is attached to a ground position (ground voltage portion) of the matching box 2 and to the point PR3, as in the first embodiment. The frequency oscillated by the impedance meter AN is then set at the same frequency as the power frequency $f_e$, i.e., about 40.68 MHz, to measure the vector quantity (Z, θ) of the impedance in the matching circuit 2A. The real part of the complex expression of the impedance is calculated therefrom and defined as the output-terminal-side AC resistance $RB_{BP1}$.

The radiofrequency elements contributing to the output-terminal-side AC resistance $RB_{BP1}$ in FIG. 13 of the matching circuit 2A lying on the path indicated by an arrow $I_{RB}$ from the point PR to the connection point BP1 to the matching box 2 which is a ground potential portion, via the branching point B1 are as follows:

Capacitance $C_T$ of the tuning capacitor 24
Parasitic resistance $R_{R4}$ in the conductor R4
Inductance $L_{R4}$ in the conductor R4
Parasitic resistance $R_{LT}$ in the inductance coil 23
Inductance $L_T$ in the inductance coil 23
Capacitance $C_L$ of the load capacitor 22
Parasitic resistance $R_{R2}$ in the conductor R2
Inductance $L_{R2}$ in the conductor R2

Among these radiofrequency elements, the parasitic resistance $R_{R4}$ in the conductor R4, the parasitic resistance $R_{LT}$ in the inductance coil 23, and the parasitic resistance $R_{R2}$ in the conductor R2 are measured as the output-terminal-side AC resistance $RB_{BP1}$ in the matching circuit 2A.

In measuring the output-terminal-side AC resistance $RB_{BP1}$, the parasitic resistance $R_{LT}$ includes parasitic resistances not illustrated in the circuit indicated by the arrow $I_{RB}$ such as the resistance from the branching point B1 to the load capacitor 22.

Next, referring to FIG. 14, in measuring the output-terminal-side AC resistance $RB_{BP2}$, the connection point BP1 is detached from the matching box 2 while the connection point BP2 is connected to the matching box 2. The probe 105 of the impedance meter AN is connected to the point PR and to the matching circuit 2A which is a ground potential portion. The frequency oscillated from the impedance meter AN is then set at a frequency the same as the power frequency $f_e$ which is about 40.68 MHz, for example, to measure the vector quantity $(Z, \theta)$ of the impedance in the above measured region of the matching circuit 2A. The real part in the complex expression of the impedance is calculated therefrom and defined as the output-terminal-side AC resistance $RB_{BP2}$.

The radiofrequency elements contributing to the output-terminal-side AC resistance $RB_{BP2}$ of the matching circuit 2A lying on the path indicated by an arrow $I_{RB}$ in FIG. 14 from the point PR to the connection point BP2 on the matching box 2 which is a ground potential portion, via the branching point B2 are as follows:

Capacitance $C_T$ of the tuning capacitor 24
Parasitic resistance $R_{R4}$ in the conductor R4
Inductance $L_{R4}$ in the conductor R4
Parasitic resistance $R_{LT}$ in the inductance coil 23
Inductance $L_T$ in the inductance coil 23
Parasitic resistance $R_{R3}$ in the conductor R3
Inductance $L_{R3}$ in the conductor R3
Parasitic resistance $R_{K1}$ in the coaxial cable K1
Inductance $L_{K1}$ in the coaxial cable K1
Capacitance $C_{K1}$ in the coaxial cable K1.

Among these radiofrequency elements, the parasitic resistance $R_{R4}$ in the conductor R4, the parasitic resistance $R_{LT}$ in the inductance coil 23, the parasitic resistance $R_{R3}$ in the conductor R3, and the parasitic resistance $R_{K1}$ in the coaxial cable K1 are measured as the output-terminal-side AC resistance $RB_{BP2}$, as shown in FIG. 14.

The input- and output-terminal-side AC resistances RA and RB in the matching circuit 2A of the plasma processing unit 95 are set within a predetermined range suitable for the operation of the plasma processing unit 95. In particular, the input-terminal-side AC resistance $RA_{BP1}$, the input-terminal-side AC resistance $RA_{BP2}$, the output-terminal-side AC resistance $RB_{BP1}$, and the output-terminal-side AC resistance $RB_{BP2}$ are each set at a value within a predetermined range described below.

Examples of a method for optimizing the AC resistances RA and RB are (1) Adjusting the shape, i.e., the length and the width, of the copper plates constituting the conductors R1 to R4.

(2) Adjusting the state of assembly of the copper plates constituting the conductors R1 to R4.

(3) Adjusting the shape, i.e., the length and the width, of the coaxial cable K1.

(4) Plating the copper plates constituting the conductors R1 to R4 with silver.

In the plasma processing apparatus 91 of this embodiment, the plasma processing units 95 and 96 have substantially the same structure. The AC resistances RA and RB, more specifically, the AC resistances $RA_{BP1}$, $RA_{BP2}$, $RB_{BP1}$, and $RB_{BP2}$, of the plasma processing unit 96 are set in the same manner as in the plasma processing unit 95.

The power frequency $f_e$ in the plasma processing units 95 and 96 is set at 40.68 MHz to measure the AC resistances RA and RB.

The AC resistances RA and RB are radiofrequency characteristics mainly determined by the mechanical structure and are considered to vary between different units.

Regarding the input-terminal-side AC resistance RA, a variation $<RA_{BP1}>$ in the input-terminal-side AC resistance $RA_{BP1}$ of the plasma processing units 95 and 96 is defined by equation (14A') below:

$$<RA_{BP1}> = (RA_{BP1\text{-}max} - RA_{BP1\text{-}min})/(RA_{BP1\text{-}max} + RA_{BP1\text{-}min}) \quad (14A')$$

wherein $RA_{BP1\text{-}max}$ and $RA_{BP1\text{-}min}$ are the maximum and minimum values, respectively, between an input-terminal-side AC resistance $RA_{BP1\text{-}95}$ of the plasma processing unit 95 and an input-terminal-side AC resistance $RA_{BP1\text{-}96}$ of the plasma processing unit 96.

Similarly, a variation $<RA_{BP2}>$ in the input-terminal-side AC resistance $RA_{BP2}$ of the plasma processing units 95 and 96 is defined by equation (14A") below:

$$<RA_{BP2}> = (RA_{BP2\text{-}max} - RA_{BP2\text{-}min})/(RA_{BP2\text{-}max} + RA_{BP2\text{-}min}) \quad (14A")$$

wherein $RA_{BP2\text{-}max}$ and $RA_{BP2\text{-}min}$ are the maximum and minimum values, respectively, between an input-terminal-side AC resistance $RA_{BP2\text{-}95}$ of the plasma processing unit 95 and an input-terminal-side AC resistance $RA_{BP2\text{-}96}$ of the plasma processing unit 96.

Then, the variation $<RA_{BP1}>$ in the input-terminal-side AC resistance $RA_{BP1}$ and the variation $<RA_{BP2}>$ in the input-terminal-side AC resistance $RA_{BP2}$ are compared and the larger one of the two is defined as a variation $<RA>$ of the input-terminal-side AC resistance RA. The values of the variations expressed by equations (14A') and (14A") are then each set at a value less than 0.4. In short, both variations $<RA_{BP1}>$ and $<RA_{BP2}>$ corresponding to the connection point BP1 and BP2, respectively, are set at a value within a predetermined range, i.e., less than 0.4.

The variation $<RA>$ of the input-terminal-side AC resistance RA can be adjusted by the methods (1) to (4) described above.

Regarding the output-terminal-side AC resistance RB, a variation $<RB_{BP1}>$ in the output-terminal-side AC resistance $RB_{BP1}$ between the plasma processing units 95 and 96 is defined by equation 14B' below:

$$<RB_{BP1}> = (RB_{BP1\text{-}max} - RB_{BP1\text{-}min})/(RB_{BP1\text{-}max} + RB_{BP1\text{-}min}) \quad (14B')$$

wherein $RB_{BP1\text{-}max}$ and $RB_{BP1\text{-}min}$ are the maximum and minimum values, respectively, between an output-terminal-side AC resistance $RB_{BP1\text{-}95}$ of the plasma processing unit 95 and an output-terminal-side AC resistance $RB_{BP1\text{-}96}$ of the plasma processing unit 96.

Similarly, a variation $<RB_{BP2}>$ in the output-terminal-side AC resistances $RB_{BP2}$ of the plasma processing units 95 and 96 is defined as equation 14B" below:

$$<RB_{BP2}> = (RB_{BP2\text{-}max} - RB_{BP2\text{-}min})/(RB_{BP2\text{-}max} + RB_{BP2\text{-}min}) \quad (14B")$$

wherein $RB_{BP2\text{-}max}$ and $RB_{BP2\text{-}min}$ are the maximum and minimum values between an output-terminal-side AC resistance $RB_{BP2\text{-}95}$ of the plasma processing unit 95 and an output-terminal-side AC resistance $RB_{BP2\text{-}96}$ of the plasma processing unit 96.

Then, the variation $<RB_{BP1}>$ in the output-terminal-side AC resistance $RB_{BP1}$ and the variation $<RB_{BP2}>$ in the output-terminal-side AC resistance $RB_{BP2}$ are compared and the larger one of two is defined as the variation $<RB>$ of the output-terminal-side AC resistance RB. The values of the variations expressed by equations (14B') and (14B") are then set at a value less than 0.4 each. In short, both variations $<RB_{BP1}>$ and $<RB_{BP2}>$ corresponding to the connection point BP1 and BP2, respectively, are set at a value within a predetermined range, i.e., less than 0.4.

The variation $<RB>$ in the output-terminal-side AC resistance RB can be adjusted by the methods (1) to (4) described above.

In the plasma processing apparatus 91, a gate g0 is opened to transfer the substrate 16 into the load-lock chamber 93. The gate g0 is closed to evacuate the load-lock chamber 93 with a low-vacuum pump. The gates g1 and g2 are opened to transfer the substrate 16 from the load-lock chamber 93 to the heating unit 99 by a transfer arm of a transfer robot in the transfer chamber 92. The gates g1 and g2 are closed to evacuate the transfer chamber 92 and the heating unit 99 using a high-vacuum pump. After the substrate 16 is annealed, the gates g2 and g4 are opened to transfer the annealed substrate 16 to the plasma processing unit 95 with the transfer arm of the transfer robot. After the substrate 16 is processed in the plasma processing unit 95, the gates g3 and g4 are opened to transfer the substrate 16 to the plasma processing unit 96 by the transfer arm of the transfer robot in the transfer chamber 92. After the substrate 16 is processed in the plasma processing unit 96, the gates g1 and g3 are opened to transfer the substrate 16 to the load-lock chamber 93 with the transfer arm of the transfer robot in the transfer chamber 92.

Individual sections are automatically operated by a controller section, although the processing conditions such as layer deposition conditions in these processing chambers and the processing sequence are set by an operator. In using this plasma processing apparatus 91, an untreated substrate 16 is placed in a loading cassette in the load-lock chamber 93 and the operator pushes a start switch. The substrate 16 is sequentially transferred from the loading cassette to the processing units by the transfer robot. After a series of processing steps are performed in these processing chambers, the substrate 16 is placed in the unloading (loading) cassette by the transfer robot.

In these plasma processing units 95 and 96, the substrate 16 is placed on the susceptor electrode 8, as in the first embodiment. The radiofrequency generator 1 applies a radiofrequency voltage to the plasma excitation electrode 4, and the second radiofrequency generator 27 applies a radiofrequency voltage to the susceptor electrode 8 while a reactive gas is fed into the plasma processing chamber 60 from the gas feeding tube 17 via the holes 7 in the shower plate 6 to generate a plasma for forming an amorphous silicon layer, a silicon oxide layer, or a silicon nitride layer on the substrate 16.

The plasma processing apparatus 91 and the inspection therefor according to this embodiment achieve the same advantages as in the first embodiment. Moreover, the variations in the input- and output-terminal-side AC resistances RA and RB of the matching circuits 2A of the plasma processing units 95 and 96 are adjusted to be less than 0.4. Thus, the difference in the radiofrequency characteristics between the plasma processing units 95 and 96 can be minimized, the state of the plasma processing units 95 and 96 can be maintained within a predetermined range indicated by the impedance characteristics, and the effective power consumed in the plasma spaces of the plasma processing units 95 and 96 can be made substantially the same.

As a result, substantially the same plasma process results can be achieved by applying the same process recipe to the plasma processing units 95 and 96. That is, when applied to a deposition process, substantially uniform layer characteristics, such as layer thickness, isolation voltage, and etching rate can be achieved. More specifically, the variation in the thickness of the layers deposited using the same process recipe can be maintained within ±3% by setting the variation to a value less than 0.4.

When a plurality of connection points BP1 and BP2 are provided as in this embodiment, an input-terminal-side AC resistance $RA_{BP1}$ and an output-terminal-side AC resistance $RB_{BP1}$ are measured while the connection point BP1 is connected to the matching box 2 and the connection point BP2 is disconnected from the matching box 2. An input-terminal-side AC resistance $RA_{BP2}$ and an output-terminal-side AC resistance $RB_{BP2}$ are measured while switching the connection point, i.e., while the connection point BP1 is disconnected from the matching box 2 and the connection point BP2 is connected to the matching box 2. In short, the state of connection is altered for each of the connection points BP1 and BP2 to define the different measured regions, and the input-terminal-side AC resistance $RA_{BP1}$, input-terminal-side AC resistance $RA_{BP2}$, output-terminal-side AC resistance $RB_{BP1}$, and output-terminal-side AC resistance $RB_{BP2}$ of the plasma processing units 95 and 96 are individually measured for each of these measured regions. The variations <RA> and <RB> in the AC resistance defined by equations (14A'), (14A''), (14B'), and (14B'') are then optimized. Thus, substantially the same effective power is consumed in the plasma spaces of the plasma processing units 95 and 96.

According to the plasma processing apparatus 91 and the inspection method therefor of this embodiment, both the input-terminal-side AC resistances RA and the output-terminal-side AC resistances RB of the matching circuits 2A of the plasma processing units 95 and 96 are adjusted. Thus, the parasitic resistances in the matching circuit 2A having a plurality of branching points B1 and B2 can be adjusted and the difference between the units can be minimized. Accordingly, the impedance characteristics of the plasma processing units 95 and 96 can be efficiently measured.

Although the input- and output-terminal-side AC resistances RA and RB are set in relation to the plasma excitation electrode 4 in this embodiment, the input- and output-terminal-side AC resistances RA and RB may be set in relation to the matching circuit 25 at the susceptor electrode 8 side. In such a case, the output-terminal-side AC resistance RB in the matching circuit 25 is measured at a point PR', and the input-terminal-side AC resistance RA of the matching circuit 25 is measured at a point PR3', as shown in FIGS. 11 and 12.

Moreover, the present embodiment can be applied to an inductive coupled plasma (ICP) excitation type plasma processing apparatus, a radial line slot antenna (RLSA) type plasma processing apparatus, and a reactive ion etching (RIE) type processing apparatus, instead of the parallel plate type plasma processing apparatus.

A target material may be installed instead of the electrodes 4 and 8 to perform a sputtering process as a plasma treatment.

Third Embodiment

A third embodiment of a plasma processing apparatus and an inspection method therefor will be explained below with reference to the drawings.

Figure 15:
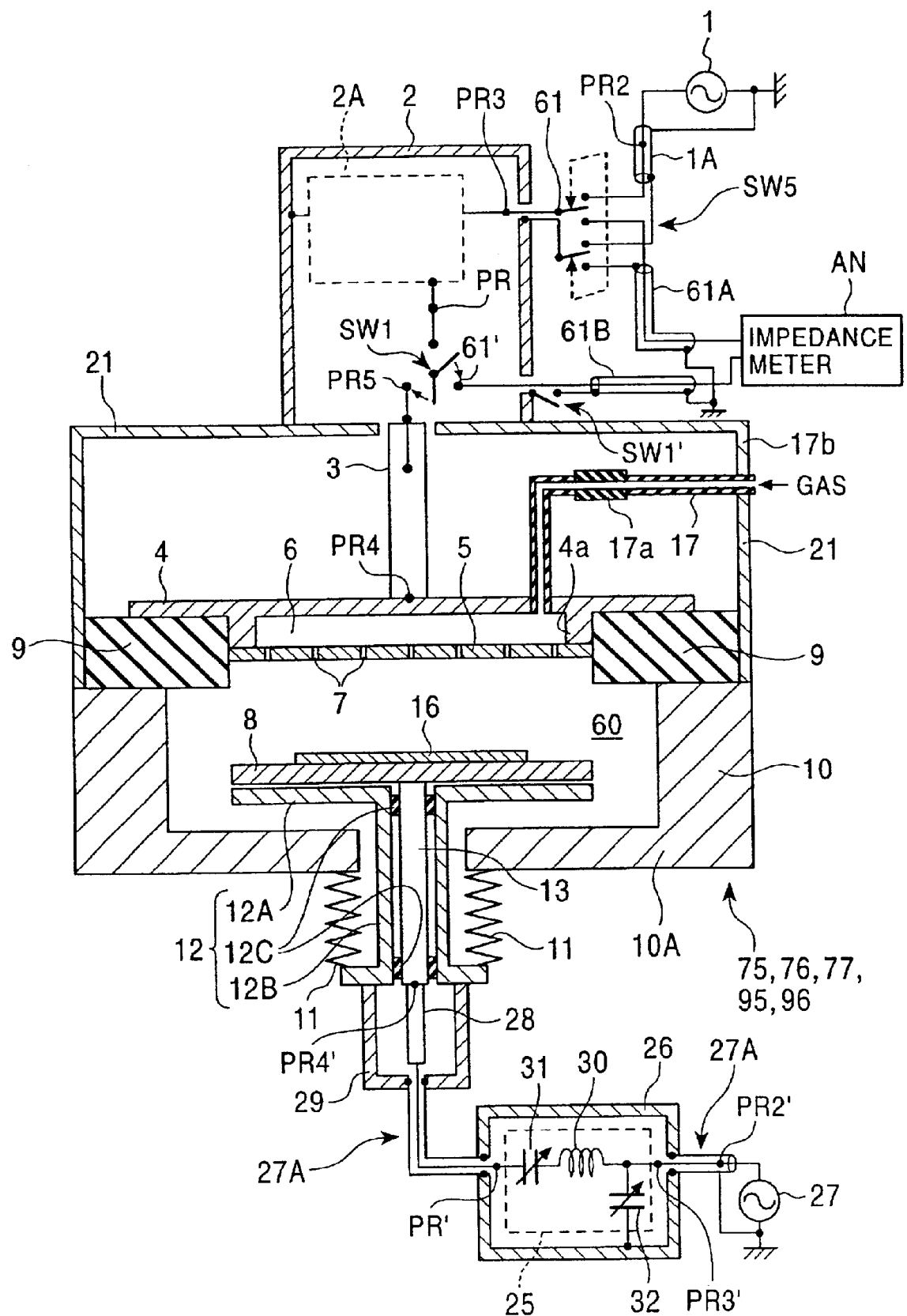
FIG. 15 is a schematic diagram showing an overall structure of a plasma processing unit according to a third embodiment of the present invention.

FIG. 15 is a schematic diagram showing an overall structure of a plasma processing unit of this embodiment.

The structure of the plasma processing apparatus of this embodiment has substantially the same structure as that of the first embodiment and second embodiment. The plasma processing apparatus of this embodiment differs from the first and the second embodiment in the structure of the plasma processing unit, and more specifically, the configuration of the matching circuit 2A and switches. Like components are represented by the same reference numerals and the explanations thereof are omitted.

The plasma processing units 75, 76, 77, 95 and 96 of this embodiment are of a dual-frequency excitation type as in the second embodiment. Referring to FIG. 15, in each of the plasma processing units 75, 76, 77, 95 and 96, the input-terminal-side AC resistance RA as a radiofrequency characteristic is measured at a point PR2 which corresponds to the input terminal of the radiofrequency supplier (feed line) 1A connected to the radiofrequency generator 1.

Figure 16:
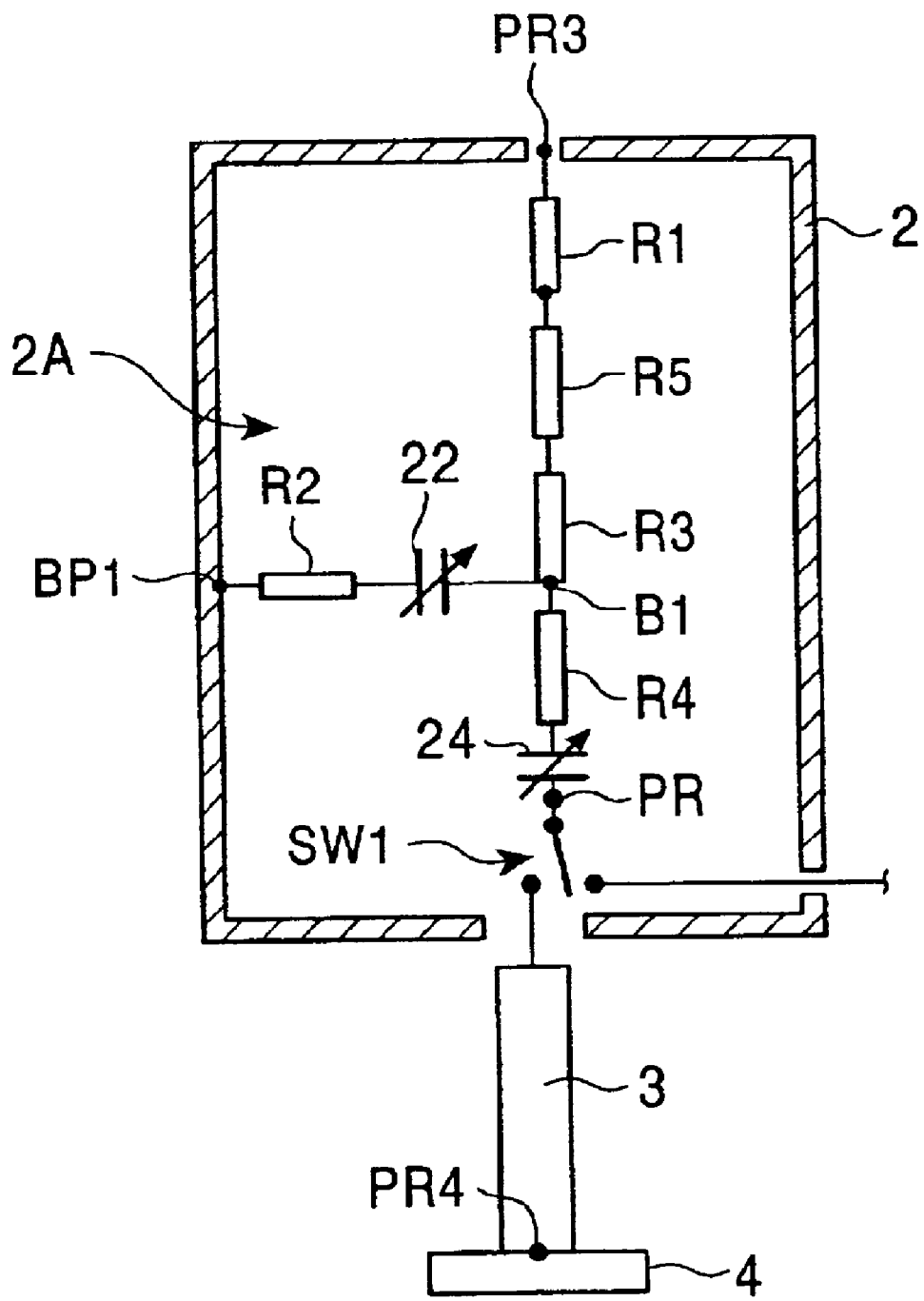
FIG. 16 is a schematic diagram showing a matching circuit of the plasma processing unit shown in FIG. 15.
Figure 17:
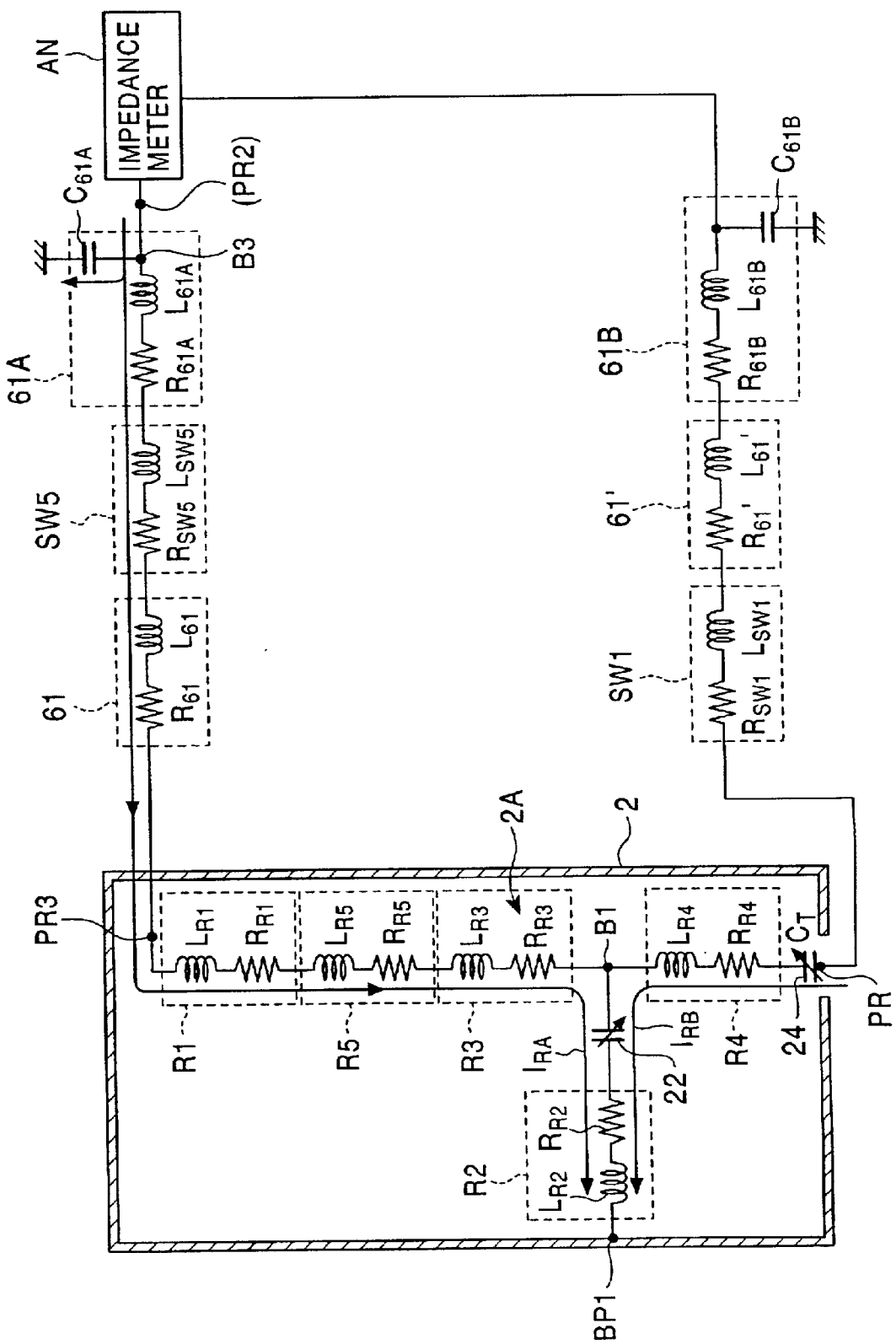
FIG. 17 is a schematic circuit diagram describing parasitic resistances in the matching circuit shown in FIG. 16.

FIG. 16 is a schematic diagram showing an overall structure of the matching circuit 2A in FIG. 15. FIG. 17 is a schematic circuit diagram for describing parasitic resistances in the matching circuit 2A of FIG. 16.

Referring to FIGS. 15 to 17, the matching circuit 2A is provided between the radiofrequency generator 1 and the feed plate 3 and has, as passive elements, the tuning capacitor 24 comprising the air-variable capacitor and the load capacitor 22 comprising the vacuum-variable capacitor. The matching circuit 2A also includes the conductors R1 to R4, and a conductor R5 for connecting these passive elements. The conductors R1 to R5 are each made of a copper plate.

The conductors R1, R5, R3, and R4, and the tuning capacitor 24 are connected in series from the input-terminal-side toward the output-terminal-side of the matching circuit 2A. The load capacitor 22 is connected in parallel to these elements at the branching point B1 located between the conductors R3 and R4. One end of the load capacitor 22 is connected to the matching box 2 (ground potential portion) through the conductor R2 at the connection point BP1.

The tuning capacitor 24 is located at the last stage in the matching circuit 2A among the passive elements constituting the matching circuit 2A. The output terminal of the tuning capacitor 24 thus functions as the output terminal of the matching circuit 2A, and the tuning capacitor 24 is connected to the plasma excitation electrode 4 through the feed plate 3.

Referring to FIGS. 15 to 17, connected to the point PR3 are a measuring terminal 61 for measuring the input-terminal-side AC resistance RA, a connecting line 61A which is a coaxial cable for connecting the measuring terminal 61 to the impedance meter AN, and a switch SW5 for switching the connection between the feed line 1A and the impedance meter AN during the measurement of the radiofrequency characteristics and during plasma generation. The point PR3 is connected to the switch SW5 through the measuring terminal 61. The feed line 1A and the connecting line 61A are also connected to the switch SW5. The ground potential for the switch SW5, the feed line 1A, and the connecting line 61A is the matching box 2 during both plasma generation and radiofrequency characteristic measurement.

The impedance between the point PR3 and the point PR2 and the impedance between the point PR3 and the impedance meter AN via the connecting line 61A are set to be equal to each other. More particularly, the length of the feed line 1A and the length of the connecting line 61A are set to be equal to each other. Moreover, the impedances between the impedance meter AN and each of the plasma processing units 75, 76, 77, 95, and 96 are set to be equal to one another. In this embodiment, the measurement of the radiofrequency characteristics, such as impedance and particularly the input-terminal-side AC resistance RA, can be conducted by operating the switch SW5 without having to detach/attach the matching circuit 2A from/to the impedance meter AN.

Referring to FIGS. 15 to 17, a measuring terminal 61' for measuring the output-terminal-side AC resistance RB, a connecting line 61B which is a coaxial cable for connecting the measuring terminal 61' to the impedance meter AN, and switches SW1 and SW1' are provided in the vicinity of the point PR. The switches SW1 and SW1' connects the matching circuit 2A to the impedance meter AN during the radiofrequency measurement and connects the matching circuit 2A to the feed plate 3 during the plasma generation. The point PR, the measuring terminal 61', and an output line extending to the feed plate 3 are connected to the switch SW1. The switch SW1' is connected to the matching box 2 and to the ground potential portion for the impedance meter AN via the shielding line of the connecting line 61B. The ground potential of the switches SW1 and SW1' and the connecting line 61B is the matching box 2 during both plasma generation and radiofrequency characteristics measurement.

The connecting lines 61B for the plasma processing units 75, 76, 77, 95, and 96 are set to have the same length so that the impedances between the impedance meter AN and each of the plasma processing units are set to be equal to one another. In this manner, the measurement of the radiofrequency characteristics, such as impedance and particularly the output-terminal-side AC resistance RB, can be conducted simply by operating the switches SW1 and SW1' without having to detach/attach the matching circuit 2A from/to the impedance meter AN.

In each of the plasma processing units 75, 76, 77, 95, <and 96 of this embodiment, the AC resistances RA and RB as radiofrequency characteristics in the matching circuits 2A are measured and defined as in the first and second embodiments.

Referring to FIG. 17, in measuring the input-terminal-side AC resistance RA, the switches SW1 and SW1' are operated to disconnect the matching circuit 2A from the plasma processing unit at the point PR. Meanwhile, the switch SW5 is operated to connect the matching circuit 2A to the impedance meter AN, the frequency oscillated by the impedance meter AN is set to about 40.68 MHz which is equal to a power frequency $f_e$, for example, and the vector quantity $(Z, \theta)$ of the impedance in the above measured region of the matching circuit 2A is measured to calculate the real part in the complex expression of the impedance which is defined as the AC resistance.

The radiofrequency elements contributing to the input-terminal-side AC resistance RA in the matching circuit 2A lying on the path indicated by an arrow $I_{RA}$ in FIG. 17 extending from a point (PR2), which is equivalent to the point PR2 located at the radiofrequency generator 1 side, to the ground potential portion such as the matching box 2 via the branching points B3 and B1 are as follows:

Parasitic resistance $R_{61A}$ in the connecting line 61A

Inductance $L_{61A}$ in the connecting line 61A

Capacitance $C_{61A}$ in the connecting line 61A

Parasitic resistance $R_{SW5}$ in the switch SW5

Inductance $L_{SW5}$ in the switch SW5

Parasitic resistance $R_{61}$ in the measuring terminal 61

Inductance $L_{61}$ in the measuring terminal 61

Parasitic resistance $R_{R5}$ in the conductor R1

Inductance $L_{R1}$ in the conductor R1

Parasitic resistance $R_{R5}$ in the conductor R5

Inductance $L_{R5}$ in the conductor R5

Parasitic resistance $R_{R3}$ in the conductor R3

Inductance $L_{R3}$ in the conductor R3

Capacitance $C_L$ of the load capacitor 22

Parasitic resistance $R_{R2}$ in the conductor R2

Inductance $L_{R2}$ in the conductor R2 wherein the capacitance $C_{61A}$ of the connecting line 61A is the capacitance generated with the shielding line.

Among these radiofrequency elements, the parasitic resistance $R_{61A}$ in the connecting line 61A, the parasitic resistance $R_{SW5}$ in the switch SW5, the parasitic resistance $R_{61}$ in the measuring terminal 61, the parasitic resistance $R_{R1}$ in the conductor R1, the parasitic resistance $R_{R5}$ in the conductor R5, the parasitic resistance $R_{R3}$ in the conductor R3, and the parasitic resistance $R_{R2}$ in the conductor R2 are measured as the input-terminal-side AC resistance RA in the matching circuit 2A, as shown in FIG. 17.

In measuring the input-terminal-side AC resistance RA, the parasitic resistance $R_{R3}$ includes resistances from the branching point B1 to the load capacitor 22, i.e., parasitic resistances on the circuit $I_{RA}$ not illustrated in the drawing.

Similarly, in measuring the output-terminal-side AC resistance RB, the switch SW5 is operated to disconnect the matching circuit 2A from the radiofrequency generator 1 at the point PR3, and the switches SW1 and SW1' are operated to connect the point PR of the matching circuit 2A to the impedance meter AN. Meanwhile, the matching box 2 is connected to the grounded portion of the impedance meter AN, the frequency oscillated by the impedance meter AN is set to about 40.68 MHz which is the same as the power frequency $f_e$, for example, and the vector quantity (Z, θ) of the impedance in the above measured region of the matching circuit 2A is measured. The real part in the complex expression of impedance is calculated therefrom and is defined as the AC resistance.

The radiofrequency elements contributing to the output-terminal-side AC resistance RB in the matching circuit 2A lying on the path indicated by an arrow $I_{RB}$ in FIG. 17 extending from the point PR to the connection point BP1 as the ground potential portion via the branching point B1 are as follows:

Parasitic resistance $R_{SW1}$ in the switch SW1
Inductance $L_{SW1}$ in the switch SW1
Capacitance $C_T$ of the tuning capacitor 24
Parasitic resistance $R_{R4}$ in the conductor R4
Inductance $L_{R4}$ in the conductor R4
Capacitance $C_L$ of the load capacitor 22
Parasitic resistance $R_{R2}$ in the conductor R2
Inductance $L_{R2}$ in the conductor R2

Among these radiofrequency elements, the parasitic resistance $R_{SW1}$ in the switch SW1, the parasitic resistance $R_{R4}$ in the conductor R4, and the parasitic resistance $R_{R2}$ in the conductor R2 are measured as the output-terminal-side AC resistance RB in the matching circuit 2A, as shown in FIG. 17.

In measuring the output-terminal-side AC resistance RB, the parasitic resistance $R_{R4}$ includes parasitic resistances on the circuit indicated by the arrow $I_{RB}$ not illustrated in the drawing, such as resistance from the branching point B1 to the load capacitor 22.

The following radiofrequency elements contribute to the output-terminal-side AC resistance RB in the matching circuit 2A during measurement as shown in FIG. 17, but are negligible when radiofrequency power is supplied to the plasma processing chamber from the radiofrequency generator 1.

Parasitic resistance $R_{61B}$ in the connecting line 61B
Inductance $L_{61B}$ in the connecting line 61B
Capacitance $C_{61B}$ in the connecting line 61B
Parasitic resistance $R_{61'}$ in the measuring terminal 61'
Inductance $L_{61'}$ in the measuring terminal 61'

An operation is performed to eliminate the contribution from these elements subsequent to the measurement of the output-terminal-side AC resistance RB.

In the matching circuit 2A of the plasma processing unit of this embodiment, the input and output-terminal-side AC resistances RA and RB are maintained to a value within a range suitable for the operation of the plasma processing unit and variations among different plasma processing units defined by equations (14A) and (14B) are adjusted as in the first and second embodiments.

The plasma processing apparatus and the inspection method therefor of this embodiment achieve the same advantages as in the first and second embodiments. Moreover, because the feed line 1A is included in the measured region of the matching circuit 2A, the adjustment can be conducted including the parasitic resistances in the component which supplies electric power. Thus, compared to other embodiments not including the radiofrequency supplier (feed line) 1A in the measured region, the difference in radiofrequency characteristics of the matching circuits 2A and the feed lines 1A among a plurality of plasma processing units can be further reduced. The effective power consumed in the plasma spaces of the different plasma processing units can be made substantially the same, and the uniformity in the plasma process results using the same process recipe can be further improved compared to the case not including the feed line 1A in the measured region.

In the plasma processing apparatus and the inspection method therefor of this embodiment, the measuring terminals 61 and 61' and the switches SW5, SW1, and SW1' are provided, and the impedance from the point PR3 to the point PR2 is set to be equal to the impedance from the point PR3 to the impedance meter AN via the connecting line 61A. Thus, radiofrequency characteristics, namely the input-terminal-side AC resistance RA and the output-terminal-side AC resistance RB, of each plasma processing unit can be measured without having to detach/attach the matching circuit 2A from/to the radiofrequency generator 1 and the feed plate 3 and without having to detach/attach the probe 105 for impedance measuring. By simply operating the switches SW5, SW1, and SW1', the plasma processing apparatus in operating state can be switched to a state suitable for measurement.

Moreover, in this embodiment, the lengths of the connecting lines 61A of the plasma processing units 75, 76, 77, 95 and 96 are set to be equal to each other so that the impedances between the impedance meter AN and each of the plasma processing units 75, 76, 77, 95, and 96 are the same. Thus, by simply operating the switch SW5, the input-terminal-side AC resistances RA as the radiofrequency characteristics of the plurality of plasma processing units can be sequentially and efficiently measured.

Furthermore, since the connecting lines 61B of these plasma processing units have the same length, the impedances between the impedance meter AN and each of plasma processing units are equal to one another. Thus, the output-terminal-side AC resistances RB of the plurality of plasma processing units can be sequentially and efficiently measured by operating the switches SW1 and SW1'.

Fourth Embodiment

A plasma processing apparatus and an inspection method therefor according to a fourth embodiment of the present invention will now be explained with-reference to the drawings.

Figure 18:
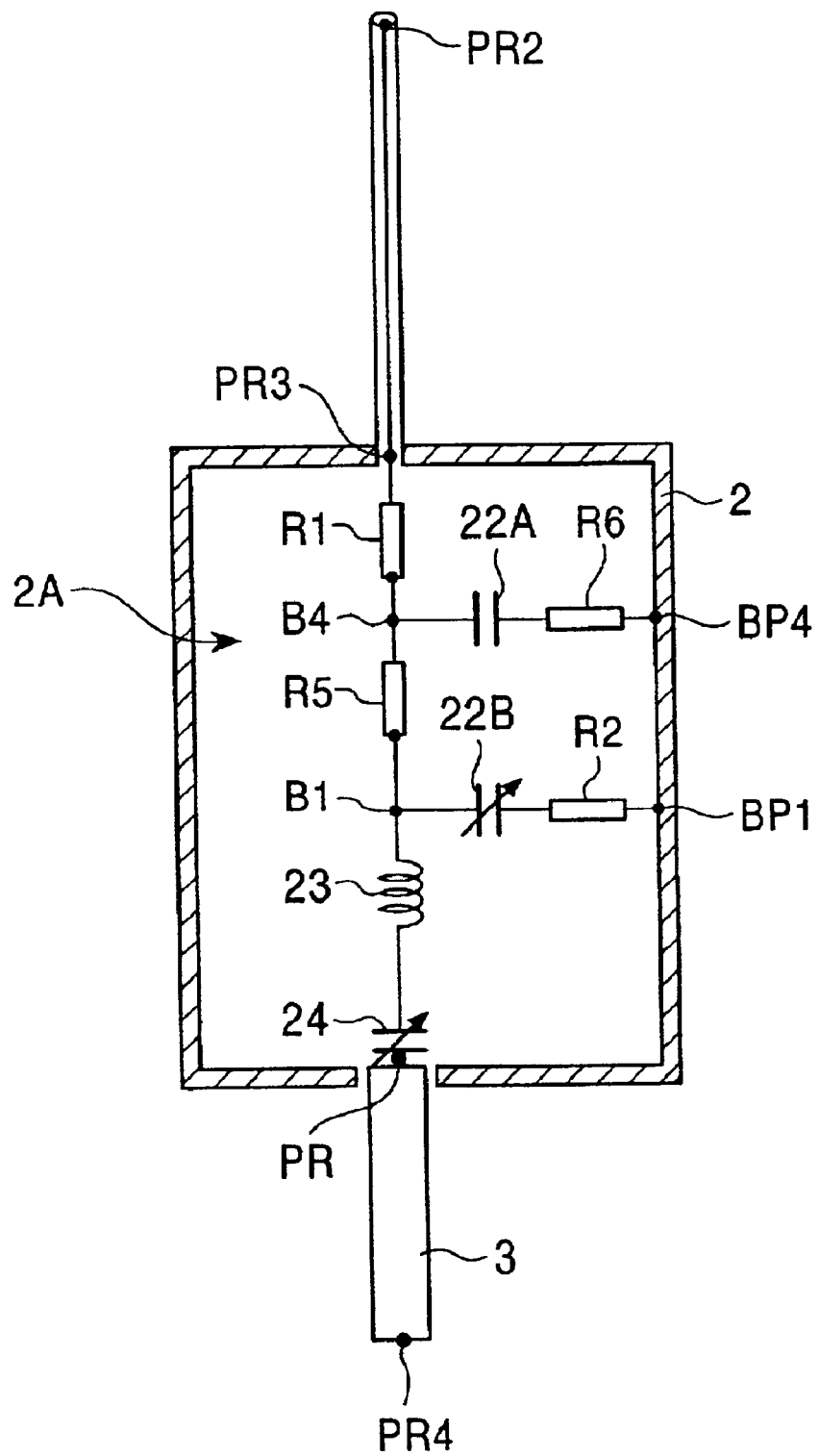
FIG. 18 is a schematic diagram showing a matching circuit of a plasma processing unit according to a fourth embodiment of a plasma processing apparatus.

FIG. 18 is a schematic diagram showing an overall structure of the matching circuit 2A of a plasma processing unit of this embodiment.

The structure of the plasma processing apparatus of this embodiment is substantially the same as that according to the first to third embodiments shown in FIGS. 1 to 17. The plasma processing apparatus of this embodiment differs from that of the first to third embodiments in the configuration of the matching circuit 2A in the plasma processing unit and the measured region of the matching circuit 2A. Like components are represented by the same reference numerals and the explanations thereof are omitted.

Referring to FIG. 18, in each of the plasma processing units 75, 76, 77, 95, and 96, the input-terminal-side AC resistance RA is measured at the point PR2 and the output-terminal-side AC resistance RB is measured at the point PR4 which is located at the electrode-4-side and corresponds to the output terminal of the radiofrequency feeder (feed plate) 3 connected to the matching circuit 2A, as in the third embodiment.

As in the first and second embodiment, the input terminal of the matching circuit 2A is directly connected to the feed line 1A without the switch SW5 therebetween.

Figure 19:
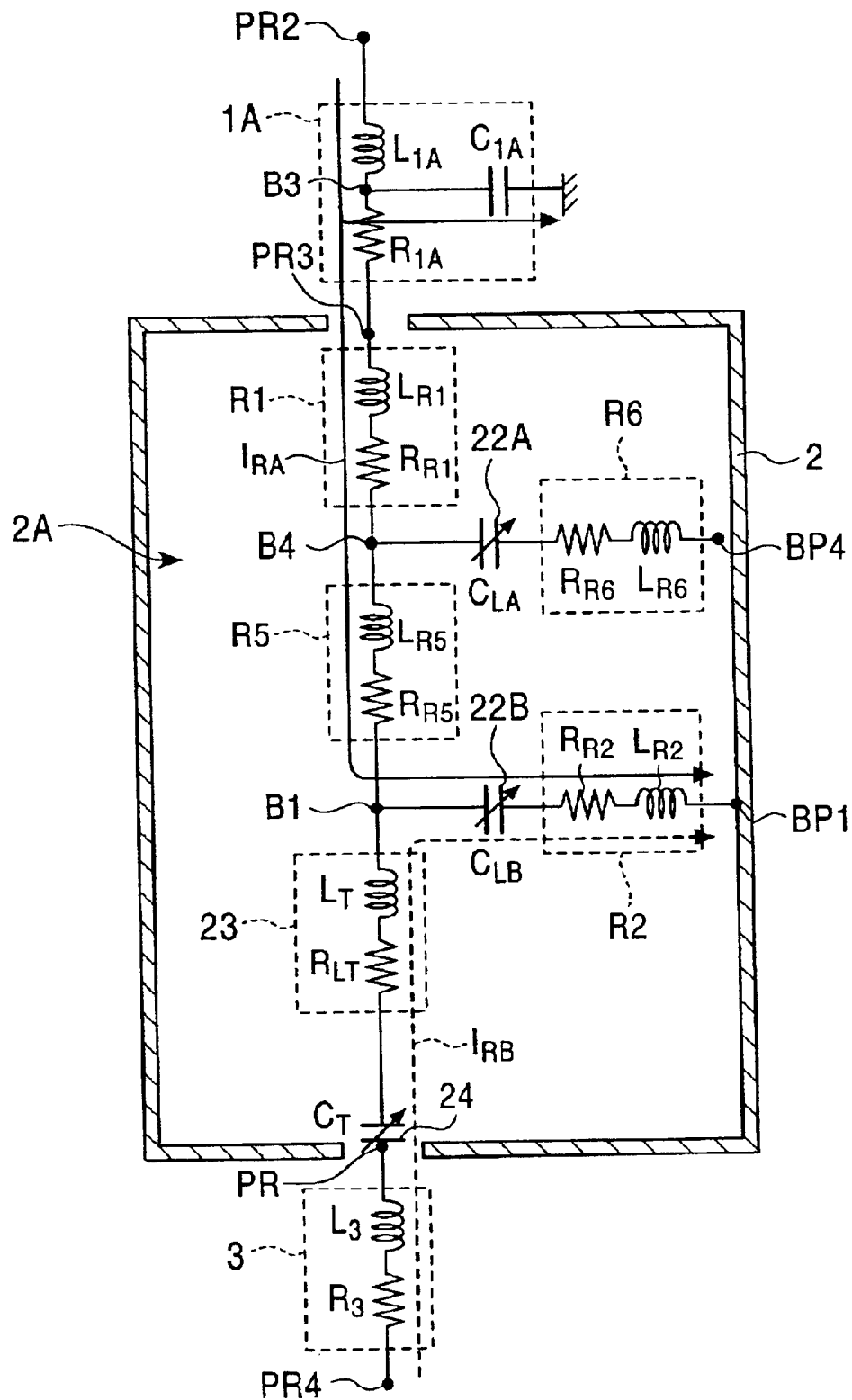
FIG. 19 is a schematic circuit diagram describing parasitic resistances in the matching circuit shown in FIG. 18.

FIG. 19 is a schematic circuit diagram for describing parasitic resistances in the matching circuit 2A of FIG. 18.

The matching circuit 2A is, as shown in FIGS. 18 and 19, disposed between the radiofrequency generator 1 and the feed plate 3 and has, as passive elements, inductance coil 23, the tuning capacitor 24 comprising the air-variable capacitor, and load capacitors 22A and 22B each comprising a vacuum-variable capacitor. The matching circuit 2A also includes the conductors R1, R2, and R5 and a conductor R6 for connecting these passive elements. Each of the conductors R1, R2, R5, and R6 is made of a copper plate.

The conductors R1 and R5, the inductance coil 23, and the tuning capacitor 24 are connected in series from the input-terminal-side of the matching circuit 2A to the output-terminal-side of the same. The load capacitor 22A is connected to these elements in parallel at a branching point B4 disposed between the conductors R1 and R5, and the load capacitor 22B is also connected to these elements in parallel at the branching point B1 disposed between the conductor R5 and the inductance coil 23. One end of the load capacitor 22A is connected to the matching box 2 (ground potential portion) at a connection point BP4 via the conductor R6. One end of the load capacitor 22B is connected to the matching box 2 (ground potential portion) at the connection point BP1 via the conductor R2.

The tuning capacitor 24 is located at the last stage of the matching circuit 2A among the passive elements constituting the matching circuit 2A. The output terminal of the tuning capacitor 24 functions as the output terminal of the matching circuit 2A. The tuning capacitor 24 is connected to the plasma excitation electrode 4 via the feed plate 3.

Figure 20:
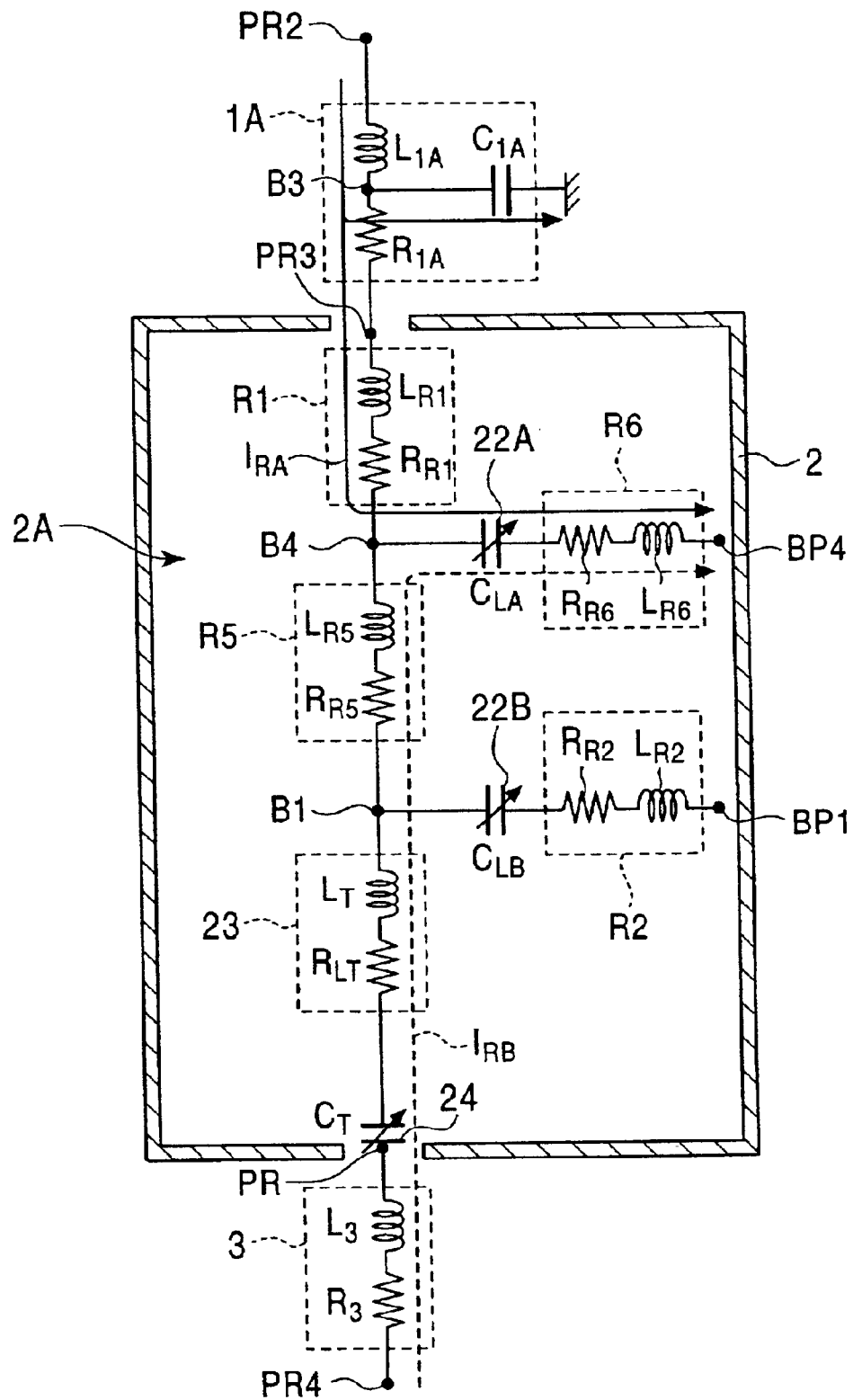
FIG. 20 is a schematic circuit diagram describing parasitic resistances in the matching circuit shown in FIG. 18.

The AC resistances RA and RB as the radiofrequency characteristics in the matching circuit 2A of each of the plasma processing units 75, 76, 77, 95, and 96 are measured and defined as in the first to third embodiments. Specifically, the AC resistances RA and RB are measured and defined as shown in FIGS. 18 to 20 in this embodiment.

In order to define the measured region of the matching circuit 2A of this embodiment, the matching circuit 2A is separated from the plasma processing unit at the point PR4 which corresponds to the output terminal of the radiofrequency feeder (feed plate) 3, as shown in FIG. 18. In other words, the matching circuit 2A and the feed plate 3 connected to the matching circuit 2A are separated from the plasma processing chamber 60. Meanwhile, the matching circuit 2A and the feed line 1A connected to the input terminal of the matching circuit 2A are separated from the radiofrequency generator 1.

In this embodiment, the input-terminal-side AC resistance RA in the above-described measured region is measured at the point PR2, as shown in FIG. 18.

Referring to FIG. 19, in measuring the input-terminal-side AC resistance RA, the connection point BP4 is first detached from the matching box 2, and the probe 105 of the impedance meter AN is connected to a ground position of the matching box 2 (ground potential portion) and to the point PR2, as in the first and second embodiments. The shielding line of the feed line 1A is grounded. The frequency oscillated by the impedance meter AN is then set at about 40.68 MHz which is equal to the power frequency $f_e$, for example, to measure the vector quantity (Z, θ) of the impedance in the above measured region of the matching circuit 2A. The real part in the complex expression of the impedance is calculated therefrom and is defined as the input-terminal-side AC resistance $RA_{BP1}$.

The radiofrequency elements contributing to the input-terminal-side AC resistance $RA_{BP1}$ of the matching circuit 2A lying in the circuit indicated by an arrow $I_{RA}$ in FIG. 19 extending from the point PR2 to the connection point BP1 on the matching box 2 which is a ground potential portion via the branching point B1 are as follows:

Parasitic resistance $R_{1A}$ in the feed line 1A

Inductance $L_{1A}$ in the feed line 1A

Capacitance $C_{1A}$ of the feed line 1A

Parasitic resistance $R_{R1}$ in the conductor R1

Inductance $L_{R1}$ in the conductor R1

Parasitic resistance $R_{R5}$ in the conductor R5

Inductance $L_{R5}$ in the conductor R5

Capacitance $C_{LB}$ of the load capacitor 22B

Parasitic resistance $R_{R2}$ in the conductor R2

Inductance $L_{R2}$ in the conductor R2 wherein the capacitance $C_{1A}$ of the feed line 1A is the capacitance generated with the shielding line.

Among these radiofrequency elements, the parasitic resistance $R_{1A}$ in the feed line 1A, the parasitic resistance $R_{R1}$ in the conductor R1, the parasitic resistance $R_5$ in the conductor R5, and the parasitic resistance $R_{R2}$ in the conductor R2 are measured as the input-terminal-side AC resistance $RA_{BP1}$ of the matching circuit 2A, as shown in FIG. 19.

Next, as shown in FIG. 20, the connection point BP1 is disconnected from the matching box 2 while connecting the connection point BP4 to the matching box 2 to measure the input-terminal-side AC resistance $RA_{BP2}$. As in the above, the probe 105 of the impedance meter AN is connected to the point PR2 and to a ground position on the matching box 2 (ground potential portion), and the frequency oscillated by the impedance meter AN is set at the same frequency as a power frequency $f_e$, i.e., about 40.68 MHz, for example, to measure the vector quantity (Z, θ) of the impedance in the above measured region of the matching circuit 2A. The real part of the complex expression of the impedance is calculated therefrom and defined as the input-terminal-side AC resistance $RA_{BP2}$.

The radiofrequency elements contributing to the input-terminal-side AC resistance $RA_{BP2}$ of the matching circuit 2A lying in the circuit indicated by the arrow $I_{RA}$ in FIG. 20 extending from the point PR3 to the connection point BP4 via the branching point B4 are as follows:

Parasitic resistance $R_{1A}$ in the feed line 1A

Inductance $L_{1A}$ in the feed line 1A

Capacitance $C_{1A}$ in the feed line 1A

Parasitic resistance $R_{R1}$ in the conductor R1

Inductance $L_{R1}$ in the conductor R1

Capacitance $C_{LA}$ in the load capacitor 22A

Parasitic resistance $R_{R6}$ in the conductor R6

Inductance $L_{R6}$ in the conductor R6

Among these radiofrequency elements, the parasitic resistance $R_{1A}$ in the feed line 1A, the parasitic resistance $R_{R1}$ in the conductor R1, and the parasitic resistance $R_{R6}$ in the conductor R6 are measured as the input-terminal-side AC resistance $RA_{BP2}$ of the matching circuit 2A, as shown in FIG. 20.

In measuring the output-terminal-side AC resistance RB of the matching circuit 2A, the connection point BP4 is first detached from the matching box 2 and then the output-terminal-side AC resistance RB is measured at the point PR4, as shown in FIG. 19. The probe 105 of the impedance meter AN is attached to the point PR4 and to a ground position on the matching box 2 (ground potential portion). The frequency oscillated by the impedance meter AN is then set at the same frequency as the power frequency $f_e$, i.e., about 40.68 MHz, for example, to measure the vector quantity (Z, θ) of the impedance in the above measured region of the matching circuit 2A. The real part of the complex expression of the impedance is calculated therefrom and defined as the output-terminal-side AC resistance $RB_{BP1}$.

Referring to FIG. 19, the radiofrequency elements contributing to the output-terminal-side AC resistance $RB_{BP1}$ of the matching circuit 2A lying on the path indicated by an arrow $I_{RB}$ extending from the point PR4 to the connection point BP1 on the matching box 2 which is a ground potential portion, via the branching point B1 are as follows:

Parasitic resistance $R_3$ in the feed plate 3

Inductance $L_3$ in the feed plate 3

Capacitance $C_T$ of the tuning capacitor 24

Parasitic resistance $R_{LT}$ in the inductance coil 23

Inductance $L_T$ in the inductance coil 23

Capacitance $C_{LB}$ of the load capacitor 22B

Parasitic resistance $R_{R2}$ in the conductor R2

Inductance $L_{R2}$ in the conductor R2

Among these radiofrequency elements, the parasitic resistance $R_{R4}$ in the conductor R4, the parasitic resistance $R_{LT}$ in the inductance coil 23, and the parasitic resistance $R_{R2}$ in the conductor R2 are measured as the output-terminal-side AC resistance $RB_{BP1}$ in the matching circuit 2A, as shown in FIG. 19

Next, referring to FIG. 20, in measuring the output-terminal-side AC resistance $RB_{BP2}$, the connection point BP1 is detached from the matching box 2 and the connection point BP4 is connected to the matching box 2. The probe 105 of the impedance meter AN is connected to the point PR4 and to a ground position on the matching box 2 (ground potential portion). The frequency oscillated from the impedance meter AN is then set at a frequency same as the power frequency $f_e$, i.e., about 40.68 MHz, for example, to measure the vector quantity (Z, θ) of the impedance in the above measured region of the matching circuit 2A. The real part in the complex expression of the impedance is calculated therefrom and defined as the output-terminal-side AC resistance $RB_{BP2}$.

The radiofrequency elements contributing to the output-terminal-side AC resistance $RB_{BP2}$ of the matching circuit 2A lying on the path indicated by an arrow $I_{RB}$ in FIG. 20 extending from the point PR4 to the connection point BP4 on the matching box 2 which is a ground potential portion, via the branching point B1 are as follows:

Parasitic resistance $R_3$ in the feed plate 3

Inductance $L_3$ in the feed plate 3

Capacitance $C_T$ of the tuning capacitor 24

Parasitic resistance $R_{LT}$ in the inductance coil 23

Inductance $L_T$ in the inductance coil 23

Parasitic resistance $R_{R5}$ in the conductor R5

Inductance $L_{R5}$ in the conductor R5

Capacitance $C_{LA}$ of the load capacitor 22A

Parasitic resistance $R_{R6}$ in the conductor R6

Inductance $L_{R6}$ in the conductor R6

Among these radiofrequency elements, the parasitic resistance $R_3$ in the feed plate 3, the parasitic resistance $R_{LT}$ in the inductance coil 23, the parasitic resistance $R_{R5}$ in the conductor R5, and the parasitic resistance $R_{R6}$ in the conductor R6 are measured as the output-terminal-side AC resistance $RB_{BP2}$, as shown in FIG. 20.

In the matching circuit 2A of the plasma processing unit of this embodiment, the AC resistances RA and RB as the radiofrequency characteristics are set to a value suitable for the operation of the plasma processing unit, as in the second embodiment. More specifically, the input-terminal-side AC resistance $RA_{BP1}$, the input-terminal-side AC resistance $RA_{BP2}$, the output-terminal-side AC resistance $RB_{BP1}$, and the output-terminal-side AC resistance $RB_{BP2}$ are each set at a value suitable for the operation of the plasma processing unit. Meanwhile, the variations <RA> and <RB> among a plurality of plasma processing units defined by equations (14A'), (14A''), (14B'), and (14B'') are adjusted so that the effective power consumed in the plasma spaces of these units can be made substantially the same.

The plasma processing apparatus and the inspection method therefor of this embodiment have the same advantages as in the first to third embodiments. Moreover, because the feed plate 3 is included in the measured region of the matching circuit 2A, the difference in the radiofrequency characteristics among the plurality of plasma processing units can be further minimized compared to the embodiment not including the radiofrequency feeder (feed plate) 3 in the measured region. Thus, the effective power consumed in the plasma space of each plasma processing unit can be made uniform among the plurality of plasma processing units, and the uniformity in the process results obtained by applying the same process recipe to these plasma processing units can be further improved.

It should be noted here that in each of the above-described first to fourth embodiments, the variation may be set at a value less than 0.4 instead of less than 0.5. Also, the measuring point may be selected from among the points PR, PR2, PR3, and PR4.

Moreover, a switch or switches similar to the switches SW1, SW1', and SW5, and a measuring terminal similar to the measuring terminals 61 and 61' for switching between the impedance meter AN and the radiofrequency generator 1 may be provided at the point PR in each of the above-described embodiments.

Furthermore, these measuring points, switches, and the measuring terminals may be set in relation to the matching circuit 25.

Fifth Embodiment

A plasma processing apparatus, plasma processing system, and an inspection method therefor will be explained below with reference to the drawings.

Figure 21:
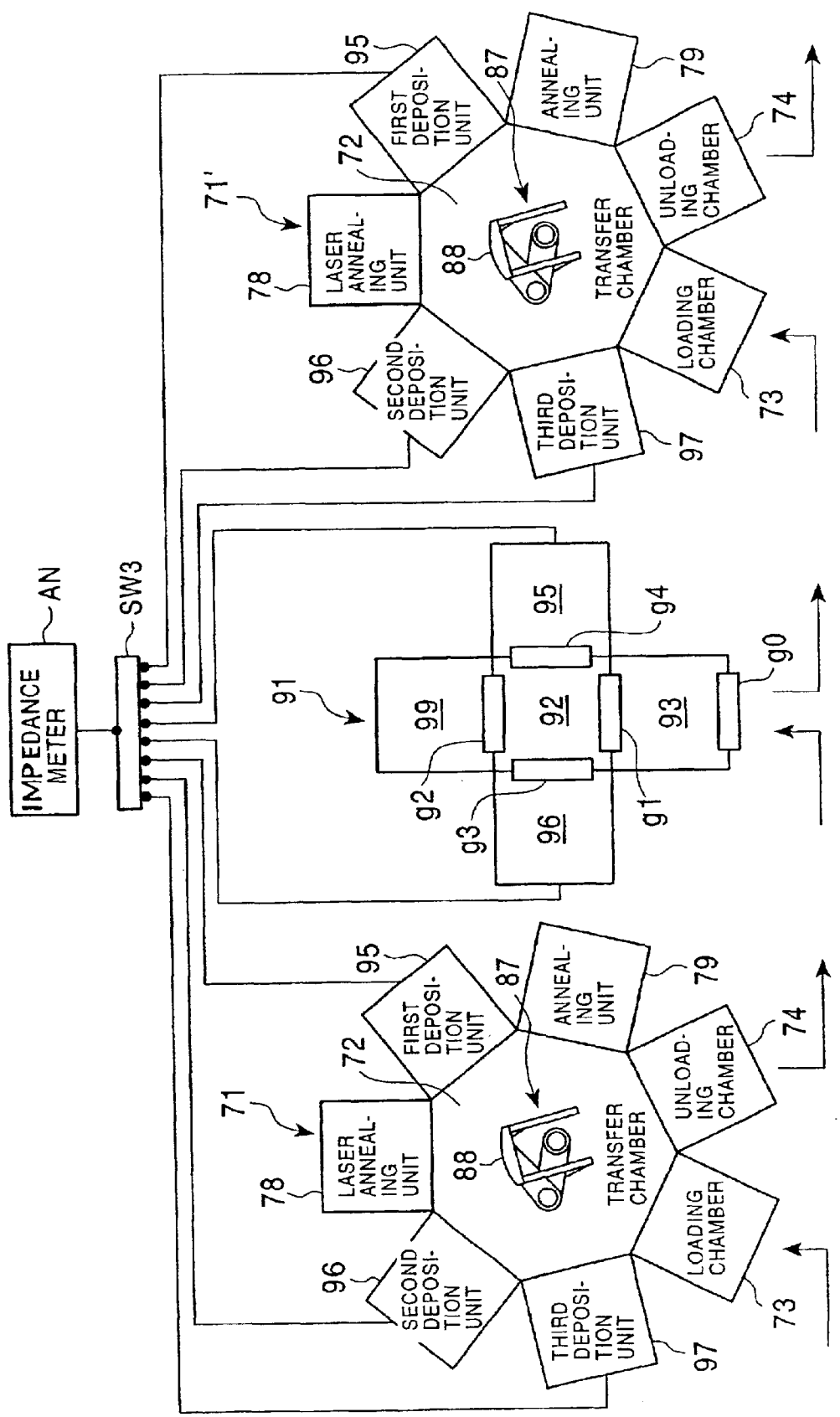
FIG. 21 is a schematic diagram showing an overall structure of a plasma processing system according to fifth embodiment of the present invention.

FIG. 21 is a schematic diagram illustrating an overall structure of a plasma processing system according to this embodiment.

The plasma processing system of this embodiment is substantially a combination of plasma processing apparatuses 71 and 71' which correspond to the plasma processing apparatus 71 of the first embodiment shown in FIG. 1 and a plasma processing apparatus 91 which corresponds to the plasma processing apparatus 91 according to the second to fourth embodiments shown in FIGS. 10 to 20. Like components are represented by the same reference numerals, and explanations thereof are omitted.

The plasma processing system of this embodiment constitutes a part of a production line and includes the plasma processing apparatus 71, the plasma processing apparatus 91, and a plasma processing apparatus 71', as shown in FIG. 21. The plasma processing apparatus 71 has three plasma processing units 95, 96, and 97. The plasma processing apparatus 91 has two plasma processing units 95 and 96. The plasma processing apparatus 71' has three plasma processing units 95, 96, and 97.

The plasma processing apparatuses 71 and 71' differ from that according to the first embodiment shown in FIG. 1 in that three plasma processing units 95 to 97 each having substantially the same configuration as the plasma processing unit 95 of a dual-frequency excitation type described in the second to fourth embodiments shown in FIGS. 10 to 20 are used instead of the plasma processing units 75 to 77. The plasma processing units 95 to 97 of the fifth embodiment have substantially the same structure.

Referring to FIG. 21, each of the plasma processing units 95 to 97 has the impedance measuring terminal 61 and the switch SW5 which are connected to the impedance meter AN via a switch SW3. During the measurement of the impedance, the switch SW3 connects only one of the plasma chambers 95, 96, and 97 to the impedance meter AN. The length of a coaxial cable connecting the measuring terminal 61 to the switch SW3 is set to be the same for all plasma processing units 95 to 97 so that impedance in the coaxial cables for the plasma processing units 95 to 97 are set to be the same. As in the third embodiment shown in FIGS. 15 and 17, the probe 105 of the impedance meter AN is detachably attached to the measuring terminal 61.

Among the plasma processing units 95 to 97 in this embodiment, a variation <RA> is defined by equation (14A) below:

$$<RA> = (RA_{max} - RA_{min})/(RA_{max} + RA_{min}) \quad (14A)$$

wherein $RA_{max}$ and $RA_{min}$ are the maximum and minimum values, respectively, among an input-terminal-side AC resistance $RA_{95}$ in the plasma processing unit 95, an input-terminal-side AC resistance $RA_{96}$ in the plasma processing unit 96, and an input-terminal-side AC resistance $RA_{97}$ in the plasma processing unit 97. The variation <RA> defined by equation (14A) is then set at a value less than 0.5. The variation <RA> can be adjusted by the methods (1) to (4) described above.

A variation <RB> is defined by equation (14B) below:

$$<RB> = (RB_{max} - RB_{min})/(RB_{max} + RB_{min}) \quad (14B)$$

wherein $RB_{max}$ and $RB_{min}$ are the maximum and minimum values, respectively, among an output-terminal-side AC resistance $RB_{95}$ in the plasma processing unit 95, an output-terminal-side AC resistance $RB_{96}$ in the plasma processing unit 96, and an output-terminal-side AC resistance $RB_{97}$ in the plasma processing unit 97. The variation <RB> defined by equation (14B) is then set to a value less than 0.5. The variation <RB> can also be adjusted by the methods (1) to (4) described above.

In the plasma processing system of the present invention, for example, a substrate 16, which has been preliminarily treated, is subjected to a first layer deposition treatment in the plasma processing unit 95 of the plasma processing apparatus 71, is heat-treated in the annealing unit 79, and is then annealed in the laser annealing unit 78. The treated substrate 16 is subjected to second and third layer deposition treatments in the plasma processing units 96 and 97.

The substrate 16 discharged from the plasma processing apparatus 71 is transferred into another treating apparatus not shown in the drawing, so as to apply a photoresist thereto by a photolithographic step.

Next, the substrate 16 is transferred into the plasma processing apparatus 91 and is plasma-etched in the processing units 95 and 96. Subsequently, the substrate 16 is transferred to another plasma processing unit which is equivalent to the plasma processing apparatus 91 but not shown in the drawing, and is subjected to a deposition treatment.

The substrate 16 is then discharged from the plasma processing apparatus not shown in the drawing and transferred into another treating apparatus also not shown in the drawing so as to remove the resist layer and to perform photolithographic patterning thereon.

The substrate 16 is transferred to the plasma processing apparatus 71' and is sequentially subjected to first, second, and third deposition treatments in the plasma processing units 95, 96, and 97. Finally, the treated substrate 16 is discharged from the plasma processing system to be subjected to aftertreatment.

The plasma processing system and the inspection method therefor of this embodiment have the same advantages as those in the first and second embodiments. Moreover, the variations in the input-terminal-side AC resistance RA and the output-terminal-side AC resistance RB in the matching circuits 2A of the plasma processing units 95 to 97 are set to be less than 0.5. Thus, the difference in the radiofrequency characteristics among the plasma processing units 95 to 97 can be minimized, and the plasma processing units 95 to 97 can be maintained within a predetermined range indicated by the impedance characteristic, thereby generating plasma of substantially the same density.

As a result, substantially the same plasma process results can be achieved by applying the same process recipe to the plasma processing units 95 to 97. When applied to a deposition process, layers having substantially the same layer characteristics, such as layer thickness, isolation voltage, and etching rate, can be manufactured using the plasma processing units 95 to 97. More specifically, the above-described variations are maintained at less than 0.5 so as to maintain the variation in layer thickness among layers manufactured by these plasma processing units 95 to 97 within ±7% using the same process recipe. Thus, the overall radiofrequency characteristics of the plasma processing system can be optimized, and the plasma processing units 95 to 97 can stably generate plasmas, achieving stable and uniform operation.

As a result, a determination of process conditions based on the relationships between enormous amounts of data on these processing chambers 95, 96, and 97 and the results obtained by evaluation of actually processed substrates is no longer necessary.

Thus, in installing new systems and during inspection of installed systems, the time required for adjusting these processing chambers 95, 96, and 97 to obtain substantially the same results using the same process recipe can be significantly reduced compared with an inspection method requiring actual deposition on the substrate 16. Moreover, according to this embodiment, the plasma processing system can be directly evaluated in situ in a shorter period of time compared to a conventional two-stage evaluation requiring the steps of first processing the substrate and then evaluating the performance based on the evaluation of the processed substrate. Moreover, in this embodiment, inspection by layer deposition on substrates is performed to determine the process recipe when the plasma process apparatus is installed. Since the plasma processing units 95 to 97 have the same radiofrequency characteristics, the layer deposition may be performed in only one of the units. In the maintenance of the plasma processing apparatus, actual layer deposition is not required because the radiofrequency characteristics of the plasma processing units are controlled within the predetermined value. In contrast, these plasma process units must be independently evaluated if conventional evaluation methods are applied to the conventional plasma processing apparatuses.

Accordingly, a shutdown of the production line for several days or several weeks to validate and evaluate the operation of the plasma processing system is no longer necessary. The production line, therefore, has high productivity with reduced costs since the cost of substrates for inspection, the cost of processing the substrates for inspection, and the labor cost for workers involved with the adjustment can be reduced.

In the plasma processing system of this embodiment, overall radiofrequency characteristics of the plasma processing units 95 to 97 can be optimized by adjusting the input-terminal-side AC resistance RA and output-terminal-side AC resistance RB of each of the plasma processing units 95 to 97. Thus, the plasma processing units 95 to 97 can be stably operated, and power loss in the matching circuit 2A and in the vicinity of matching circuit 2A can be reduced even when power of a frequency higher than the frequency conventionally used, i.e., 13.56 MHz, is supplied from the radiofrequency generator 1. Accordingly, power can be efficiently introduced into the plasma generating space between the plasma excitation electrode 4 and the susceptor electrode 8. When a frequency equal to the frequency conventionally used is supplied, the effective power consumed in the plasma generating spaces in the plasma processing units 95 to 97 can be increased compared to conventional plasma processing apparatuses.

Consequently, the processing rate of the plasma processing system as a whole can be improved by using higher plasma excitation frequencies. When applied to a deposition process such as a plasma enhanced CVD process, deposition rate in all the plasma processing units 95 to 97 can be further improved. Since the plasma processing units 95 to 97 can be stably operated, the plasma processing apparatuses 71, 91, and 71' can also be stably operated to improve the operational stability of the whole plasma processing system. These advantages can be simultaneously achieved in all the plasma processing units.

In the plasma processing units 95 to 97, effective power consumed in the plasma generating spaces is increased to improve the planar uniformity of the plasma processing on the substrate 16. When applied to a deposition process such as a plasma-enhanced CVD or a sputtering process, the distribution in a planar direction in the layer thickness can be improved, and layer characteristics such as isolation voltage, resistance against etching, density (hardness) of the deposited layer, can be improved as a result of increased plasma density.

Since effective power consumed in the plasma space can be improved compared to conventional plasma processing systems when the frequency conventionally used is supplied, the plasma processing system as a whole exhibits an improved power consumption efficiency, requiring less power to obtain the same processing rate or layer characteristics. These advantages can be achieved in all the plasma processing units constituting the system. Accordingly, this plasma processing system achieves reduction in power loss and operating cost, and further improves the productivity. Since the time required for processing is reduced, power consumption can be reduced and emission of carbon dioxide which adversely affects the environment can be reduced.

In the plasma processing system of this embodiment, each of the plasma processing units 95 to 97 is provided with the measuring terminal 61 and the switch SW5 at the point PR3 of the matching circuit 2A. A single impedance meter AN is switchably connected to the measuring terminal 61 and the switch SW5 via the switch SW3. During measurement of the impedance characteristics of the plasma processing units in the plasma processing system, the matching circuit 2A need not be detached from the radiofrequency generator 1 and the feed line 1A as in the first and the second embodiments. Moreover, the impedance characteristics, the input-terminal-side AC resistance RA, and the output-terminal-side AC resistance RB of the plurality of plasma processing units can be measured by using a single impedance meter AN.

Thus, the impedance characteristics of the plasma processing units 95 to 97 can be measured easily, and the AC resistances RA and RB can be further effectively measured.

The impedance between the measuring terminal 61 and the switch SW3 is adjusted to be the same among the plasma processing units 95 to 97 constituting the plasma processing apparatuses 71, 71', and 91. Since the impedance between the measuring terminal 61 and the switch SW3 is set to be equal to the impedance measured at the point PR2 at the radiofrequency generator 1 side, the readings of the impedance meter AN measured by suitably operating the switches SW1, SW2, and SW3, can be deemed as the impedance measured at the point PR2 at the radiofrequency generator 1 side.

Since the difference in the impedance characteristics from the measuring terminal 61 to the switch SW3 of the plasma processing units 95 to 97 can be disregarded, the input-terminal-side AC resistance RA and the output-terminal-side AC resistance RB can be measured more precisely and efficiently without correction or conversion. Thus, the input-terminal-side AC resistance RA and the output-terminal-side AC resistance RB can be efficiently and further accurately measured.

In this embodiment, the switches SW3 and SW5 may cooperate to sequentially switch the connection to the plasma processing units 95 to 97. Moreover, instead of two switches SW1 and SW2, a single switch which sets the impedance between the branching point to the point PR equal to the impedance between the branching point to the probe may be provided.

Although in the above-described embodiments, the AC resistances RA and RB are set in relation to the plasma excitation electrode 4 of each plasma processing unit, the AC resistances RA and RB may be set in relation to the susceptor electrode 8. In such a case, measuring points PR', PR3', and PR4' of the matching circuit 25 as shown in FIGS. 11 and 15 are used.

Moreover, the present invention can be applied to a plasma processing apparatus of an inductive coupled plasma (ICP) type or a radial line slot antenna (RLSA) type, and to a processing apparatus for reactive ion etching (RIE).

Figure 22:
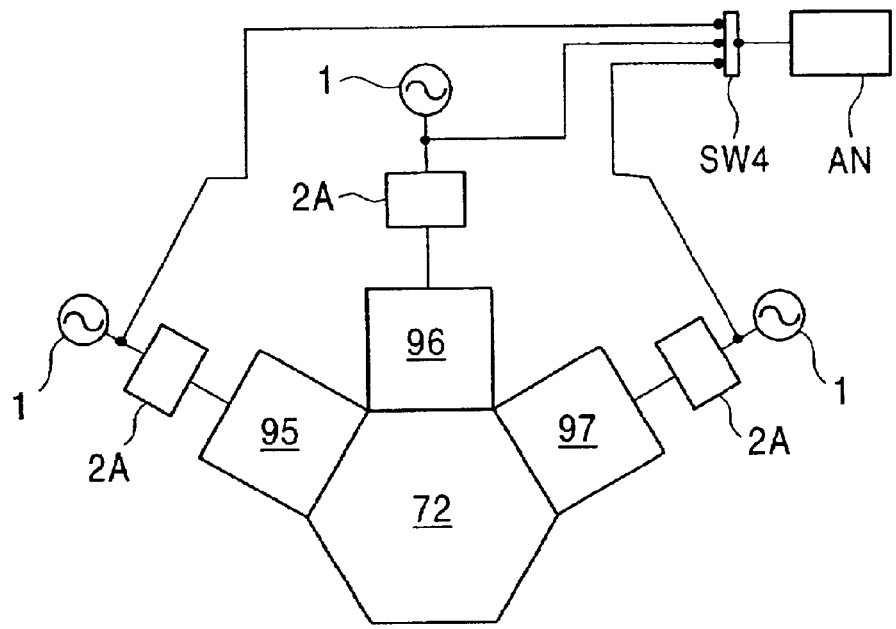
FIG. 22 is a schematic diagram showing an overall structure of the plasma processing apparatuses according to the first to fifth embodiments.
Figure 23:
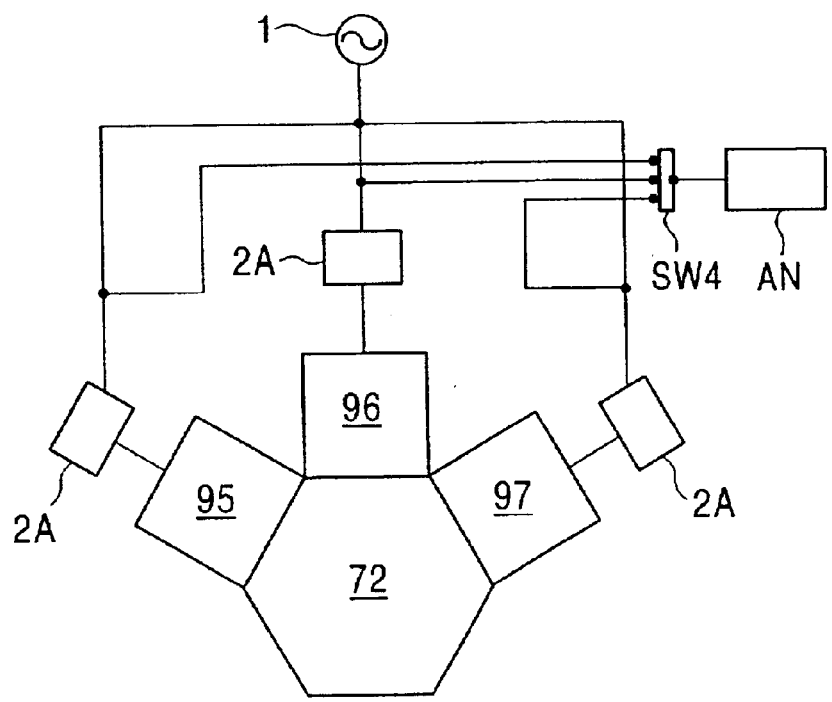
FIG. 23 is a schematic diagram showing an overall structure of a plasma processing apparatus of another embodiment.
Figure 24:
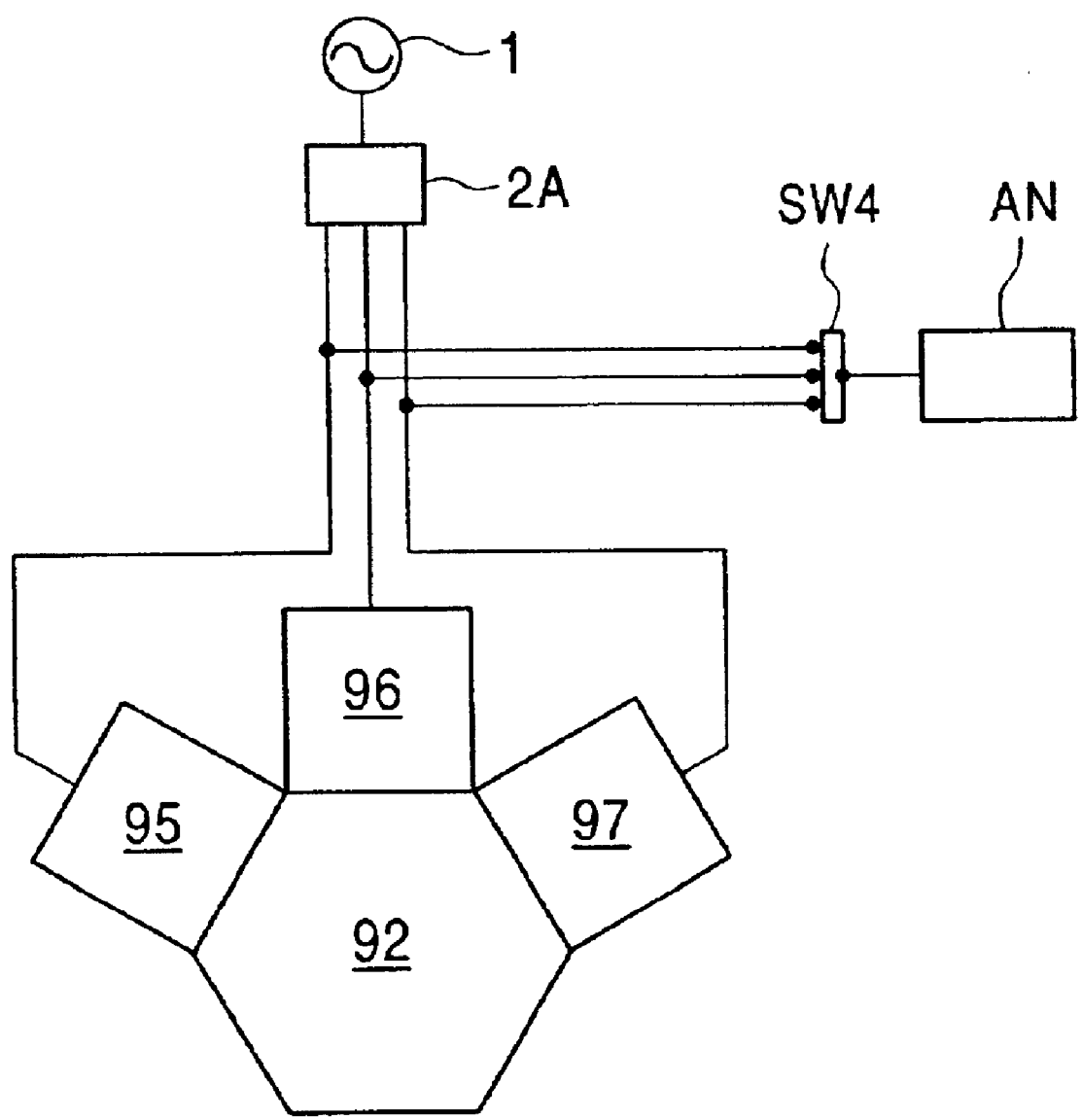
FIG. 24 is a schematic diagram showing an overall structure of a plasma processing apparatus of yet another embodiment.

In each of the above-described embodiments, the matching circuit 2A and the radiofrequency generator 1 are respectively provided for each of the plasma processing units 95 to 97, as illustrated in FIG. 22, and each of the matching circuits 2A is connected to the single impedance meter AN via the switch SW4. Alternatively, as shown in FIG. 23, matching circuits 2A of the plasma processing units 95, 96, and 97 may be switchably connected to the same radiofrequency generator. Alternatively, as shown in FIG. 24, the plasma processing units 95 to 97 may be switchably connected to the same matching circuit 2A.

Alternatively, two separate impedance meters AN for measuring the input-terminal-side AC resistance RA and the output-terminal-side AC resistance RB, respectively, may be provided to be connected to the plasma processing unit. In such a case, a switch may be provided to switch between measuring of the input-terminal-side AC resistance RA and the measuring of the output-terminal-side AC resistance RB.

In the above-described embodiments, the frequency for measuring the input-terminal-side AC resistance RA and the output-terminal-side AC resistance RB oscillated by the impedance meter AN is set at the same frequency as the power frequency $f_e$ supplied from the radiofrequency generator 1. Thus, the characteristics of the plasma processing units 95 to 97 can be adjusted to be within a predetermined range, and the difference in the radiofrequency characteristics of these units can be reduced. The plasma processing units 95 to 97 thereby consume substantially the same power in their plasma generating spaces.

Sixth Embodiment

Next, a performance validation system for a plasma processing apparatus or a plasma processing system according to an embodiment of the present invention will be described below with reference to the drawings. In the following description, a person who distributes and maintains the plasma processing apparatus is referred to as a "maintenance engineer".

Figure 25:
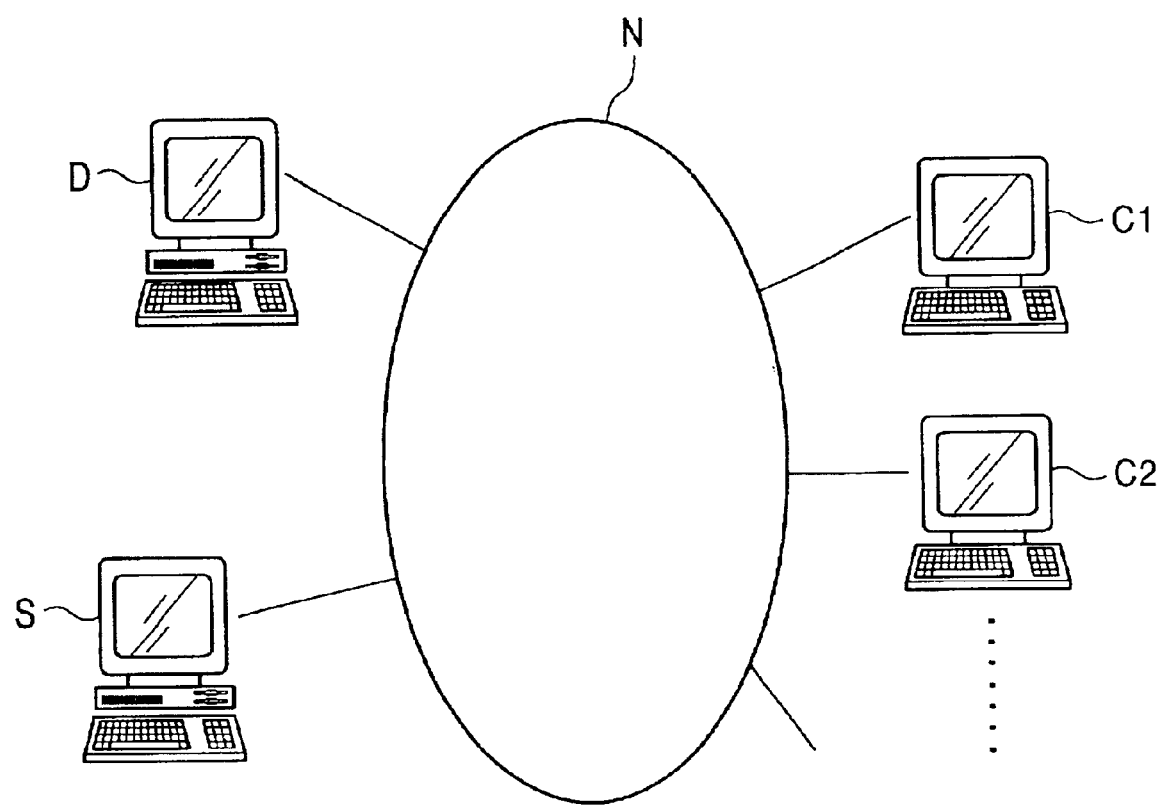
FIG. 25 is a diagram illustrating the configuration of a performance validation system for a plasma processing apparatus according sixth embodiment of the present invention.

FIG. 25 is a diagram illustrating the configuration of the performance validation system for the plasma processing apparatus or system according to this embodiment.

Referring to FIG. 25, the performance validation system comprises a customer terminal (client terminal) C1, an engineer terminal (client terminal) C2, a server computer (hereinafter simply referred to as "server") S which functions as operational performance information provider, a database computer (hereinafter simply referred to as "database") D which stores information, and a public line N. The customer terminal C1, the engineer terminal C2, the server S, and the database D are linked to one another via the public line N.

The terminals C1 and C2 communicate with the server S using a widespread Internet communication protocol, such as TCP/IP or the like. The customer terminal C1 serves as a customer-side information terminal for validating, via the public line N, the state of the performance of the plasma processing units which the customer purchased from the maintenance engineer. The customer terminal C1 also has a function to view an information web page which is a "plasma chamber performance information page" stored in the server S. The engineer terminal C2 allows the maintenance engineer to upload "input-terminal-side AC resistance RA information" and "output-terminal-side AC resistance RB information" which partially constitutes the "performance information" and to receive e-mail sent from the customer through the customer terminal C1.

Herein, the structure of the plasma processing apparatus or system to be evaluated is identical to any one of the structures according to the above-described first to fifth embodiments. The configuration of the plasma processing apparatus, such as the number of plasma processing units in the apparatus, can be set as desired.

The server S communicates via a modem when the public line N is an analog line and via a dedicated terminal adapter or the like when the public line N is a digital line such as an integrated services digital network (ISDN).

The server S is a computer that provides performance information. The server S transmits the performance information to the customer terminal C1 using an Internet communication protocol upon the request from the customer terminal C1. Herein, each of the customers who purchased the plasma chambers receives a "browsing password" for viewing the performance information before the plasma processing apparatus is delivered to the customer from the maintenance engineer. This password is required when the customer desires to view operation and maintenance information which is part of the performance information, and the server S sends the operation and maintenance information to the customer terminal C1 only when a registered browsing password is provided.

The above-described "performance information", details of which will be described in a later section, comprises information regarding models of the plasma processing units constituting the plasma processing apparatus or system available from the maintenance engineer, information regarding quality and performance of each model in the form of specifications, information regarding parameters indicative of quality and performance of specific apparatuses delivered to customers, and information regarding parameters and maintenance history.

The information regarding quality and performance of specific apparatuses and the information regarding parameters and maintenance history, are accessible only from the customers provided with "browsing passwords".

The performance information described above is provided in the form of "operation and maintenance information" and "standard performance information". The operation and maintenance information is a type of information provided from the maintenance engineer or the customer to the server S to indicate the actual state of operation and maintenance. The standard performance information is a type of information stored in the database D and serves as a catalog accessible from potential customers. The "standard performance information" is an objective description regarding the plasma processes performed in the plasma processing unit and allows prediction of the deposition state when applied to deposition processes such as plasma-enhanced CVD and sputtering processes.

In this embodiment, the "standard performance information" is stored in the database D.

Upon the request from the customer terminal C1 to view the "performance information", the server S retrieves the requested "standard performance information" from the database D and sends the information to the customer terminal C1 of the customer in the form of a performance information page. When a request to view the "performance information" is transmitted along with the browsing password of the customer, the server S retrieves the requested "standard performance information" from the database D as described above, composes the "performance information" by combining the retrieved "standard performance information" and the "operation and maintenance information" provided from the maintenance engineer through the engineer terminal C2, and transmits the "performance information page" to the customer terminal C1.

The database D stores the "standard performance information", which is part of the "performance information", according to the models of the plasma chambers of the plasma processing apparatus or plasma processing system, reads out the "standard performance information" in response to a search request sent from the server S, and transmits the retrieved information to the server S. Although only one server S is illustrated in FIG. 25, a plurality of servers are provided in this embodiment. In this respect, it is useful to store general purpose "standard performance information" in the database D instead of these servers in order for the information to be shared among the plurality of servers managed by maintenance engineers from different locations.

Figure 26:
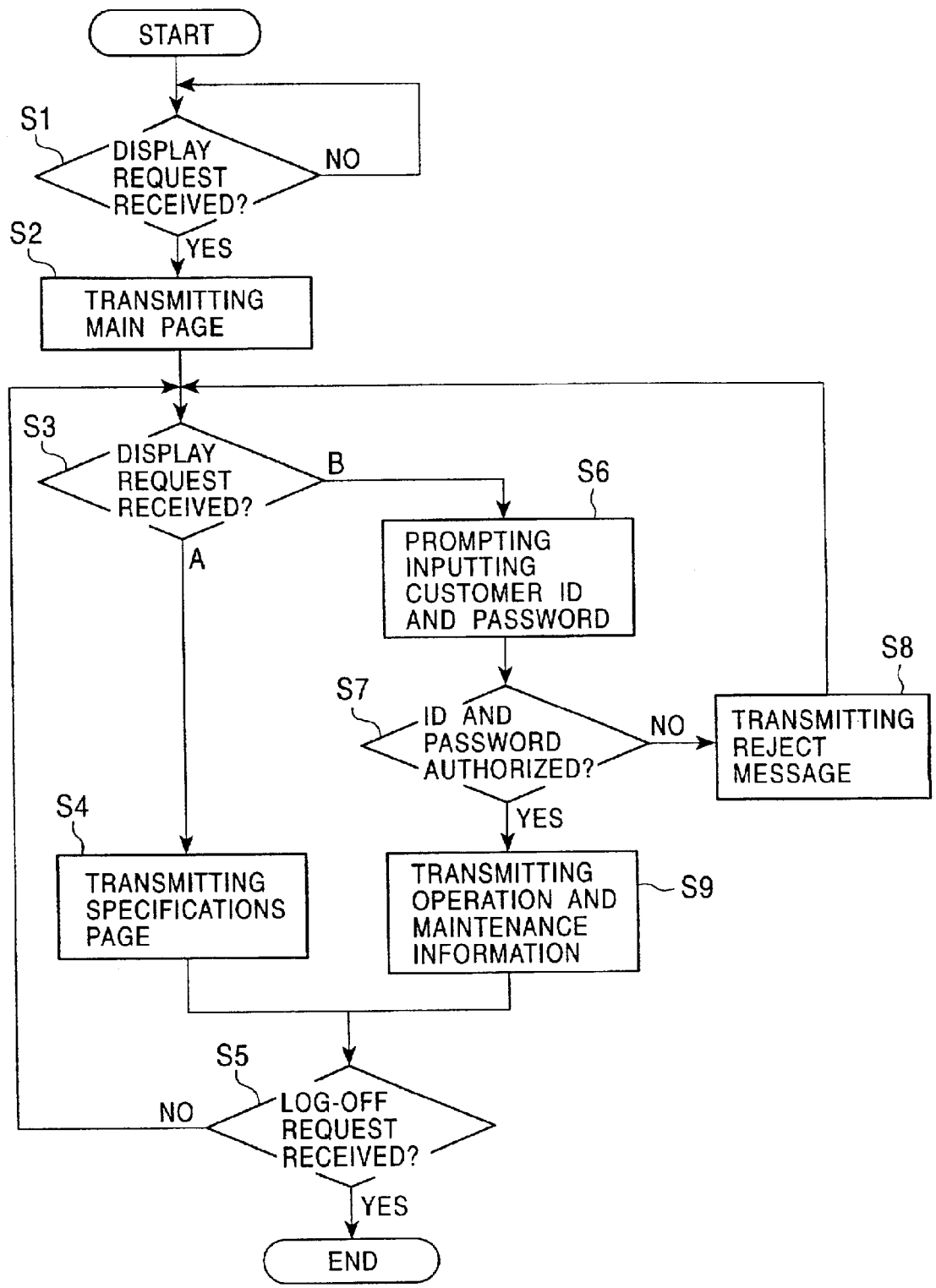
FIG. 26 is a flowchart illustrating a process of providing "performance information" executed at a server S in the performance validation system for the plasma processing apparatus of the sixth embodiment of the present invention.

Next, an operation of the performance validation system for the plasma processing apparatus or the plasma processing system having the above-described structure will be explained in detail with reference to the flowchart shown in FIG. 26. The flowchart illustrates the process of providing the "performance information" executed at the server S.

Generally, the maintenance engineer presents, as a reference for purchase, the "standard performance information" contained in the "performance information" of a model of the plasma chamber the maintenance engineer is attempting to sell to the customer. The customer is able to understand the performance of the plasma processing unit and possible plasma processes using the plasma processing unit through this "standard performance information".

The customer who purchased the plasma processing apparatus or system is provided with the "standard operation information", which serves as the reference during the use of the plasma chambers, and the "operation and maintenance information", which serves as the parameters of the operation. The customer, i.e., the user of the plasma chambers, may validate the operation of the plasma processing units by comparing the "standard performance information" and the "operation and maintenance information" so as to be informed of the state of the plasma processing and to determine whether it is necessary to perform maintenance.

For example, a customer who is considering purchasing a new plasma processing apparatus or system from the maintenance engineer may access the server S to easily confirm the "standard performance information" of the plasma processing apparatus or system the customer is intending to purchase as follows.

The customer who desires to view the "performance information" first sends from the customer terminal C1 a request for access to the server S based on an IP address of the server S set in advance.

Upon receiving the request for access (Step S1), the server S transfers a main page CP to the customer terminal C1 (Step S2).

Figure 27:
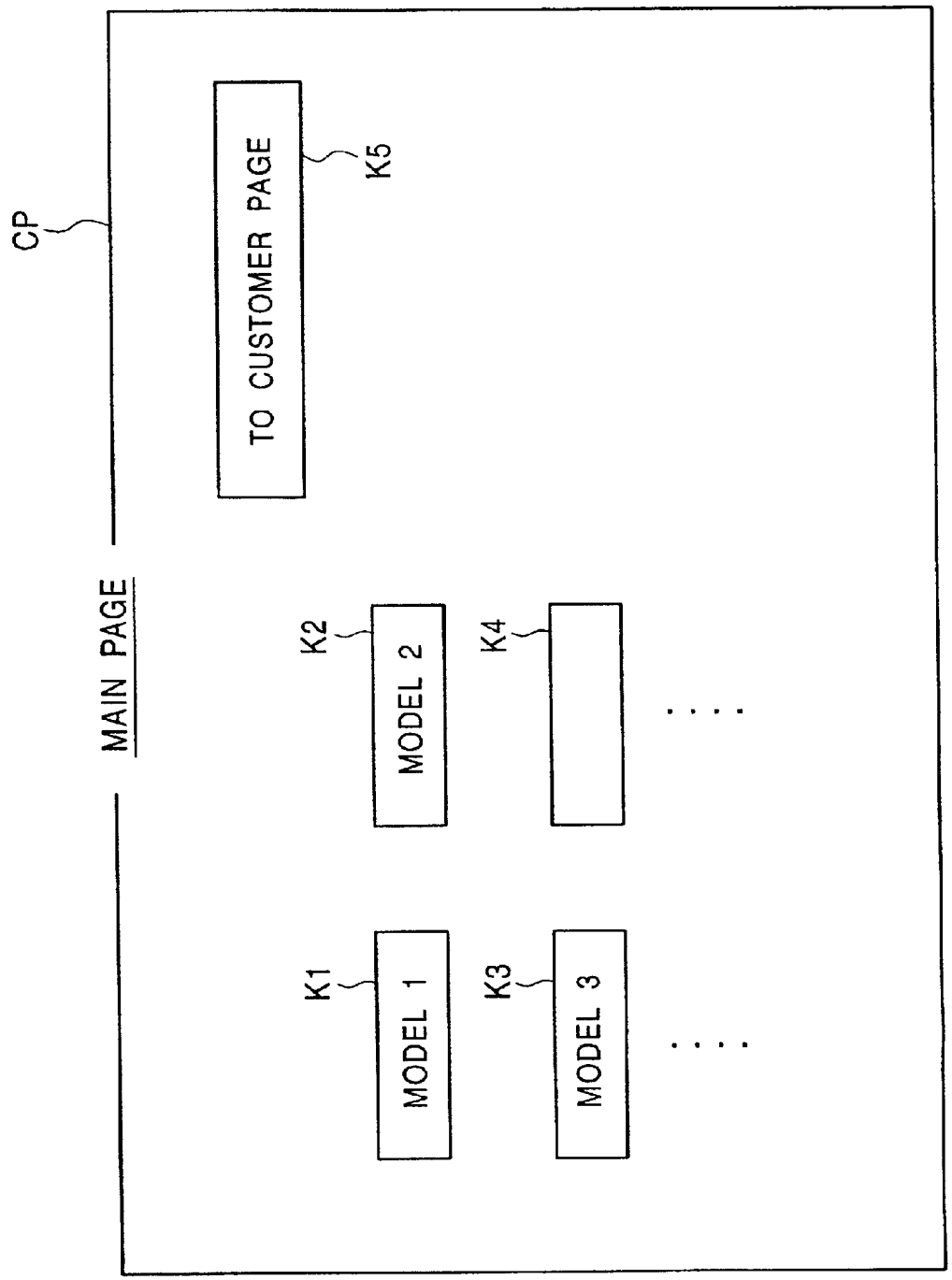
FIG. 27 is a plan view showing a structure of a main page CP related to the performance validation system for the plasma processing apparatus.

FIG. 27 shows an example of the main page CP sent from the server S to the customer terminal C1 through the steps described above. The main page CP comprises model selection buttons K1 to K4 for displaying the "standard performance information" contained in the "performance information" according to models available from the maintenance engineer and a user button K5 for requesting the display of a customer page exclusive to the customer to whom the maintenance engineer delivered the plasma processing apparatus.

For example, a customer may select one of the model selection buttons K1 to K4 using a pointing device (for example, a mouse) of the customer terminal C1 so as to specify which model of the plasma chamber the customer desires to obtain the information about. Such a selection is regarded as the request for accessing the "standard performance information" among the "performance information", and a request to that effect is sent to the server S.

Upon receipt of the request (Step S3), the server S sends the customer terminal C1 a subpage containing the requested information on the selected model. That is, when display of "standard performance information" is requested by specifying a model (line A in FIG. 26), the server S retrieves data such as "vacuum performance", "gas charge/discharge performance", "temperature performance", and "electrical performance of the plasma processing chamber", and data regarding variations in these parameters affected in the plasma processing apparatus or system from the database D and sends the customer terminal C1 a specifications page CP1 shown in FIG. 28 containing these data (Step S4).

Figure 28:
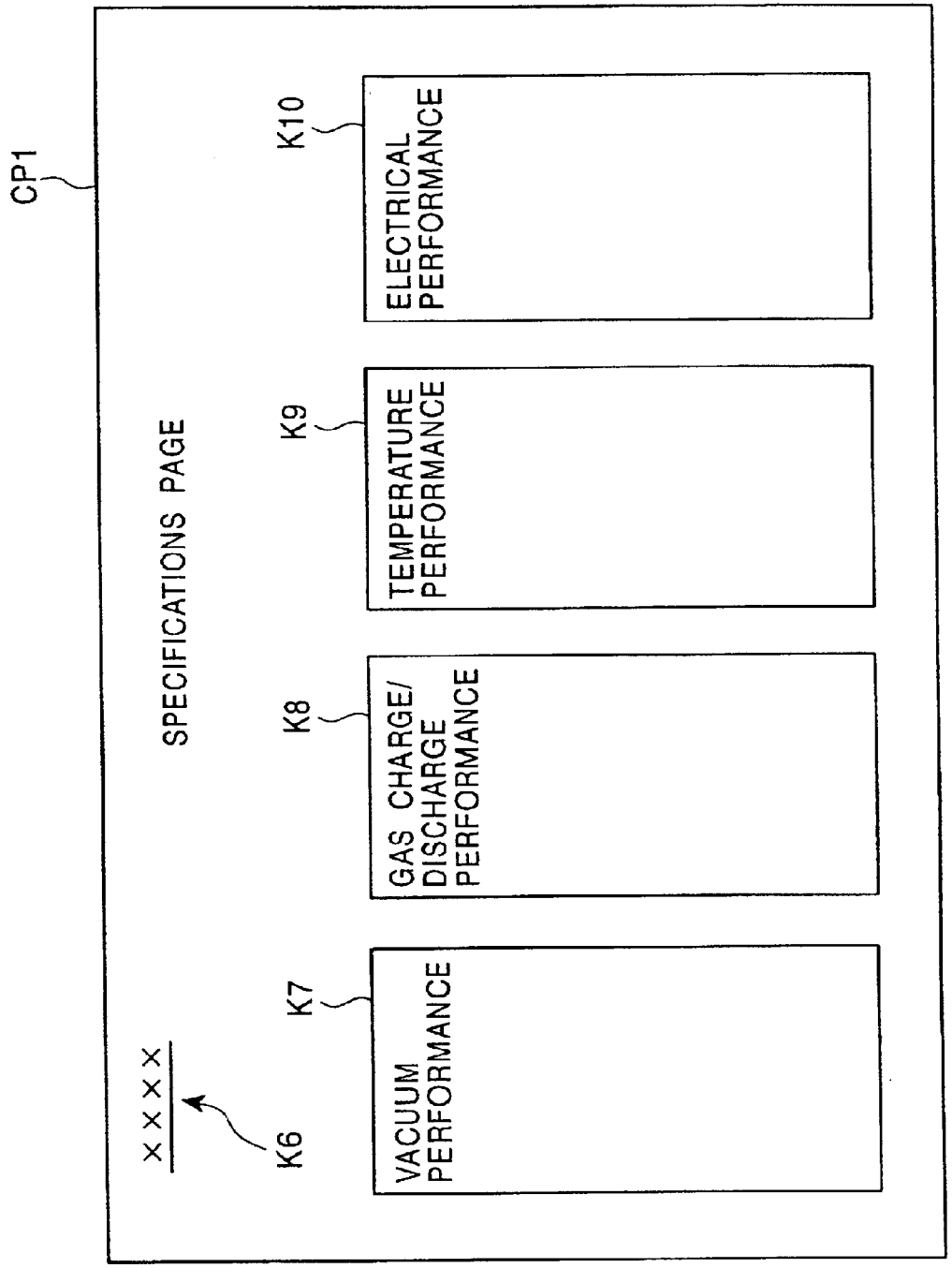
FIG. 28 is a plan view showing a structure of a subpage CP1 related to the performance validation system for the plasma processing apparatus.

As shown in FIG. 28, the specifications page CP1 comprises an apparatus model section K6 indicating the selected model of the apparatus, a vacuum performance section K7, a gas charge/discharge performance section K8, a temperature performance section K9, and an electrical performance section K10 indicating the electrical performance of the plasma processing chamber. These constitute the "standard performance information" of the selected model and each contains the following descriptions.

In the vacuum performance section K7, the following items are displayed:

ultimate vacuum: $1 \times 10^{-4}$ Pa or less; and operational pressure: 30 to 300 Pa.

In the gas supply/discharge performance section K8, the following items are displayed:

maximum gas flow rates:

| | |
|---|---|
| $SiH_4$ | 100 SCCM, |
| $NH_3$ | 500 SCCM, |
| $N_2$ | 2,000 SCCM; and | discharge property: 20 Pa or less at a flow of 500 SCCM.

In the temperature performance section K9 the following items are displayed:

heater temperature: 200 to 350±10° C.; and chamber temperature: 60 to 80±2.0° C.

Herein, the SCCM (standard cubic centimeters per minute) values represent the corrected gas flow rates at standard conditions (0° C. and 1,013 hPa) and the unit thereof is cm³/min.

A variation in each of the above-described parameters P among the plurality of the plasma processing units constituting the plasma processing apparatus or system is defined by relationship (10B) below:

$$(P_{max}-P_{min})/(P_{max}+P_{min}) \tag{10B}$$

wherein $P_{max}$ represents the maximum value of a particular parameter among the plurality of the plasma processing units and $P_{min}$ represents the minimum value of the particular parameter among the plurality of the plasma processing units. The upper limit of the variation in the plasma processing apparatus or system is displayed for each of the parameters.

In the electrical performance section K10, the setting ranges of the input-terminal-side AC resistance RA, the output-terminal-side AC resistance RB, and the variations in the input-terminal-side AC resistance RA and the output-terminal-side AC resistance RB described in the first to fifth embodiments are displayed. In addition to these, values such as a resistance $R_e$ and a reactance $X_e$ of the plasma processing chamber at the power frequency $f_e$, a plasma capacitance $C_0$ between the plasma excitation electrode 4 and the susceptor electrode 8, a loss capacitance $C_x$ between the plasma excitation electrode 4 and each of the components which are the ground positions of the plasma processing unit, the first series resonant frequency $f_0$ described below, and the like are included in the section K10. Furthermore, the specification page CP1 includes a performance guarantee statement such as "we guarantee that each of the parameters is within the setting range described in this page upon the delivery of the plasma chamber".

In this manner, the overall radiofrequency electrical characteristics of the plasma processing units and the variation in the electrical characteristics of the plasma processing units can be presented to a potential purchaser as a novel reference which has never been considered before. The performance information can be printed out at the customer terminal C1 or the engineer terminal C2 to make a hard copy thereof so that the information can be presented in the form of a catalog or specifications describing the performance information containing the above-described detailed information. Since the setting ranges of the input-terminal-side AC resistance RA and the output-terminal-side AC resistance RB, the resistance $R_e$, the reactance $X_e$, the capacitances $C_0$, $C_x$, and the performance guarantee statement are presented to a potential purchaser through a terminal such as customer terminal C1, through a catalog, or through a specification, the potential purchaser may judge the performance of the plasma processing units just as if the customer is examining electrical components and may then purchase the plasma processing apparatus or system from the maintenance engineer based on that judgement.

After the server S completes the transmission of the above-described subpage to the customer terminal C1, the server S waits for the request to display another subpage (Step S3) if a log-off request from the customer terminal C1 is not received (Step S5). If a log-off request from the customer terminal C1 is received by the server S, the server S terminates the interaction with the customer terminal C1 (Step S5).

Now, the definition of the first series resonant frequency $f_0$ is explained with reference to FIG. 15.

First, the dependency of the impedance of the plasma processing chamber on the frequency is measured. During measuring, the switch SW1 connects a point PR5 to the measuring terminal 61', and the switch SW5 disconnects the matching circuit 2A from the radiofrequency generator 1 and the impedance meter AN. The frequency oscillated by the impedance meter AN is varied over a predetermined range including the power frequency $f_e$ to measure the vector quantity (Z, θ) of the impedance in the plasma processing chamber. For example, the frequency is varied in the range of 1 to 100 MHz to include the power frequency $f_e$ which is set at 13.56 MHz, 27.12 MHz, 40.68 MHz, or the like.

The impedance Z and the phase θ are plotted versus frequency to give an impedance characteristic curve and a phase curve. The first series resonant frequency $f_0$ is then defined as the lowest frequency of the frequencies at the minima of the impedance Z, i.e., the frequency at a zero phase when the phase curve first changes from negative to positive as the frequency is elevated.

The customer who purchased and obtained the plasma chamber from the maintenance engineer can easily check the "performance information" of the specific plasma processing unit of the plasma processing apparatus or system that the customer purchased, by accessing the server S as below.

When the customer and the maintenance engineer enter into a sales contract, a customer ID, which is unique to the individual customer and a "customer password (browsing password)" for accessing the "operation and maintenance information" of the plasma processing units constituting the plasma processing apparatus or system are provided to the customer from the maintenance engineer. The customer ID may be associated with the serial number of the purchased plasma processing apparatus or system or with the serial number of the plasma processing unit constituting the plasma processing apparatus or system. The server S sends the "operation and maintenance information" to the customer terminal C1 only when the registered browsing password is provided.

A customer who wants to access the information selects the user button K5 in the above-described main page CP to send the request for the display of a customer page to the server S.

Figure 29:
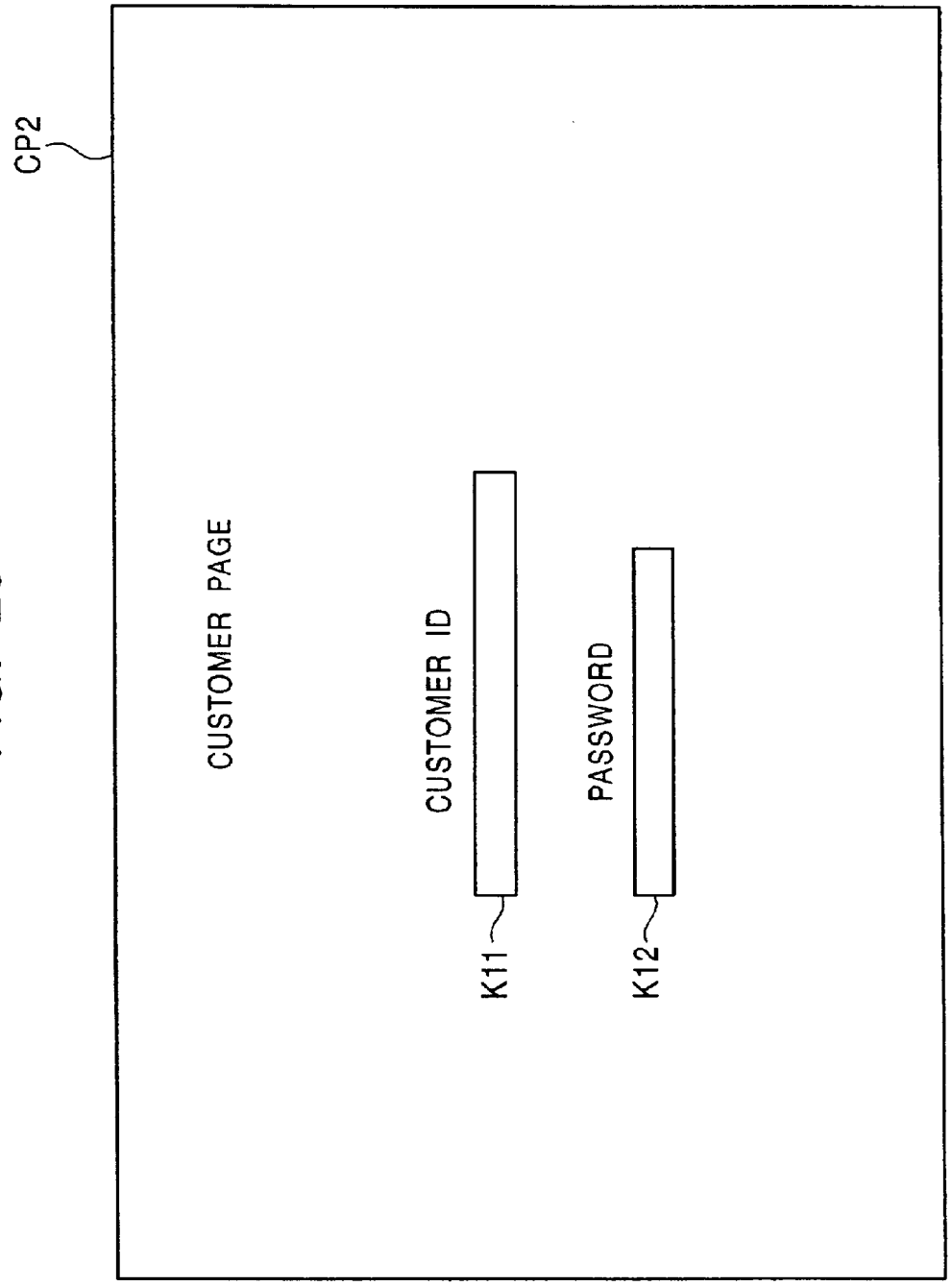
FIG. 29 is a plan view showing a structure of a main page CP2 related to the performance validation system for the plasma processing apparatus.

Upon receiving the request for the display (Step S3-B), the server S sends a subpage prompting the customer to input the "browsing password" (Step S6). FIG. 29 illustrates a customer page CP2. The customer page CP2 comprises a customer ID input field K11 and a password input field K12.

The customer page CP2 prompting the customer to input the browsing password is displayed at the customer terminal C1. In response to the prompt, the customer enters the "browsing password" and the "customer ID", which are provided from the maintenance engineer, through the customer terminal C1 so as to allow the server S to identify the plasma processing units constituting the plasma processing apparatus or system that the customer has purchased.

At this stage, the customer enters the customer ID into the customer ID input field K11 shown in FIG. 29 and the browsing password into the password input field K12 shown in FIG. 29. The server S sends the "operation and maintenance information" subpage previously associated with that "browsing password" to the customer terminal C1 (Step S9), only when the server S receives the registered "customer ID" and the "browsing password" from the customer terminal C1 (Step S7).

In other words, the "operation and maintenance information" is accessible only by the specific customer who signed the sales contract for the plasma processing apparatus or system, i.e., who is in possession of the registered "browsing password". A third party using the server S cannot access the "operation and maintenance information". Although the maintenance engineer often exchanges sales contracts with a plurality of customers simultaneously and delivers a plurality of plasma processing units for these customers simultaneously, each of the customers is provided with a "browsing password" unique to the customer, unique to the plasma processing apparatus or system, or unique to each one of the plasma processing units constituting the plasma processing apparatus or system and is capable of individually accessing the "operation and maintenance information" associated with the "browsing password" assigned to that customer.

Thus, it becomes possible to securely prevent confidential information regarding the purchase of the plasma chamber from being made known to other customers. Furthermore, the plasma processing apparatus, the plasma processing system, the plasma processing chambers thereof can be separately identified even when they are delivered simultaneously.

If the server S does not receive a registered "browsing password" (Step S7), a message refusing the access and prompting the customer to re-enter the "browsing password" is sent to the customer terminal C1 (Step S8). If the customer erroneously entered the "browsing password", the customer may take this opportunity to reenter a correct password to access the "operation and maintenance information".

If the customer ID and the password are authorized (Step S7), the server S retrieves data corresponding to the requested information from the database D and sends it to the customer terminal C1 in the form of a subpage. That is, when the server S receives a request from the customer terminal C1 requesting display of the "standard performance information" and the "operation and maintenance information" of the plasma processing units of the specific plasma processing apparatus or system identified by the customer ID, data such as "vacuum performance", "gas charge/discharge performance", "electrical performance of the plasma processing chamber", and the like are retrieved from the database D by specifying the apparatus model, and a specifications page (subpage) CP3 containing these data is sent to the customer terminal C1 (Step S9).

Figure 30:
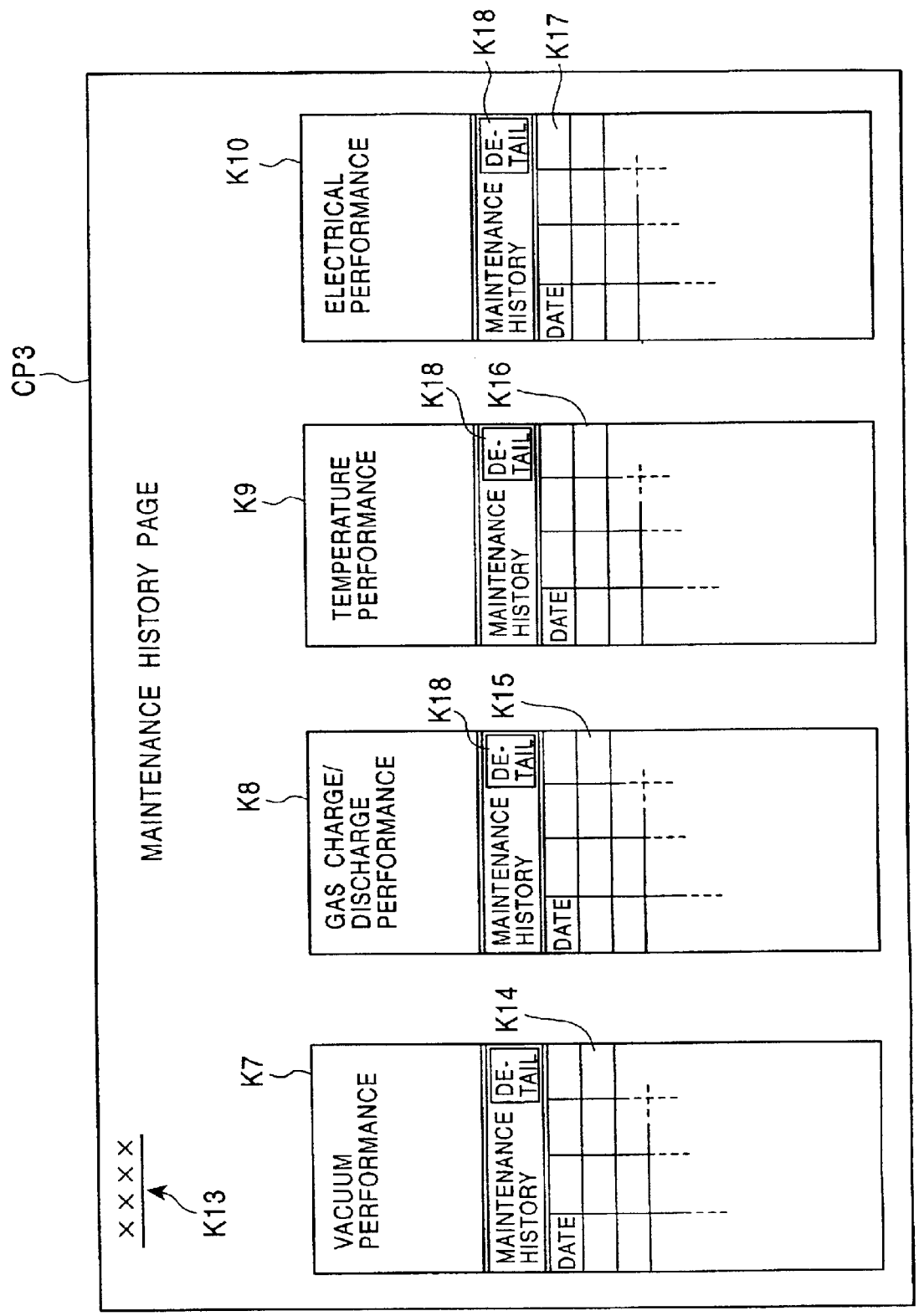
FIG. 30 is a plan view showing a structure of a subpage CP3 related to the performance validation system for the plasma processing apparatus.

FIG. 30 illustrates a maintenance history page (subpage) CP3 containing "operation and maintenance information", which is sent from the server S to the customer terminal C1. As shown in FIG. 30, the maintenance history page CP3 comprises a serial number section K13 indicating the serial numbers of the plasma processing apparatus or system and the plasma processing chambers thereof, the vacuum performance section K7, the gas charge/discharge performance section K8, the temperature performance section K9, the electrical performance section K10, a vacuum performance maintenance section K14, a gas charge/discharge performance maintenance section K15, a temperature performance maintenance section K16, and an electrical property maintenance section K17. In the sections K14 to K17, the "operation and maintenance information" of the individual plasma processing units is displayed.

In the vacuum performance maintenance section K14, the following items are displayed:

ultimate vacuum: $1.3 \times 10^{-5}$ Pa or less;

operational pressure: 200 Pa.

In the gas charge/discharge performance maintenance section K15, the following items are displayed:

gas flow rates:

| | |
|---|---|
| $SiH_4$ | 40 SCCM, |
| $NH_3$ | 160 SCCM, |
| $N_2$ | 600 SCCM; and | discharge property: $6.8 \times 10^{-7}$ Pa·m$^3$/sec.

In the temperature performance maintenance section K16, the following items are displayed:

heater temperature: 302.3±4.9° C.; and chamber temperature: 80.1±2.1° C.

The variation in each of the above-described parameters P among the plurality of the plasma processing units constituting the plasma processing apparatus or system is defined by relationship (10B) below:

$$(P_{max}-P_{min})/(P_{max}+P_{min}) \quad (10B)$$

wherein $P_{max}$ represents the maximum value of a particular parameter among the plurality of the plasma processing chambers and $P_{min}$ represents the minimum value of the particular parameter among the plurality of the plasma processing chambers. Setting ranges of the variations calculated as above are displayed in the corresponding parameter sections.

A "detail" button K18 is provided in each of the sections K14, K15, K16, and K17. The customer may access the detailed information of the desired section by selecting one of the "detail" buttons K18 provided in the desired section.

When the customer submits a display request by selecting the "detail" button K18, a detailed maintenance page CP4 including detailed information on the maintenance history is transmitted from the server S to the customer terminal C1.

FIG. 31 shows the detailed maintenance page CP4 (subpage) transmitted from the server S to the customer terminal C1.

FIG. 31 illustrates the detailed maintenance page CP4 for the electrical property maintenance section K17.

As shown in FIG. 31, the detailed maintenance page CP4 comprises the serial number display sections K13 for displaying the serial numbers of the plasma processing units and the plasma processing apparatus or system purchased by the customer, the electrical performance section K10, and the electrical property maintenance section K17. In the electrical property maintenance section K17, the values of the parameters P measured during maintenance are displayed in the corresponding parameter sections of each plasma processing unit, and the variations among these measured values are displayed in the variation section for each of the plasma processing apparatus or system.

In the electrical performance section K10, setting ranges for the input-terminal-side AC resistance RA and output-terminal-side AC resistance RB described in the first to fifth embodiments are displayed. In the electrical property maintenance section K17, the measured values of the input-terminal-side AC resistance RA and the output-terminal-side AC resistance RB, and the variation calculated from these values are displayed. In addition to these, the resistance $R_e$ and reactance $X_e$ of the plasma processing chamber at the power frequency $f_e$, the plasma capacitance $C_0$ between the plasma excitation electrode 4 and the susceptor electrode 8, the loss capacitance $C_x$ between the plasma excitation electrode 4 and the ground potential portion of the plasma chamber, etc., are displayed.

As shown in FIGS. 30 and 31, in both the maintenance history page CP3 and the detailed maintenance page CP4, the "operation and maintenance information" and the "standard performance information" comprising data such as the "vacuum performance", "gas charge/discharge performance", "temperature performance", "electrical performance", etc. retrieved from the database D, are displayed together. Thus, the customer can view the "operation and maintenance information" while referring to the "standard performance information". The customer may use the "standard performance information" as the reference during use and the "operation and maintenance information" as the parameter indicative of the actual state of the operation. By comparing the "standard performance information" to the "operation and maintenance information", the customer can validate the operation of the plasma processing units of the plasma processing apparatus or system, determine whether it is necessary to perform maintenance, and be informed of the state of the plasma processing.

If the server S does not receive a log-off request from the customer terminal C1 after transmission of the subpages CP3 and CP4 to the customer terminal C1 (Step S5), the server S transmits an invalid connection message to the customer terminal C1 (Step S8) to prompt reentry of the "customer password" or to wait for the next display request (Step S3). If the server S receives the log-off request from the customer terminal C1 (Step S5), the communication with the customer terminal C1 is terminated.

As described above, according to the present invention, the performance validation system for the above-described plasma processing apparatus comprises a customer terminal, an engineer terminal, and an information provider. The customer terminal requests browsing of performance information to the information provider via a public line, a maintenance engineer uploads the performance information to the information provider through the engineer terminal, and the information provider provides the performance information uploaded from the engineer terminal to the customer terminal upon the request from the customer terminal. The performance information contains the input-terminal-side AC resistance RA, the output-terminal-side AC resistance RB, and the variations in the AC resistances RA and RB among the plasma processing units constituting the plasma processing apparatus or system. The performance information can be output as a catalog or a specification document so that a customer may be provided with a basis for making purchasing decisions. The customer may also view the performance information comprising the standard performance information and the operation and maintenance information at the information terminal via a public line. Thus, it is possible to readily provide the customer with the information regarding the operation, performance, and maintenance of the plasma processing units of the plasma processing apparatus or system in use.

Moreover, because the performance information includes the information regarding the input-terminal-side AC resistance RA, the output-terminal-side AC resistance RB, and the variations in the AC resistances RA and RB among the plasma processing units, the performance of the plasma processing apparatus or system can be readily evaluated. A customer who is considering purchasing a new plasma processing apparatus or system can be provided with a basis for making purchasing decisions. Furthermore, the performance information may also be output as a catalog or a specification document available to the customer.

EXAMPLES

In the following examples, variations in input-terminal-side AC resistance RA and output-terminal-side AC resistance RB among a plurality of plasma processing units were adjusted to be less than certain values so as to observe changes in layer characteristics during a deposition process.

The plasma processing apparatus used was of a dual-frequency excitation type. Four different matching circuits were sequentially connected to the same plasma processing chamber to eliminate the difference resulting from the mechanical structure of the plasma processing chamber.

The plasma processing apparatus had 25 cm square electrodes 4 and 8 of a parallel plate type. The interelectrode distance was set at 15 mm, the power was set at 600 W, and the power frequency $f_e$ was set at 40.68 MHz.

First, the input-terminal-side AC resistance RA and the output-terminal-side AC resistance RB of four different matching circuits were measured. In measuring the input-terminal-side AC resistance RA and the output-terminal-side AC resistance RB, the matching circuit 2A was disconnected from the feed plate 3 and the feed line 1A, and the AC resistances RA and RB were measured from the point PR3 and PR, respectively, as in the second embodiment.

The frequency from the impedance meter was varied over the range of 1 to 100 MHz to determine the vector quantity of the impedance, and the AC resistances RA and RB were calculated from the values Z and θ at the power frequency 40.68 MHz.

Matching Circuit 1 had a structure identical to the matching circuit 2A in the first embodiment shown in FIG. 3. In Matching Circuit 1, the inductance of the inductance coil 23 made of a copper pipe plated with silver was 372 nH, the output-terminal-side AC resistance RB at the power frequency $f_e$ as a parasitic resistance component was 5.5Ω, and the input-terminal-side AC resistance RA as a parasitic resistance component was 0.54Ω.

In Matching Circuit 2, two inductance coils 23, each identical to that of Matching Circuit 1, were connected in parallel so as to set the total inductance at 370 nH. The output-terminal-side AC resistance RB at the power frequency $f_e$ as a parasitic resistance component was 3.2Ω, and the input-terminal-side AC resistance RA as a parasitic resistance component was 0.55Ω.

In Matching Circuit 3, four inductance coils 23, each identical to that of Matching circuit 1, were connected in parallel so as to set the total inductance at 370 nH. The output-terminal-side AC resistance RB at the power frequency $f_e$ as a parasitic resistance component was 1.6Ω, and the input-terminal-side AC resistance RA as a parasitic resistance component was 0.52Ω.

Matching Circuit 4 had the inductance coil 23 composed of a copper pipe having a larger diameter compared to the inductance coil 23 of Matching Circuit 1. The total inductance was set at 370 nH, the output-terminal-side AC resistance RB at the power frequency $f_e$ as a parasitic resistance component was 4.1Ω, and the input-terminal-side AC resistance RA as a parasitic resistance component was 0.54Ω.

The above-described four matching circuits were sequentially connected to the same plasma processing chamber, and silicon nitride layers were deposited according to the same process recipe to measure the variations in the layer thickness as below:

(1) Depositing a $SiN_x$ layer on a 6-inch glass substrate by a plasma-enhanced CVD;
(2) Patterning a resist layer by photolithography;
(3) Dry-etching the $SiN_x$ layer with $SF_6$ and $O_2$;
(4) Removing the resist layer by $O_2$ ashing;
(5) Measuring the surface roughness of the $SiN_x$ layer using a contact displacement meter to determine the layer thickness;
(6) Calculating the deposition rate from the deposition time and the layer thickness; and
(7) Measuring the planar uniformity of the layer at 16 points on the substrate surface.

The deposition conditions were as follows:
Substrate temperature: 300° C.
Gas pressure: 100 Pa
$SiH_4$ flow rate: 40 SCCM
$NH_3$ flow rate: 160 SCCM
$N_2$ flow rate: 600 SCCM
The results are shown in Table 1.

TABLE 1

|  | Matching Circuit 1 | Matching Circuit 2 | Matching Circuit 3 | Matching Circuit 4 |
| --- | --- | --- | --- | --- |
| Input-terminal-side AC resistance RA (Ω) | 0.54 | 0.55 | 0.52 | 0.54 |
| Output-terminal-side AC resistance RB (Ω) | 5.52 | 3.17 | 1.62 | 4.13 |
| Inductance of the coil (nH) | 372 | 370 | 370 | 370 |
| Deposition rate (nm/min) | 184 | 224 | 237 | 207 |

Example 1

Matching Circuits 2 and 3 above were selected in Example 1.

Matching Circuits 2 and 3 exhibited the highest deposition rate, and the variation in the deposition rate was 2.8%, i.e., less than 3%. The variation in the output-terminal-side AC resistance RB according to equation (14B) was 0.32, i.e., less than 0.4.

Example 2

Matching Circuits 1, 2, and 3 were selected in Example 2.

Matching Circuits 1, 2, and 3 exhibited the second highest deposition rate. However, the variation in the deposition rate was 12.6%, i.e., more than 10%. The variation in the output-terminal-side AC resistance RB according to equation (14B) was 0.55, i.e., not less than 0.5.

Example 3

Matching Circuits 2, 3, and 4 were selected in Example 3.

The variation in the deposition rate was 6.8%, i.e., less than 7%. The variation in the output-terminal-side AC resistance RB according to equation (14B) was 0.44, i.e., less than 0.5.

These results are shown in Table 2.

TABLE 2

|  | Example 1 (2, 3) | Example 2 (1, 2, 3) | Example 3 (2, 3, 4) |
| --- | --- | --- | --- |
| Variation <RA> | 0.028 | 0.019 | 0.028 |
| Variation <RB> | 0.32 | 0.55 | 0.44 |
| Variation in the deposition rate (%) | 2.8 | 12.6 | 6.75 |

Layers of silicon nitride are used as gate insulating layers in thin-film-transistor liquid-crystal devices (TFT-LCDs) and as insulating layers in storage capacitors loaded to maintain the voltage applied to the liquid crystal at a satisfactory level. The property of the silicon nitride layer affects the contrast, i.e., the ratio of the maximum to minimum luminance values in a TFT-LCD as a product, and a variation of 10% in the thickness of the silicon nitride layers results in a variation of approximately 50 in the contrast. That is, the contrast varies over the range of 200 to 250 among a plurality of products.

When the variations in the input-terminal-side AC resistance RA and output-terminal-side AC resistance RB are not more than 0.5, the variation in deposition characteristics can be maintained at 10% or less, and a variation in the contrast in the TFT-LCD as a product can be maintained at about 50 or less.

When the variations in the input-terminal-side AC resistance RA and output-terminal-side AC resistance RB are not more than 0.45, the variation in deposition characteristics can be maintained at 7% or less, and a variation in the contrast in the TFT-LCD as a product can be maintained at about 30 or less.

When the variations in the input-terminal-side AC resistance RA and output-terminal-side AC resistance RB are not more than 0.4, the variation in deposition characteristics can be maintained at 3% or less, and a variation in the contrast in the TFT-LCD as a product can be maintained at about 10 or less.

As demonstrated above, the difference between different plasma processing units can be minimized by adjusting the variations in the input-terminal-side AC resistance RA and the output-terminal-side AC resistance RB.

According to the plasma processing apparatus, the plasma processing system, the performance validation system therefor, and the inspection method therefor of the present invention, the input- and output-terminal-side AC resistances RA and RB as radiofrequency characteristics are optimized to minimize the difference between the plasma processing units. Thus, sufficiently the same plasma results can be achieved by applying the same process recipe. Moreover, the process rate can be improved by increasing the plasma excitation frequency, the uniformity of the plasma process in the planar direction of the substrate is enhanced, and the layer characteristics, power consumption efficiency and productivity can be improved. The plasma processing apparatus and system can be readily maintained at an optimum operating state. Furthermore, materials for judging the performance of the plasma processing apparatus and system can be provided for customers at the time of purchase. The information regarding the performance apparatus or system can be output as a catalog or a specification document.

What is claimed is:

1. A plasma processing apparatus comprising a plurality of plasma processing units, each of the plurality of plasma processing units comprising:

a plasma processing chamber including an electrode to excite a plasma;

a radiofrequency generator to supply radiofrequency power to the electrode; and a matching circuit to match impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point, wherein a variation <RA> among the plurality of plasma processing units defined by a first equation below is set at a first value within a first predetermined range:

$$<RA> = (RA_{max} - RA_{min})/(RA_{max} + RA_{min})$$

where $RA_{max}$ and $RA_{min}$ are maximum and minimum values, respectively, of AC resistances RA in the matching circuits of the plurality of plasma processing units measured from an input-terminal-side of the matching circuits, and a variation <RB> among the plurality of plasma processing units defined by a second equation below is set at a second value within a second predetermined range:

$$<RB> = (RB_{max} - RB_{min})/(RB_{max} + RB_{min})$$

where $RB_{max}$ and $RB_{min}$ are maximum and minimum values, respectively, of AC resistances RB in the matching circuits of the plurality of plasma processing units measured from an output-terminal-side of the matching circuits.

2. The plasma processing apparatus according to claim 1, wherein the matching circuit is disconnected from the plasma processing unit at the output terminal and at the input terminal, and the AC resistance RA is measured at a first measuring point corresponding to the input terminal.

3. The plasma processing apparatus according to claim 1, the plasma processing unit further comprising a radiofrequency supplier disposed between the radiofrequency generator and the input terminal of the matching circuit, wherein the matching circuit is disconnected from the plasma processing unit at the output terminal and at an input end of the radiofrequency supplier, and the AC resistance RA is measured at a second measuring point corresponding to the input end of the radiofrequency supplier.

4. The plasma processing apparatus according to claim 1, wherein the matching circuit is disconnected from the plasma processing unit at the input terminal and at the output terminal of the matching circuit, and the AC resistance RB is measured at a third measuring point corresponding to the output terminal.

5. The plasma processing apparatus according to claim 1, the plasma processing unit further comprising a radiofrequency feeder disposed between the output terminal of the matching circuit and the electrode,
   wherein the matching circuit is disconnected from the plasma processing unit at the input terminal of the matching circuit and at an output end of the radiofrequency feeder, and the AC resistance RB is measured at a fourth measuring point corresponding to the output end of the radiofrequency feeder.

6. The plasma processing apparatus according to claim 1, wherein the AC resistances RA and RB are values measured at a power frequency of the radiofrequency generator.

7. The plasma processing apparatus according to claim 1, wherein both the first and second predetermined ranges are less than 0.5.

8. The plasma processing apparatus according to claim 7, wherein both the first and second predetermined ranges are less than 0.4.

9. The plasma processing apparatus according to claim 1, the matching circuit further comprising at least one connection point to connect the matching circuit to the ground potential portion,
   wherein the AC resistances RA and RB are measured for each of the connection points by sequentially switching the connection points so that only one of the connection points is connected to the ground potential portion.

10. A plasma processing system including a plurality of plasma processing apparatuses, each of the plasma processing apparatuses including a plurality of plasma processing units, each of the plasma processing units comprising:
   a plasma processing chamber including an electrode to excite a plasma;
   a radiofrequency generator to supply radiofrequency power to the electrode; and
   a matching circuit to match impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point,
   wherein a variation <RA> among the plurality of plasma processing units defined by a first equation below is set at a value within a predetermined range:

$<RA> = (RA_{max} - RA_{min})/(RA_{max} + RA_{min})$ where $RA_{max}$ and $RA_{min}$ are maximum and minimum values, respectively, of AC resistances RA in the matching circuits of the plurality of plasma processing units measured from an input-terminal-side of the matching circuits, and a variation <RB> among the plurality of plasma processing units defined by a second equation below is set at a value within a predetermined range:

$<RB> = (RB_{max} - RB_{min})/(RB_{max} + RB_{min})$ where $RB_{max}$ and $RB_{min}$ are maximum and minimum values, respectively, of AC resistances RB in the matching circuits of the plurality of plasma processing units measured from an output-terminal-side of the matching circuits.

11. The plasma processing system according to claim 10, wherein the matching circuit is disconnected from the plasma processing unit at the output terminal and at the input terminal, and the AC resistance RA is measured at a first measuring point corresponding to the input terminal.

12. The plasma processing system according to claim 10, the plasma processing unit further comprising a radiofrequency supplier disposed between the radiofrequency generator and the input terminal of the matching circuit,
   wherein the matching circuit is disconnected from the plasma processing unit at the output terminal and at an input end of the radiofrequency supplier, and the AC resistance RA is measured at a second measuring point corresponding to the input end of the radiofrequency supplier.

13. The plasma processing system according to claim 10, wherein the matching circuit is disconnected from the plasma processing unit at the input terminal and at the output terminal of the matching circuit, and the AC resistance RB is measured at a third measuring point corresponding to the output terminal.

14. The plasma processing system according to claim 10, the plasma processing unit further comprising a radiofrequency feeder disposed between the output terminal of the matching circuit and the electrode,
   wherein the matching circuit is disconnected from the plasma processing unit at the input terminal of the matching circuit and at an output end of the radiofrequency feeder, and the AC resistance RB is measured at a fourth measuring point corresponding to the output end of the radiofrequency feeder.

15. The plasma processing system according to claim 10, wherein the AC resistances RA and RB are values measured at a power frequency of the radiofrequency generator.

16. The plasma processing system according to claim 10, wherein both the first and second predetermined ranges are less than 0.5.

17. The plasma processing system according to claim 16, wherein both the first and second predetermined ranges are less than 0.4.

18. The plasma processing system according to claim 10, the matching circuit further comprising at least one connection point to connect the matching circuit to the ground potential portion,
   wherein the AC resistances RA and RB are measured for each of the connection points by sequentially switching the connection points so that only one of the connection points is connected to the ground potential portion.

* * * * *